US012765402B2

(12) United States Patent
Yu et al.

(10) Patent No.: US 12,765,402 B2
(45) Date of Patent: Oct. 13, 2026

(54) SEMICONDUCTOR STRUCTURE AND METHOD MANUFACTURING THE SAME

(71) Applicant: Taiwan Semiconductor Manufacturing Company, Ltd., Hsinchu (TW)

(72) Inventors: Chen-Hua Yu, Hsinchu City (TW); Kuo-Chung Yee, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 202 days.

(21) Appl. No.: 18/296,957

(22) Filed: Apr. 6, 2023

(65) Prior Publication Data

US 2023/0245976 A1 Aug. 3, 2023

Related U.S. Application Data

(63) Continuation of application No. 16/852,567, filed on Apr. 20, 2020, now Pat. No. 12,347,785.

(Continued)

(51) Int. Cl.

*H10W 90/20* (2026.01)
*H10W 40/20* (2026.01)

(Continued)

(52) U.S. Cl.

CPC ....... *H10W 70/614* (2026.01); *H10W 40/233* (2026.01); *H10W 40/257* (2026.01); *H10W 70/05* (2026.01); *H10W 70/60* (2026.01); *H10W 70/657* (2026.01); *H10W 90/00* (2026.01); *H10W 72/823* (2026.01); *H10W 74/014* (2026.01); *H10W 74/117* (2026.01); *H10W 90/22* (2026.01); *H10W 90/288* (2026.01); *H10W 90/297* (2026.01); *H10W 90/701* (2026.01)

(58) Field of Classification Search

CPC ............... H01L 23/5389; H01L 23/481; H01L 2224/24145–24147; H01L 2224/24221–24226; H01L 2224/2518; H01L 2224/80895; H01L 2224/80896; H01L 2225/06548; H01L 2225/06572; H01L 2225/06541; H10W 40/22–242; H10W 40/257; H10W 90/288; H10W 70/611–618

See application file for complete search history.

(56) References Cited

U.S. PATENT DOCUMENTS

| | | | |
|---|---|---|---|
| 8,987,922 | B2 | 3/2015 | Yu et al. |
| 8,993,380 | B2 | 3/2015 | Hou et al. |

(Continued)

*Primary Examiner* — Yu Chen
(74) *Attorney, Agent, or Firm* — JCIPRNET

(57) ABSTRACT

A semiconductor structure includes system-on-integrated chips, a first redistribution circuit structure and first conductive terminals. The system-on-integrated chips each include a die stack having two or more than two tiers, and each tier includes at least one semiconductor die. The first redistribution circuit structure is located on and electrically connected to the system-on-integrated chips. The first conductive terminals are connected on the first redistribution circuit structure, where the first redistribution circuit structure is located between the system-on-integrated chips and the first conductive terminals.

20 Claims, 53 Drawing Sheets

Related U.S. Application Data

(60) Provisional application No. 62/907,695, filed on Sep. 29, 2019.

(51) Int. Cl.

| | |
|---|---|
| ***H10W 40/25*** | (2026.01) |
| ***H10W 70/05*** | (2026.01) |
| ***H10W 70/60*** | (2026.01) |
| ***H10W 70/65*** | (2026.01) |
| ***H10W 90/00*** | (2026.01) |
| *H10W 72/00* | (2026.01) |
| *H10W 74/01* | (2026.01) |
| *H10W 74/10* | (2026.01) |
| *H10W 90/22* | (2026.01) |

(56) References Cited

U.S. PATENT DOCUMENTS

| | | | | |
|---|---|---|---|---|
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,196,532 | B2 | 11/2015 | Tu et al. | |
| 9,196,559 | B2 | 11/2015 | Tsai et al. | |
| 9,257,333 | B2 | 2/2016 | Lu et al. | |
| 9,263,511 | B2 | 2/2016 | Yu et al. | |
| 9,263,839 | B2 | 2/2016 | Chen et al. | |
| 9,275,924 | B2 | 3/2016 | Wang et al. | |
| 9,275,925 | B2 | 3/2016 | Chen et al. | |
| 9,281,254 | B2 | 3/2016 | Yu et al. | |
| 9,299,649 | B2 | 3/2016 | Chiu et al. | |
| 9,368,460 | B2 | 6/2016 | Yu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 12,347,785 | B2 * | 7/2025 | Yu | H01L 24/20 |
| 2015/0303174 | A1 * | 10/2015 | Yu | H01L 21/565 438/109 |
| 2016/0163657 | A1 * | 6/2016 | Hung | H01L 23/562 438/126 |
| 2019/0067157 | A1 * | 2/2019 | Lin | H01L 21/4882 |
| 2019/0148342 | A1 * | 5/2019 | Hu | H01L 25/105 257/659 |

* cited by examiner

SEMICONDUCTOR STRUCTURE AND METHOD MANUFACTURING THE SAME

CROSS-REFERENCE TO RELATED APPLICATION

This application is a continuation application of and claims the priority benefit of U.S. application Ser. No. 16/852,567, filed on Apr. 20, 2020, now pending, which claims the priority benefit of U.S. provisional application Ser. No. 62/907,695, filed on Sep. 29, 2019. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. For example, the area occupied by integrated components is proximate to the surface of a semiconductor wafer; however, there are physical limitations to an achievable density in two-dimensional (2D) integrated circuit formation.

As the demand for miniaturization, higher speed and greater bandwidth, as well as lower power consumption and latency has grown recently, there has grown a need for smaller and more creative packaging techniques of semiconductor dies. For example, System-on-Integrate-Chips (SoIC) has been developed to include a plurality of device dies such as processors and memory cubes in the same package. The SoIC can include device dies formed using different technologies and have different functions bonded to the same device die, thus forming a system. This may save manufacturing cost and optimize device performance.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
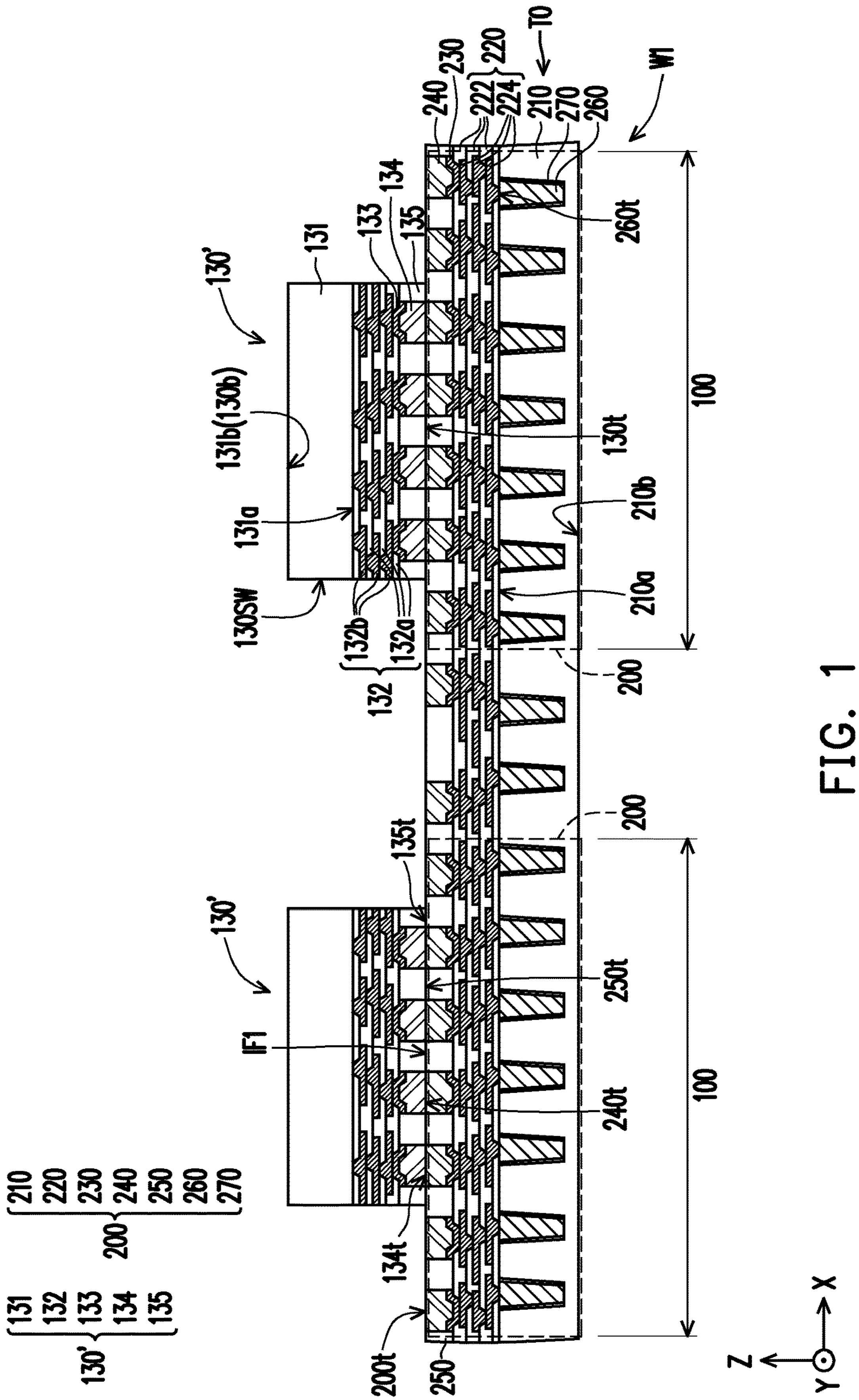
FIG. 1 through FIG. 10 are schematic cross-sectional views showing various stages in a manufacturing method of a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 11:
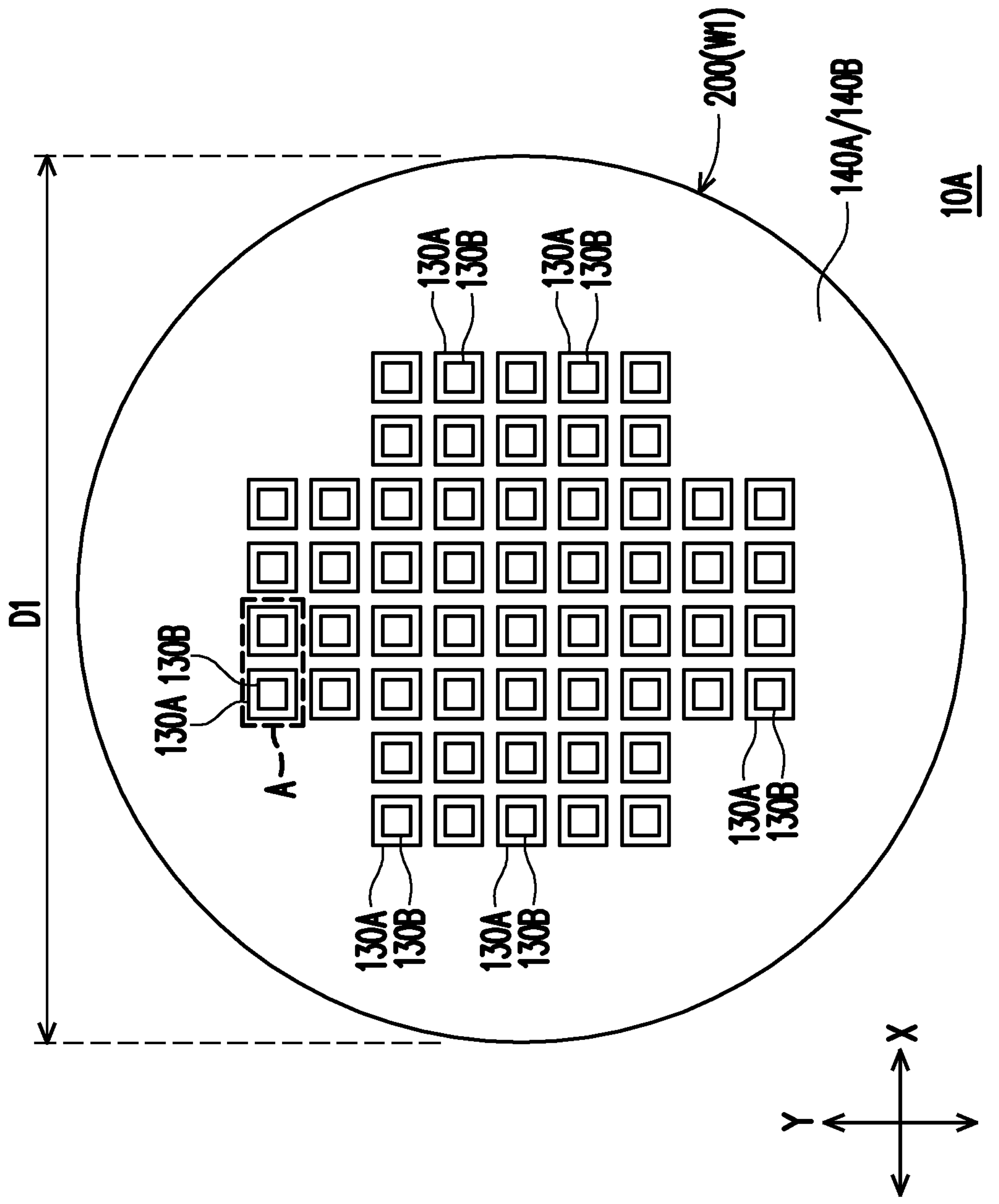
FIG. 11 is a schematic top view of a semiconductor structure in accordance with some embodiments of the disclosure.
Figure 12:
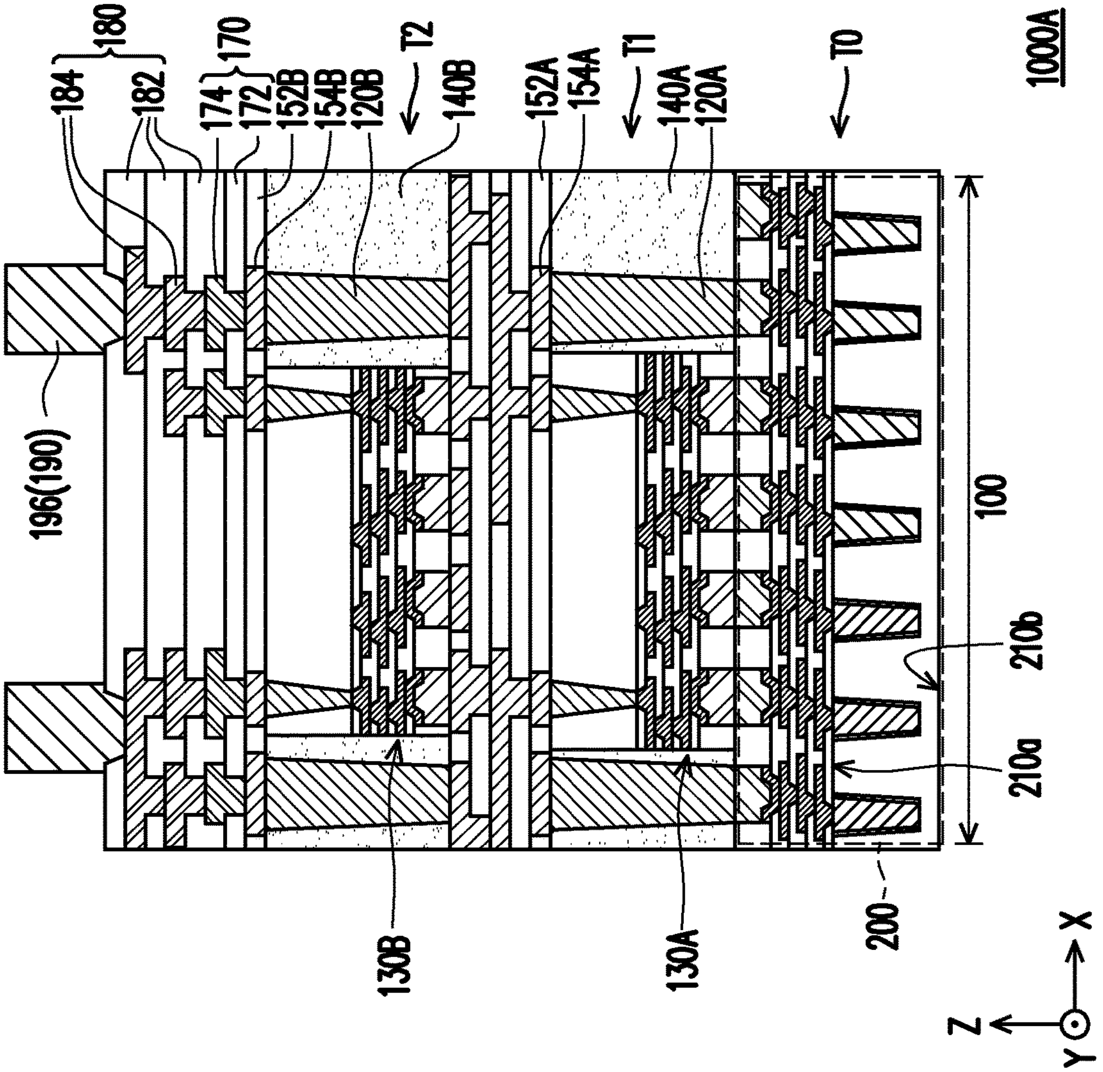
FIG. 12 is a schematic cross-sectional view showing a System-on-Integrate-Chips (SoIC) in accordance with some embodiments of the disclosure.
Figure 13:
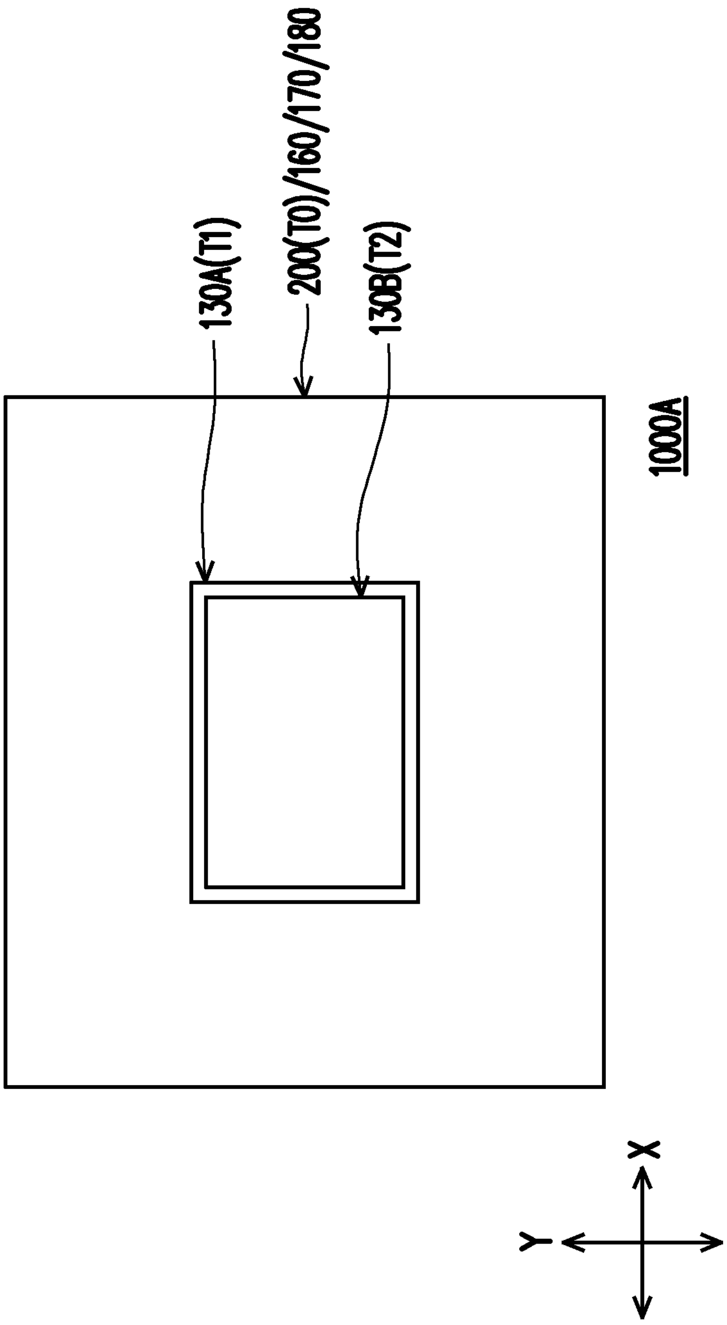
FIG. 13 is a schematic top view of the SoIC depicted in FIG. 12.

FIG. 1 through FIG. 10 are schematic cross-sectional views showing various stages in a manufacturing method of a semiconductor structure in accordance with some embodiments of the disclosure. FIG. 11 is a schematic top view of a semiconductor structure in accordance with some embodiments of the disclosure, where FIG. 1 through FIG. 10 are the cross-sectional views of a part of a semiconductor structure 10A indicated by the dashed box A of FIG. 11. In embodiments, the manufacturing method is part of a wafer level packaging process. It is to be noted that the process steps described herein cover a portion of the manufacturing processes used to fabricate a semiconductor structure. The embodiments are intended to provide further explanations but are not used to limit the scope of the present disclosure. FIG. 12 is a schematic cross-sectional view showing a System-on-Integrate-Chips (SoIC) in accordance with some embodiments of the disclosure. FIG. 13 is a schematic top view of the SoIC depicted in FIG. 12.

Referring to FIG. 1, in some embodiments, a wafer W1 including a plurality of integrated circuit components 200 arranged in an array is provided. In some embodiments, the integrated circuit components 200 are arranged in the form of a matrix, such as a N×N array or a N×M array (N, M>0, N may or may not be equal to M) along a direction X and a direction Y. The direction X and the direction Y are not the same to each other and are perpendicular to each other, for example. The integrated circuit components 200 of the wafer W1 are connected to one another, in some embodiments.

The integrated circuit components 200 may be referred to as semiconductor dies or chips, independently, including a digital chip, analog chip or mixed signal chip. In some embodiments, the integrated circuit components 200 are, independently, a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the integrated circuit components 200 are, independently, a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO) a pre-stacked memory cube such as a hybrid memory cube (HMC) module, a high bandwidth memory (HBM) module; a combination thereof; or the like. In further alternative embodiments, the integrated circuit components 200 are, independently, an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoIC system, etc.; a combination thereof; or the like. In some other embodiments, the integrated circuit components 200 are, independently, an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The types of the integrated circuit components 200 may be selected and designated based on the demand and design requirement, and thus are specifically limited in the disclosure.

In accordance with some embodiments of the disclosure, the types of some of the integrated circuit components 200 are different from each other, while some of the integrated circuit components 200 are identical types. In alternative embodiments, the types of all of the integrated circuit components 200 are different. In further alternative embodiments, the types of all of the integrated circuit components 200 are identical. In accordance with some embodiments of the disclosure, the sizes of some of the integrated circuit components 200 are different from each other, while some of the integrated circuit components 200 are the same sizes. In alternative embodiments, the sizes of all of the integrated circuit components 200 are different. In further alternative embodiments, the sizes of all of the integrated circuit components 200 are the same. In accordance with some embodiments of the disclosure, the shapes of some of the integrated circuit components 200 are different from each other, while the shapes of some of the integrated circuit components 200 are identical. In alternative embodiments, the shapes of all of the integrated circuit components 200 are different. In further alternative embodiments, the shapes of all of the integrated circuit components 200 are identical. The types, sizes and shapes of each of the integrated circuit components 200 are independent from each other, and may be selected and designed based on the demand and design layout, the disclosure is not limited thereto.

In some embodiments, each of the integrated circuit components 200 includes a semiconductor substrate 210 having semiconductor devices (not shown) formed therein, an interconnect structure 220 formed on the semiconductor substrate 210, a plurality of connecting pads 230 formed on the interconnect structure 220, a plurality of connecting vias 240 formed on the connecting pads 230, a protection layer 250 covers the interconnect structure 220, the connecting pads 230 and the connecting vias 240, and a plurality of conductive pillars 260 formed in the semiconductor substrate 210. In some embodiments, the semiconductor substrate 210 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 210 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the semiconductor substrate 210 includes the semiconductor devices formed therein or thereon, where the semiconductor devices include active devices (e.g., transistors, diodes, etc.) and/or passive devices (e.g., capacitors, resistors, inductors, etc.), or other suitable electrical components. In some embodiments, the semiconductor devices are formed at an active surface 210*a* of the semiconductor substrate 210 proximal to the interconnect structure 220. In some embodiments, as shown in FIG. 1, the semiconductor substrate 210 has the active surface 210*a* and a bottom surface 210*b* opposite to the active surface 210*a* along a stacking direction Z of the interconnect structure 220 and the semiconductor substrate 210, and the interconnect structure 220 is disposed on and covers the active surface 210*a* of the semiconductor substrate 210. The stacking direction Z is different from and substantially perpendicular to the direction X and the direction Y, for example.

The semiconductor substrate 210 may include circuitry (not shown) formed in a front-end-of-line (FEOL), and the interconnect structure 220 may be formed in a back-end-of-line (BEOL). In some embodiments, the interconnect structure 220 includes an inter-layer dielectric (ILD) layer formed over the semiconductor substrate 210 and covering the semiconductor devices, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 220 including one or more dielectric layers 222 and one or more metallization layer 224 in alternation. The metallization layer 224 may be embedded in the dielectric layers 222. In some embodiments, the interconnect structure 220 is electrically coupled to the semiconductor devices formed in and/or on the semiconductor substrate 210 to one another and to external components (e.g., test pads, bonding conductors, etc.) formed thereon. For example, the metallization layer 224 in the dielectric layers 222 route electrical signals between the semiconductor devices of the semiconductor substrate 210. The semiconductor devices and the metallization layer 224 are interconnected to perform one or more functions including memory structures (e.g., a memory cell), processing structures (e.g., a logic cell), input/output (I/O) circuitry (e.g. an I/O cell), or the like. The uppermost layer of the interconnect structure 220 may be a passivation layer made of one or more suitable dielectric materials such as silicon oxide, silicon nitride, low-k dielectrics, polyimide (PI), combinations of these, or the like. In some embodiments, as shown in FIG. 1, the passivation layer (e.g. the uppermost layer of the dielectric layers 222) of the interconnect structure 220 has an opening exposing at least a portion of a topmost layer of the metallization layer 224 for further electrical connection.

The dielectric layers 222 may be PI, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 222 are formed by suitable fabrication techniques such as spin-on coating, chemical vapor deposition (CVD), plasma-enhanced chemical vapor deposition (PECVD) or the like.

The metallization layer 224 may be made of conductive materials formed by electroplating or deposition, such as copper, copper alloy, aluminum, aluminum alloy, or combinations thereof, which may be patterned using a photolithography and etching process. In some embodiments, the metallization layer 224 are patterned copper layers or other suitable patterned metal layers. For example, may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The numbers of the dielectric layers 222 and the number of the metallization layers 224 are not limited in the disclosure, and may be selected and designated based on demand and design layout.

In some embodiments, as illustrated in FIG. 1, the connecting pads 230 are disposed over and electrically coupled to the topmost layer of the metallization layer 224 of the interconnect structure 220 exposed by the passivation layer (e.g. the uppermost layer of the dielectric layers 222) of the interconnect structure 220 for testing and/or further electrical connection. The connecting pads 230 may be made of aluminum, copper, or alloys thereof or the like, and may be formed by an electroplating process. The disclosure is not limited thereto. Some of the connecting pads 230 may be testing pads, and some of the connecting pads 230 may be conductive pads for further electrical connection. In some embodiments, the connecting pads 230 may be optional for simple structure and cost benefits. In some embodiments, the connecting vias 240 may directly connect to the uppermost metallization layer 224.

In some embodiments, the connecting vias 240 are respectively disposed on and electrically connected to the connecting pads 230 for providing an external electrical connection to the circuitry and semiconductor devices. In one embodiment, the connecting vias 240 may be formed of conductive materials such as copper, gold, aluminum, the like, or combinations thereof, and may be formed by an electroplating process or the like. The connecting vias 240 may be bond vias, bond pads or bond bumps, or combinations thereof. The disclosure is not limited thereto. The connecting vias 240 may serve as bonding conductors for further electrical connection and may be formed over the connecting pads 230 (serving as the conductive pads for further electrical connection). The connecting vias 240 may be electrically coupled to the semiconductor devices of the semiconductor substrate 210 through the interconnect structure 220 and the connecting pads 230.

Alternatively, the connecting vias 240 may be formed over the interconnect structure 220. For example, the connecting vias 240 are disposed on and electrically connected to the topmost layer of the metallization layer 224 of the interconnect structure 220 exposed by the passivation layer (e.g. the uppermost layer of the dielectric layers 222) of the interconnect structure 220. That is, the connecting vias 240 and the connecting pads 230 may all be disposed on the topmost layer of the metallization layer 224 of the interconnect structure 220 exposed by the passivation layer in a manner of side-by-side. In such embodiments, the connecting pads 230 may be testing pads for testing while the connecting vias 240 may be the bonding conductors for further electrical connection. The connecting vias 240 may be electrically coupled to the semiconductor devices of the semiconductor substrate 210 through the interconnect structure 220.

In some embodiments, the protection layer 250 is formed on the interconnect structure 220 to cover the interconnect structure 220 and the connecting pads 230 and to laterally cover the connecting vias 240. That is to say, the protection layer 250 prevents any possible damage(s) occurring on the connecting pads 230 and the connecting vias 240 during the transfer of the wafer W1. In addition, in some embodiments, the protection layer 250 further acts as a passivation layer for providing better planarization and evenness. In some embodiments, top surfaces of the connecting vias 240 are substantially leveled with a surface of the protection layer 250 for further electrical connection, as shown in FIG. 1.

The protection layer 250 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), and the like, or a combination thereof. It should be appreciated that the protection layer 250 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the conductive pillars 260 are embedded in the semiconductor substrate 210. For example, the conductive pillars 260 are formed in the semiconductor substrate 210 and extended from the active surface **210*a* towards the bottom surface 210*b* along the stacking direction Z. As shown in FIG. 1, top surfaces 260*t* of the conductive pillars 260 are substantially coplanar to the active surface 210*a* of the semiconductor substrate 210 to be in contact with a bottommost layer of the metallization layers 224 exposed by a lowest layer of the dielectric layers 222 of the interconnect structure 220. In some embodiments, the conductive pillars 260 are not accessibly revealed by the bottom surface 210*b* of the semiconductor substrate 210. In some embodiments, the conductive pillars 260 may be tapered from the interconnect structure 220 to the bottom surface 210*b*. Alternatively, the conductive pillars 260** have substantially vertical sidewalls.

In a cross-sectional view along the stacking direction Z, the shape of the conductive pillars 260 may depend on the design requirements, and is not intended to be limiting in the disclosure. For example, in a top (plane) view on a X-Y plane perpendicular to the stacking direction Z, the shape of the conductive pillars 260 is circular shape. However, depending on the design requirements, and the shape of the conductive pillars 260 may be an oval shape, a rectangular shape, a polygonal shape, or combinations thereof; the disclosure is not limited thereto.

In some embodiments, the conductive pillars 260 are in physical contact with the bottommost layer of the metallization layer 224 of the interconnect structure 220 exposed by the lowest layer of the dielectric layers 222 of the interconnect structure 220 at the active surface **210*a*, as illustrated in FIG. 1. That is, the conductive pillars 260 are electrically connected to the semiconductor devices in the semiconductor substrate 210 through the interconnect structure 220, and are electrically connected to the connecting vias 240 through the interconnect structure 220 and the connecting pads 230. The conductive pillars 260** may be formed of a conductive material, such as copper, tungsten, aluminum, silver, combinations thereof, or the like.

In some embodiments, each of the conductive pillars 260 is covered by a liner 270. For example, the liners 270 are formed between the conductive pillars 260 and the semiconductor substrate 210. The liners 270 may be formed of a barrier material, such as TiN, Ta, TaN, Ti, or the like. In alternative embodiments, a dielectric liner (not shown) (e.g., silicon nitride, an oxide, a polymer, a combination thereof, etc.) may be further optionally formed between the liners 270 and the semiconductor substrate 210. In some embodiments, the conductive pillars 260, the liners 270 and the optional dielectric liner are formed by forming recesses in the semiconductor substrate 210 and respectively depositing the dielectric material, the barrier material, and the conductive material in the recesses, removing excess materials on the semiconductor substrate 210. For example, the recesses of the semiconductor substrate 210 are lined with the dielectric liner so as to laterally separate the liners 270 lining sidewalls of the conductive pillars 260 from the semiconductor substrate 210. The conductive pillars 260 are formed by using a via-first approach, in certain embodiments. In such embodiments, the conductive pillars 260 are formed prior to the formation of the interconnect structure 220. As shown in FIG. 1, in some embodiments, the conductive pillars 260 are separated from the semiconductor substrate 210 through at least the liners 270. Alternatively, the liners 270 may be omitted.

Alternatively, the conductive pillars 260 may be formed by using a via-last approach, and may be formed after the formation of interconnect structure 220. The disclosure is not limited thereto. The number of the dielectric layers 222 and the numbers of the metallization layer 224 of the interconnect structure 220, the number of the connecting pads 230, the number of the connecting vias 240 and the number of the conductive pillars 260 within each of the integrated circuit components 200 of the wafer W1 are not limited to the disclosure, and may be selected and designated based on the demand and design layout.

Continued on FIG. 1, in some embodiments, at least one integrated circuit component 130' is provided and placed over the wafer W1. For example, only one integrated circuit component 130' is located on each integrated circuit component 200 as presented in FIG. 1 for illustrative purposes, however the number of the integrated circuit components 130' placed over and positioned on (directly overlaid) each integrated circuit component 200 is not limited in the disclosure. The number of the integrated circuit components 130' positioned on each integrated circuit component 200 may be one or more than one based on the demand and/or design layout. In alternative embodiments, if considering multiple integrated circuit components 130' are positioned on (directly overlaid) each integrated circuit component 200, the integrated circuit components 130' are arranged into an array. In such alternative embodiments, the integrated circuit components 130' are arranged in the form of a matrix, such as a N×N array or a N×M array (N, M>0, N may or may not be equal to M) along the direction X and the direction Y, on the respective one integrated circuit component 200. As shown in FIG. 1, the integrated circuit components 130' are physically separated from one another in the wafer W1, in some embodiments.

For example, the integrated circuit components 130' are placed on the wafer W1 for bonding by pick-and-place process. In some embodiments, each of integrated circuit components 130' includes a semiconductor substrate 131 having semiconductor devices (not shown) formed therein, an interconnect structure 132 formed on the semiconductor substrate 131, a plurality of connecting pads 133 formed on the interconnect structure 132, a plurality of connecting vias 134 formed on the interconnect structure 132, and a protection layer 135 covers the interconnect structure 132, the connecting pads 133 and the connecting vias 134. For example, the interconnect structure 132 includes one or more than one dielectric layer 132*a* and one or more than one metallization layer 132*b* in alternation. The numbers of the dielectric layers 132*a* and the number of the metallization layer 132*b* of the interconnect structure 132, the number of the connecting pads 133 and the number of the connecting vias 134 are not limited to the disclosure, and may be selected and designated based on the demand and design layout. The formations and materials of the semiconductor substrate 131, the interconnect structure 132 (including the dielectric layers 132*a* and the metallization layers 132*b*), the connecting pads 133, the connecting vias 134 and the protection layer 135 are respectively the same or similar to the processes and materials of the semiconductor substrate 210, the interconnect structure 220 (including the dielectric layers 222 and the metallization layers 224), the connecting pads 230, the connecting vias 240 and protection layer 250 as described above, and thus are not repeated herein for simplicity.

In some embodiments, the integrated circuit components 130' are bonded to the wafer W1 (including multiple integrated circuit components 200) by a hybrid bonding process. For example, one integrated circuit component 130' is bonded on and electrically connected to one integrated circuit component 200 underlying thereto, as shown in FIG. 1. In some embodiments, top surfaces 134*t* of the connecting vias 134 in one of the integrated circuit components 130' and top surfaces 240*t* of the connecting vias 240 in a respective underlying one of the integrated circuit components 200 prop against each other and are bonded together through copper-to-copper bonding (known as a direct metal-to-metal bonding). In addition, the top surface 135*t* of the protection layer 135 in each of the integrated circuit components 130' and a top surface 250*t* of the protection layer 250 in the respective underlying one of the integrated circuit components 200 prop against each other and are bonded together through oxide-to-nitride bonding (known as a direct dielectrics-to-dielectrics bonding), for example. In such embodiments, a bonding interface IF1 between the integrated circuit component 130' and the integrated circuit components 200 (included in the wafer W1) includes a dielectric-to-dielectric bonding interface (e.g., an oxide-to-nitride bonding interface) and a metal-to-metal interface (e.g., a copper-to-copper bonding interface). In the disclosure, the bonding interface IF1 may be referred to as a hybrid bonding interface. Alternatively, the dielectric-to-dielectric bonding interface may include an oxide-to-oxide bonding interface or a nitride-to-nitride interface, the disclosure is not limited thereto. As illustrated in FIG. 1, for example, the semiconductor devices in the semiconductor substrate 210 are electrically connected to the semiconductor devices in the semiconductor substrate 131 through the interconnect structure 220, the connecting pads 230, the connecting vias 240, the connecting vias 134, the connecting pads 133 and the interconnect structure 132.

It should be noted that bonding methods described above are merely examples and are not intended to be limiting. An offset may present between a sidewall of the connecting vias 134 and a sidewall of the connecting vias 240 underlying thereto. Since one of the connecting vias 134 and the connecting vias 240 may have a larger bonding surface than the other one, the direct metal-to-metal bonding may still be achieved even if misalignment occurs, thereby the reliability of electrical connections between the integrated circuit components 130' and 200 can be ensured. With such, for certain embodiments, either the protection layer 135 immediately adjacent to the connecting vias 134 is bonded to a portion of each of the connecting vias 240 (e.g. a dielectric-to-metal bonding), or the protection layer 250 immediately adjacent to the connecting vias 240 is bonded to a portion of each of the connecting vias 134 (e.g. a dielectric-to-metal bonding).

As shown in FIG. 1, for example, the wafer W1 have a plurality of device regions 100 each having a die stack (not labeled), where one die stack includes at least one of the integrated circuit components 200 and a respective one of the integrated circuit components 130' electrically connected thereto and located thereon. For example, the integrated circuit components 200 included in the wafer W1 are considered as semiconductor dies of a base tier (denoted as T0) of the die stack in each device region 100.

Figure 2:
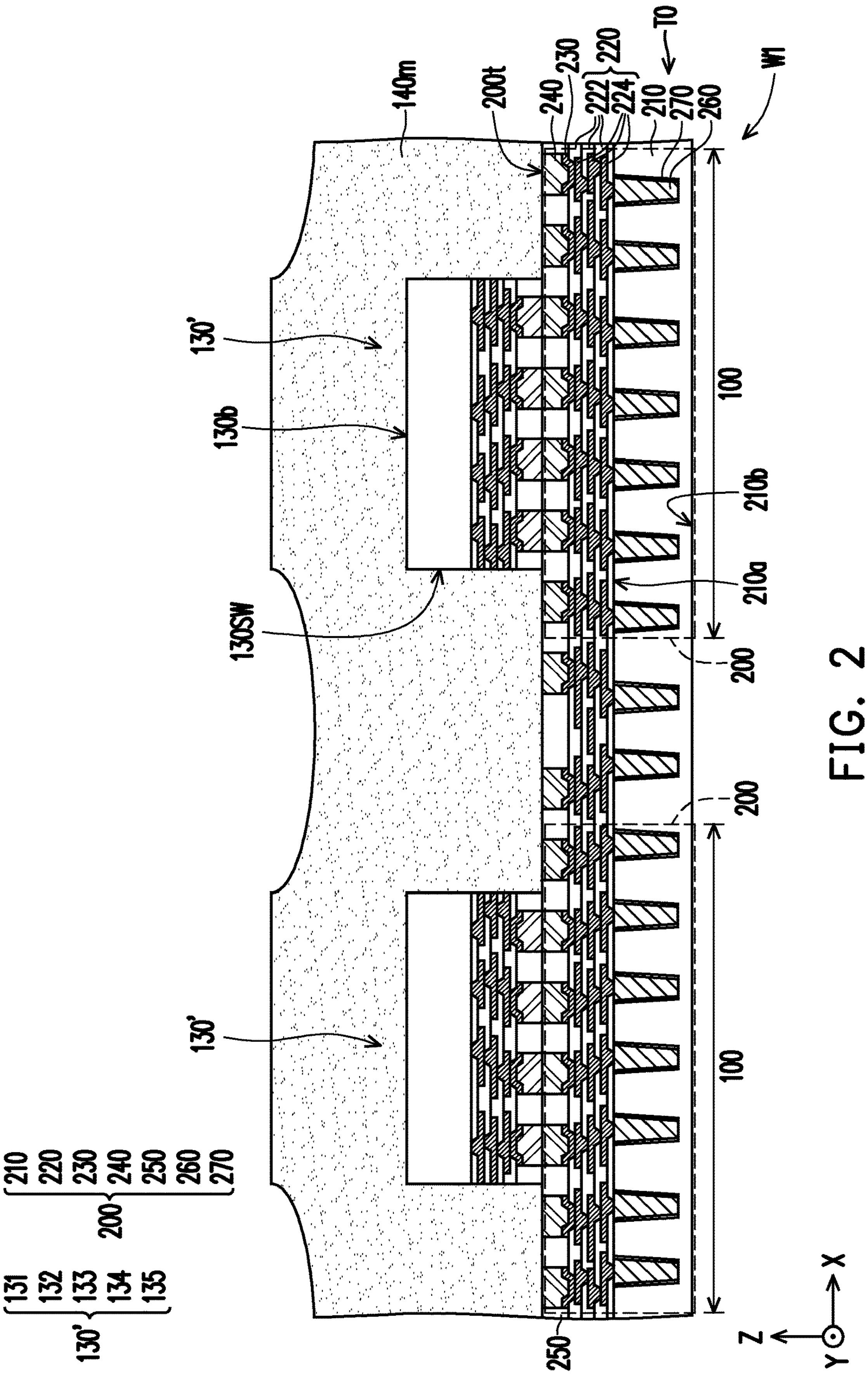

Referring to FIG. 2, in some embodiments, an insulating encapsulation 140*m* is formed over the wafer W1. For example, the insulating encapsulation 140*m* is conformally formed on the integrated circuit components 130', where the integrated circuit components 130' and a top surface 200*t* (of the integrated circuit components 200) of the wafer W1 exposed by the integrated circuit components 130' are covered by the insulating encapsulation 140*m*. In some embodiments, the bottom surface 130*b* and a sidewall 130SW of each of the integrated circuit components 130' are physically contacted with and encapsulated by the insulating encapsulation 140*m*. The insulating encapsulation 140*m* may be made of a dielectric material (such as an oxide (e.g. silicon oxide), a nitride (e.g. silicon nitride), TEOS, or the like) or any suitable insulating materials for gap fill, and may be formed by deposition (such as a CVD process). As shown in FIG. 2, the integrated circuit components 130' and the wafer W1 are not accessibly revealed by the insulating encapsulation 140*m*, for example.

Figure 3:
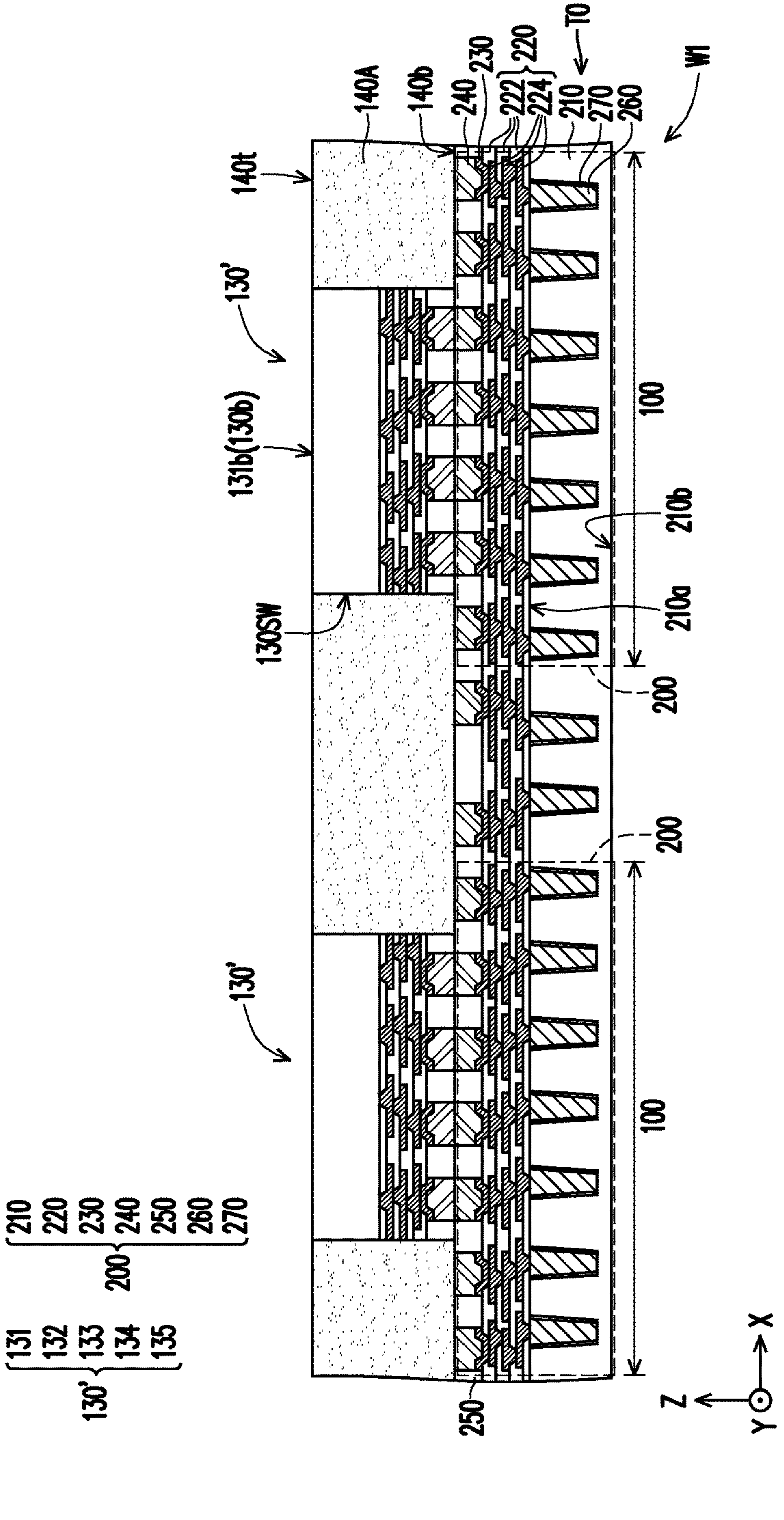

Referring to FIG. 3, in some embodiments, a planarizing process is performed on the insulating encapsulation 140*m* to form an insulating encapsulation 140A exposing the integrated circuit components 130'. For example, a portion of the insulating encapsulation 140*m* is removed to form the insulating encapsulation 140A having a top surface 140*t*, where the top surface 140*t* is a flat and planar surface. In some embodiments, the bottom surfaces 130*b* of the integrated circuit components 130' are substantially leveled with the top surface 140*t* of the insulating encapsulation 140A. For example, the bottom surfaces 130*b* of the integrated circuit components 130' are substantially coplanar to the top surface 140*t* of the insulating encapsulation 140A. The sidewalls 130SW of the integrated circuit components 130' and the top surface 200*t* of the wafer W1 exposed by the integrated circuit components 130' are covered by the insulating encapsulation 140A, in some embodiments. For example, a bottom surface 140*b* of the insulating encapsulation 140A is substantially coplanar with the top surfaces 130*t* of the integrated circuit components 130'. In other words, the bottom surface 140*b* of the insulating encapsulation 140A props against the top surface 200*t* (of the integrated circuit components 200) of the wafer exposed by the integrated circuit components 130'. As shown in FIG. 3, the integrated circuit components 130' (e.g. the bottom surfaces 130*b* of the semiconductor substrate 131) are accessibly revealed by the insulating encapsulation 140A, for example.

During the planarizing process, the semiconductor substrate 131 of one or more than one of the integrated circuit components 130' may further be planarized. In some embodiments, the planarizing process may include a grinding process or a chemical mechanical polishing (CMP) process. After the planarizing process, a cleaning process may be optionally performed, for example to clean and remove the residue generated from the planarizing process. However, the disclosure is not limited thereto, and the planarizing process may be performed through any other suitable method.

Figure 4:
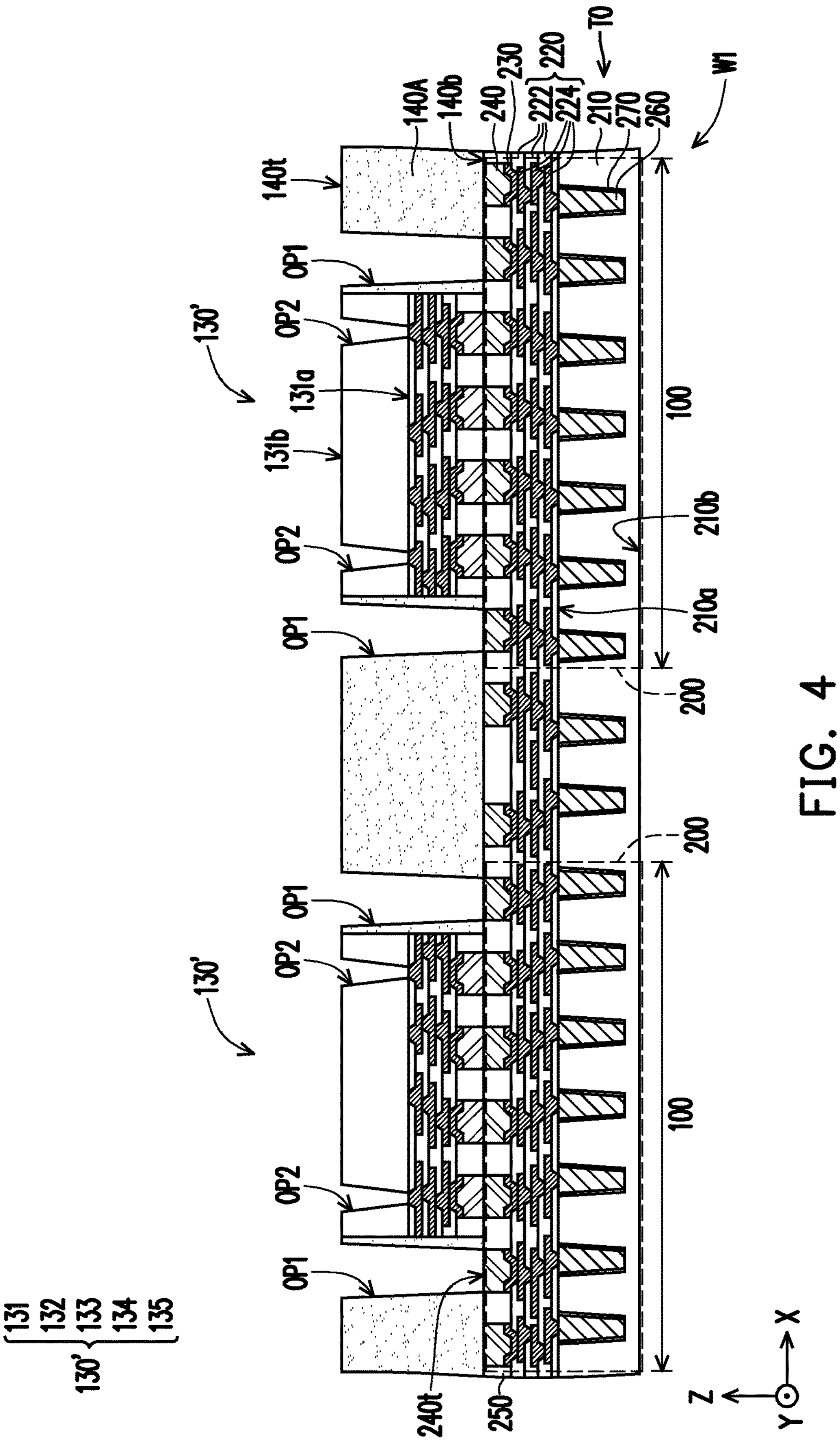

Referring to FIG. 3 and FIG. 4, in some embodiments, after the insulating encapsulation 140A is formed, a plurality of through holes OP1 are formed in the insulating encapsulation 140A, and a plurality of through holes OP2 are formed in the integrated circuit components 130'. For example, the through holes OP1 penetrate through the insulating encapsulation 140A to at least partially expose the top surfaces 240*t* of the connecting vias 240 of the integrated circuit components 200, and the through holes OP2 penetrate through the semiconductor substrates 131 to at least partially expose a surface of a topmost layer of the metallization layers 131 of the integrated circuit components 130', as shown in FIG. 1. In some embodiments, the through holes OP1 and OP2 are formed by a laser drilling process. For example, in FIG. 4, each of the integrated circuit components 200 are partially exposed by only two through holes OP1, and only two through holes OP2 are presented in each of the integrated circuit components 130', however the disclosure is not limited thereto. The number of the through holes OP1 and OP2 may be one or more than one depending on the demand.

In some embodiments, if considering the through holes OP1 and OP2 are opening holes with substantially round-shaped cross-section (from the top view on the X-Y plane), and each of the through holes OP1 and OP2 includes a slant sidewall (from the cross-sectional view depicted in FIG. 4). For example, each of through holes OP1 has a first top opening (at the top surface 140*t*) having a top diameter and a first bottom opening (at the bottom surface 140*b*) having a bottom diameter, and the top diameter is greater than the bottom diameter. For example, each of through holes OP2 has a second top opening (at the bottom surface 131*b*) having a top diameter and a second bottom opening (at the active surface 131*a*) having a bottom diameter, and the top diameter is greater than the bottom diameter. Alternatively, the through holes OP1 and OP2, in part or all, may independently include a vertical sidewall, where the top diameter may be substantially equal to the bottom diameter. The cross-sectional shape of the through holes OP1 and OP2 on the X-Y plane is, for example, elliptical, oval, tetragonal, octagonal or any suitable polygonal shape.

Figure 5:
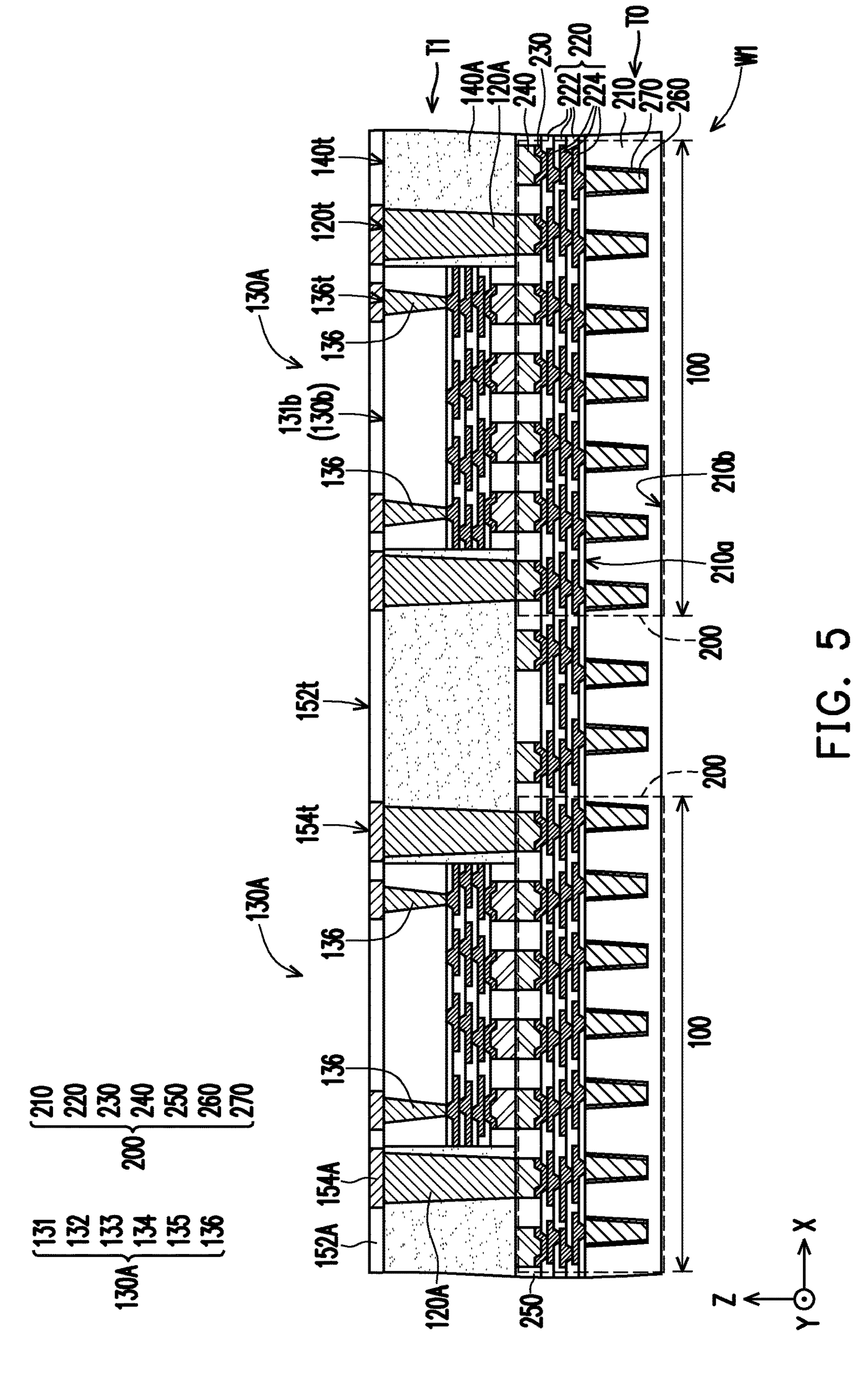

Referring to FIG. 5, in some embodiments, conductive pillars 120A are respectively formed in the through holes OP1; and on the other hand, conductive pillars 136 are respectively formed in the through holes OP2 to form integrated circuit components 130A. That is, each of the integrated circuit components 130A may include the semiconductor substrate 131, the interconnect structure 132, the connecting pads 133, the connecting vias 134, the protection layer 135 and the conductive pillars 136. In alternative embodiments, optional liners (not shown) are formed between the conductive pillars 136 and the semiconductor substrate 131. For example, each of the conductive pillars 136 is laterally covered by one of the optional liners, where the optional liners each cover the sidewall of a respective one through hole OP2. In some embodiments, through the optional liners, the conductive pillars 136 are separated from the semiconductor substrate 131.

Alternatively, a dielectric liner (not shown) may be further optionally formed to laterally separate the optional liners from the semiconductor substrate 131. The formation and material of the optional liners are the same or similar to the liners 270, and the formations and materials of the liners 270 and the optional dielectric liner have been described in FIG. 1, and thus are not repeated herein. For example, as shown in FIG. 4, the conductive pillars 136 are formed by using a via-last approach. In the disclosure, the conductive pillars 136 may be referred to as through semiconductor vias or through silicon vias (TSVs). Up to here, integrated circuit components 130A are formed. As shown in FIG. 5, the integrated circuit components 130A (e.g. the conductive pillars 136) are accessibly revealed by the insulating encapsulation 140A, for example.

Figure 10:
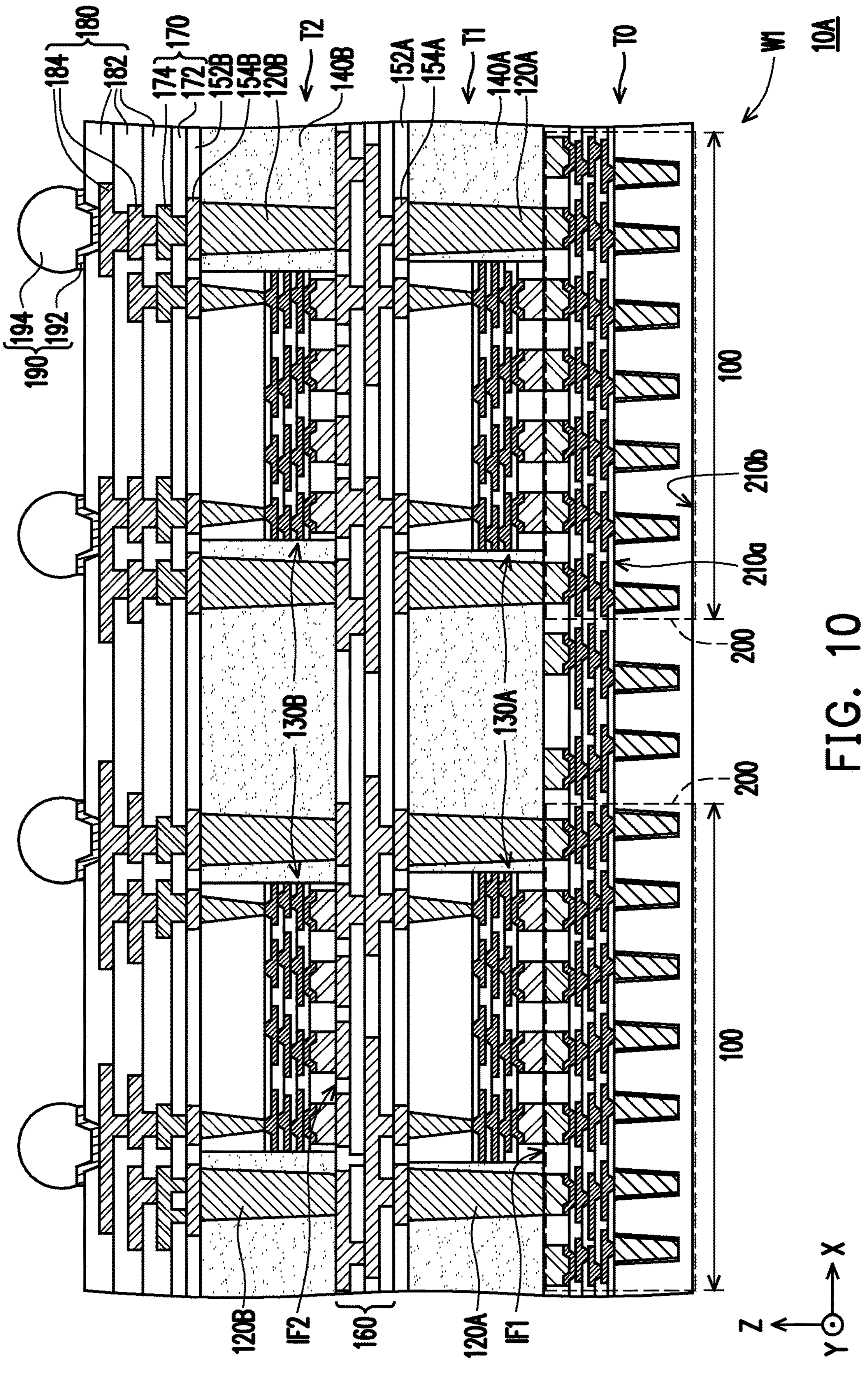

In some embodiments, the integrated circuit components 130A and the integrated circuit components 200 respectively bonded thereto are independently, in part or all, with same types and/or different types for forming a system (e.g., in the semiconductor structure 10A depicted in FIG. 10). For example, the types of some of the integrated circuit components 130A are the same as the types of some of the integrated circuit components 200 while the types of the rest of the integrated circuit components 130A are different from as the types of the rest of the integrated circuit components 200. However, the disclosure is not limited thereto; alternatively, the types of the integrated circuit components 130A are all identical to the types of the integrated circuit components 200. Or, the types of the integrated circuit components 130A are all different from the types of the integrated circuit components 200.

In accordance with some embodiments of the disclosure, the types of some of the integrated circuit components 130A are different from each other, while some of the integrated circuit components 130A are identical types. In alternative embodiments, the types of some of the integrated circuit components 130A are electrical and/or optical components. In alternative embodiments, the types of all of the integrated circuit components 130A are different. In further alternative embodiments, the types of all of the integrated circuit components 130A are identical. In accordance with some embodiments of the disclosure, the sizes of some of the integrated circuit components 130A are different from each other, while some of the integrated circuit components 130A are the same sizes. In alternative embodiments, the sizes of all of the integrated circuit components 130A are different. In further alternative embodiments, the sizes of all of the integrated circuit components 130A are the same. In accordance with some embodiments of the disclosure, the shapes of some of the integrated circuit components 130A are different from each other, while the shapes of some of the integrated circuit components 130A are identical. In alternative embodiments, the shapes of all of the integrated circuit components 130A are different. In further alternative embodiments, the shapes of all of the integrated circuit components 130A are identical. The types, sizes and shapes of each of the integrated circuit components 130A are independent from each other, and may be selected and designed based on the demand and design layout, the disclosure is not limited thereto.

In some embodiments, some of the conductive pillars 120A are electrically connected to the devices formed in some of the integrated circuit components 200 through the connecting vis 240, the connecting pads 230 and the interconnect structure 220. In some embodiments, some of the conductive pillars 120A are electrically connected to the devices formed in some of the integrated circuit components 130A through the connecting vis 240, the connecting pads 230, the interconnect structure 220, the connecting vias 134, the connecting pads 133, and the interconnect structure 132. In some embodiments, some of the conductive pillars 120A are electrically connected to some of the conductive pillars 260 of some of the integrated circuit components 200 through the connecting vis 240, the connecting pads 230, and the interconnect structure 220. In some embodiments, some of the conductive pillars 136 are electrically connected to the devices formed in some of the integrated circuit components 130A through the interconnect structure 132. In some embodiments, some of the conductive pillars 136 are electrically connected to the devices formed in some of the integrated circuit components 200 through the interconnect structure 132, the connecting pads 133, the connecting vias 134, the connecting vis 240, the connecting pads 230 and the interconnect structure 220. In some embodiments, some of the conductive pillars 136 are electrically connected to some of the conductive pillars 260 of some of the integrated circuit components 200 through the interconnect structure 132, the connecting pads 133, the connecting vias 134, the connecting vis 240, the connecting pads 230 and the interconnect structure 220. In some embodiments, some of the conductive pillars 136 are electrically connected to the conductive pillars 120A through the interconnect structure 132, the connecting pads 133, the connecting vias 134, the connecting vis 240, the connecting pads 230 and the interconnect structure 220.

In the disclosure, after the formation of the conductive pillars 120A and the conductive pillars 136, a first tier (denoted as T1) of inner tiers of the die stack in each device region 100 is formed over the base tier T0, where the integrated circuit components 130A laterally encapsulated in the insulating encapsulation 140A are considered as semiconductor dies of the first tier T1 of the inner tiers of the die stack in each device region 100. In some embodiments, the integrated circuit components 130A of the first tier T1 are disposed on the integrated circuit components 200 of the base tier T0 in a face-to-face configuration. As shown in FIG. 5, the integrated circuit components 200 each have a size greater than a size of a respective one of the integrated circuit components 130A overlying thereto on the X-Y plane (e.g., a size as measured along the direction X), for example. Alternatively, the integrated circuit components 200 each may have a size substantially equal to a size of the respective one of the integrated circuit components 130A overlying thereto on the X-Y plane.

Continued on FIG. 5, a passivation layer 152A and contact pads 154A are sequentially formed over the conductive pillars 120A, the integrated circuit components 130A and the insulating encapsulation 140A, in some embodiments. For example, the formation of the passivation layer 152A and the contact pads 154A include, but not limit to, forming a blanket layer of a dielectric material over the conductive pillars 120A, the integrated circuit components 130A and the insulating encapsulation 140A, pattering the dielectric material blanket layer to form a plurality of openings (not labeled) therein so as to form the passivation layer 152A, and then filling a conductive material in the openings to form the contact pads 154A in the passivation layer 152A. In some embodiments, an additional planarizing process may be performed to level the passivation layer 152A and the contact pads 154A. For example, the contact pads 154A each are independently connected to at least one of the conductive pillars 120A, at least one of the conductive pillars 136, or a combination thereof. That is, some of the contact pads 154A are electrically connected to the conductive pillars 120A, some of the contact pads 154A are electrically connected to the conductive pillars 136, and some of the contact pads 154A are electrically connected the conductive pillars 120A and 136 to provide electrical connection therebetween. In the disclosure, the contact pads 154A may be considered as a local interconnect in the semiconductor structure 10A. The material of the passivation layer 152A may be similar or the same as the material of the protection layer 250 as described in FIG. 1, and the material of the contact pads 154A may be similar or the same as the material of the connecting vias 240 as described in FIG. 1, and thus are not repeated therein for brevity. As shown in FIG. 5, top surfaces 154*t* of the contact pads 154A are substantially coplanar with and substantially leveled with a top surface 152*t* of the passivation layer 152A, for example.

However, the disclosure is not limited thereto; alternatively, the first tier T1 may include the conductive pillars 120A, the integrated circuit components 130A, the insulating encapsulation 140A, the passivation layer 152A and the contact pads 154A.

Figure 6:
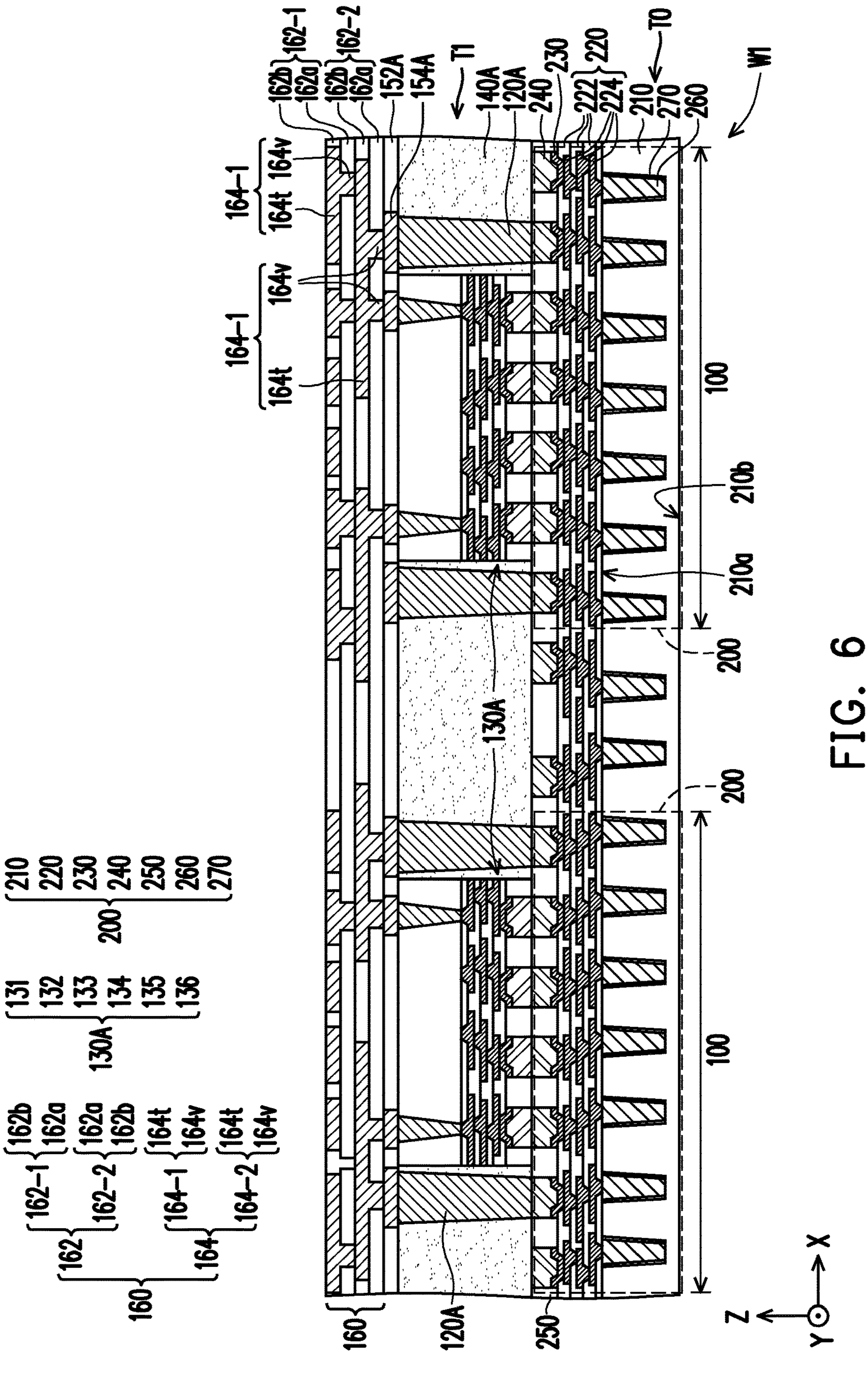

Referring to FIG. 6, in some embodiments, a redistribution circuit structure 160 is formed over the first tier T1 to provide a horizontal electrical communication among the integrated circuit components 130A included in the first tier T1. In some embodiments, the redistribution circuit structure 160 includes one or more than one dielectric layer 162 (e.g. a dielectric layer 162-1 and a dielectric layer 162-2) and one or more than one patterned conductive layer 164 (e.g. a patterned conductive layer 164-1 and a patterned conductive layer 164-2) arranged in alternation. However, in the disclosure, the number of the dielectric layers 162 and the number of the patterned conductive layers 164 are not limited to FIG. 6. For example, the number of the dielectric layers 162 and the number of the patterned conductive layers 164 may be independently one or more than one based on the demand and the design layout. In the disclosure, the redistribution circuit structure 160 may be considered as a semi-global interconnect in the semiconductor structure 10A.

In some embodiments, the dielectric layer 162-1 is formed, but not limit to, by: forming a first dielectric material blanket layer over the first tier T1; forming a second dielectric material blanket layer over the first dielectric material blanket layer; patterning the second dielectric material blanket layer to form a plurality of trench openings (not labeled) in the second dielectric material blanket layer and thereby forming the dielectric material 162*b*; and patterning the first dielectric material blanket layer to form a plurality of via openings (not labeled) in the first dielectric material blanket layer and thereby forming the dielectric material 162*a*. The trench openings in the dielectric material 162*b* may independently spatially communicated with one via opening (if any) underlying thereto and formed in the dielectric material 162*a* to form a dual damascene opening (not labeled). That is, the dual damascene openings each include a narrower via hole and a wider trench hole over the narrower via hole, for example. In some embodiments, the dielectric materials 162*a* and 162*b* may include silicon oxide, silicon nitride, polymer or a combination thereof, and are formed by depositing a dielectric material through a suitable process such as spin coating, CVD or the like, and then performing a planarization process on the dielectric material. In some embodiments, the function and material of the dielectric materials 162*a* and 162*b* may be the same or different from each other, the disclosure is not limited thereto.

In an alternative embodiment, an additional dielectric material (not shown) may be presented between the dielectric materials 162*a* and 162*b*, between the dielectric material 162*a* and the contact pads 154A, or a combination thereof. The material and formation of the additional dielectric material may be substantially the same or similar to the dielectric materials 162*a* and 162*b*, and thus are not repeated herein. The function and material of the dielectric materials 162*a*, 162*b* and the additional dielectric material may be the same or different from each other, the disclosure is not limited thereto. For example, the additional dielectric material is silicon nitride and used for an etching stop layer, while the dielectric materials 162*a* and 162*b* are silicon oxide and used for bonding. In the alternative embodiment of which the additional dielectric material is located between the dielectric materials 162*a* and 162*b* and between the dielectric material 162*a* and the contact pads 154A (serving as the etching stop layer), the additional dielectric material between the dielectric material 162*a* and 162*b* is also etched to form the trench holes exposing the dielectric material 162*a* by an etching process, and the additional dielectric material between dielectric material 162*a* and the contact pads 154A is also etched to form the via holes exposing the contact pads 154A by an etching process. During the etching processes of the additional dielectric materials, an etching selectivity of the additional dielectric materials to the dielectric materials 162*a* and/or 162*b* is significantly high, so that the etching processes of the additional dielectric materials are performed without removal of the dielectric materials 162*a* and 162*b* (e.g. the removal of the dielectric materials 162*a* and 162*b* is significantly small and thus is negligible).

After the formation of the dielectric layer 162-1, the patterned conductive layer 164-1 is formed thereon, in some embodiments. As shown in FIG. 6, the patterned conductive layer 164-1 is located in the dielectric layer 162-1, where the patterned conductive layer 164-1 is electrically connected to the conductive pillars 120A and 136 exposed by the dielectric layer 162-1, for example. In some embodiments, a top surface of the patterned conductive layer 164-1 is substantially leveled with and substantially coplanar to a top surface of the dielectric layer 162-1. In some embodiments, the patterned conductive layer 164-1 is formed, but not limit to, by: filling a conductive material in the via holes and trench holes formed in the dielectric layer 162-1 by deposition (e.g., CVD, physical vapor deposition (PVD), or the like) or plating (e.g., with a metallic seed layer conformally formed over the dielectric layer 162-1 prior to filling the conductive material); and planarizing the conductive material to remove excess the conductive material located on the dielectric layer 162-1 and thereby forming the patterned conductive layer 164-1. For example, as shown in FIG. 6, the patterned conductive layer 164-1 includes conductive vias 164*v* in the via openings and a plurality of the conductive trench 164*t* in the trench openings. The material of the patterned conductive layer 164-1 includes copper, nickel, aluminum, gold, silver, tungsten, an alloy thereof, or a combination thereof, for example. The dual damascene openings may be formed through a trench first process. In some embodiments, the patterned conductive layers 164-1 may be formed by dual-damascene method.

In some embodiments, the dielectric layer 162-2 and the patterned conductive layer 164-2 are sequentially formed over the patterned conductive layer 164-1 to form the redistribution circuit structure 160, where the patterned conductive layer 164-2 is electrically connected to the patterned conductive layer 164-1 exposed by the dielectric layer 162-2. The formation and material of the dielectric layer 162-2 are the same or similar to the formation and the material of the dielectric layer 162-1, and the formation and material of the patterned conductive layer 164-2 are the same or similar to the formation and the material of the patterned conductive layer 164-1, and thus are not repeated herein. As shown in FIG. 6, the redistribution circuit structure 160 is electrically connected to the conductive pillars 120A and the integrated circuit components 130A of the first tier T1 and is also electrically connected to the integrated circuit components 200 of the base tier T0. Owing to the redistribution circuit structure 160, the integrated circuit components 130A of the first tier T1 are electrically communicated to one another, a heroization electrical connections between the semiconductor dies included in the same tier is achieved. Furthermore, with the redistribution circuit structure 160 and the conductive pillars 120A, electrical communications between the integrated circuit components 130A of the first tier T1 and the integrated circuit components 300 of the base tier T0 (via electrical connections therebetween) are further ensured.

Figure 7:
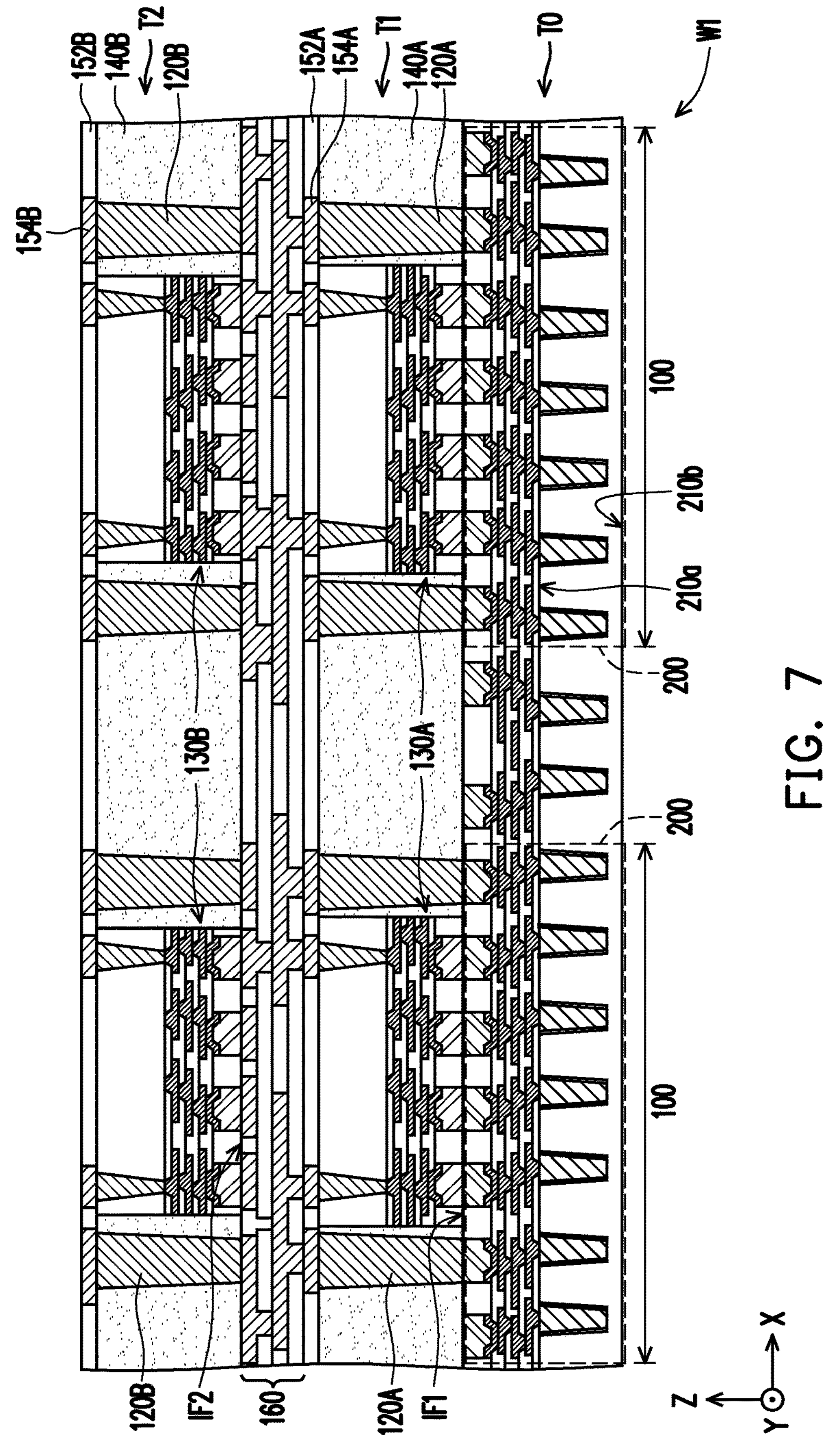

Referring to FIG. 7, a second tier T2 (including a plurality of conductive pillars 120B, a plurality of integrated circuit components 130B and an insulating encapsulation 140B) is formed over the first tier T1, and passivation layer 152B and contact pads 154B are disposed on the second tier T2. The formation and material of the passivation layer 152B and the formation and material of the contact pads 154B are similar to or the same as the formation and material of the passivation layer 152A and the formation and material of the contact pads 154A described in FIG. 5, and thus are not repeated herein for simplicity. However, the disclosure is not limited thereto; alternatively, the second tier T2 may include the conductive pillars 120B, the integrated circuit components 130B, the insulating encapsulation 140B, the passivation layer 152B and the contact pads 154B.

In some embodiments, the conductive pillars 120B and the integrated circuit components 130B are laterally encapsulated in the insulating encapsulation 140B, where the conductive pillars 120B are electrically connected to the redistribution circuit structure 160 and the contact pads 154B overlying thereto, and the integrated circuit components 130B are also electrically connected to the redistribution circuit structure 160 and the contact pads 154B overlying thereto. In the disclosure, the contact pads 154B may be considered as a local interconnect in the semiconductor structure 10A. In some embodiments, the formation and the material of the conductive pillars 120B are the same or similar to the formation and material of the conductive pillars 120A as previously described in FIG. 5, and the formation and material of the integrated circuit components 130B are the same or similar to the formation and material of the integrated circuit components 130A as previously described in FIG. 5, and thus are omitted. The integrated circuit components 130B laterally encapsulated in the insulating encapsulation 140B are considered as semiconductor dies of the second tier T2 of the inner tiers of the die stack in each device region 100.

In some embodiments, a bonding interface IF2 between the integrated circuit component 130B in the second tier T2 and the integrated circuit components 130A in the first tier T1 includes a dielectric-to-dielectric bonding interface (e.g., an oxide-to-nitride bonding interface) and a metal-to-metal interface (e.g., a copper-to-copper bonding interface). In the disclosure, the bonding interface IF2 may be referred to as a hybrid bonding interface. For example, the configuration of the bonding interface IF2 is the same or similar to the configuration of the bonding interface IF1, and thus are omitted herein.

In some embodiments, the integrated circuit components 130B and the integrated circuit components 130A respectively bonded thereto are independently, in part or all, with same types and/or different types for forming the afore-said system (e.g., in the semiconductor structure 10A depicted in FIG. 10). For example, the types of some of the integrated circuit components 130B are the same as the types of some of the integrated circuit components 130A and/or 200 while the types of the rest of the integrated circuit components 130B are different from as the types of the rest of the integrated circuit components 130A and/or 200. However, the disclosure is not limited thereto; alternatively, the types of the integrated circuit components 130B are all identical to the types of the integrated circuit components 130A and/or 200. Or, the types of the integrated circuit components 130B are all different from the types of the integrated circuit components 130A and/or 200.

In accordance with some embodiments of the disclosure, the types of some of the integrated circuit components 130B are different from each other, while some of the integrated circuit components 130B are identical types. In alternative embodiments, the types of all of the integrated circuit components 130B are different. In further alternative embodiments, the types of all of the integrated circuit components 130B are identical. In accordance with some embodiments of the disclosure, the sizes of some of the integrated circuit components 130B are different from each other, while some of the integrated circuit components 130B are the same sizes. In alternative embodiments, the sizes of all of the integrated circuit components 130B are different. In further alternative embodiments, the sizes of all of the integrated circuit components 130B are the same. In accordance with some embodiments of the disclosure, the shapes of some of the integrated circuit components 130B are different from each other, while the shapes of some of the integrated circuit components 130B are identical. In alternative embodiments, the shapes of all of the integrated circuit components 130B are different. In further alternative embodiments, the shapes of all of the integrated circuit components 130B are identical. The types, sizes and shapes of each of the integrated circuit components 130B are independent from each other, and may be selected and designed based on the demand and design layout, the disclosure is not limited thereto.

As shown in FIG. 7, the integrated circuit components 130A each have a size greater than a size of a respective one of the integrated circuit components 130B overlying thereto on the X-Y plane (e.g., a size as measured along the direction X), for example. Alternatively, the integrated circuit components 130A each may have a size substantially equal to a size of the respective one of the integrated circuit components 130B overlying thereto on the X-Y plane. In other words, for example, the integrated circuit components 130A each have a size greater than or substantially equal to a size of a respective one of the integrated circuit components 130B overlying thereto on the X-Y plane.

Figure 8:
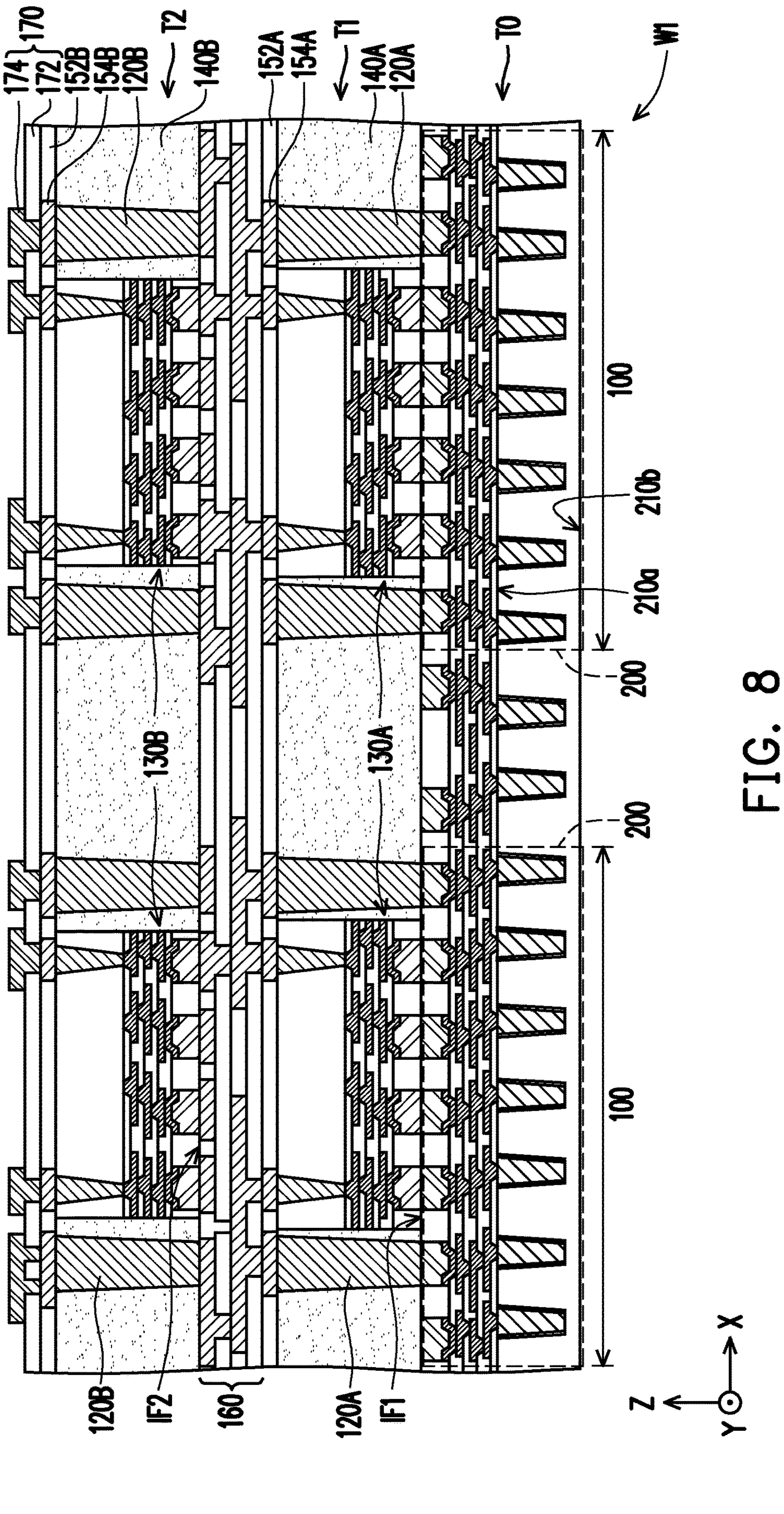

Referring to FIG. 8, in some embodiments, a connecting structure 170 is formed on the passivation layer 152B and the contact pads 154B overlaid on the second tier T2. For example, the connecting structure 170 includes one dielectric layer 172 and one patterned conductive layer 174 for illustrative purposes, the number of the dielectric layer 172 and the number of the patterned conductive layer 174 are no limited to FIG. 8. In some embodiments, the patterned conductive layer 174 is electrically connected to the integrated circuit components 130B through the conductive pillars 136 and the contact pads 154B and is electrically connected to the conductive pillars 120B and the contact pads 154B. In the disclosure, the connecting structure 170 is considered as a circuit structure of providing a routing function to the die stack (including the base tier T0 and the inner tiers (e.g., T1 and T2)). Therefore, along the stacking direction Z, the inner tier (e.g., T2) being nearest to the connecting structure 170 is considered as an outermost tier (or a topmost tier) of the inner tiers of the die stack in each device region 100.

For examples, the dielectric layers 172 may be silicon oxide layers, silicon nitride layers, silicon oxy-nitride layers, or dielectric layers formed by other suitable dielectric materials, and the dielectric layers 172 may be formed by deposition or the like. For examples, the patterned conductive layers 174 may be patterned copper layers or other suitable patterned metal layers, and the patterned conductive layers 174 may be formed by electroplating or deposition. However, the disclosure is not limited thereto. In some embodiments, the patterned conductive layers 174 may be formed by dual-damascene method.

Figure 9:
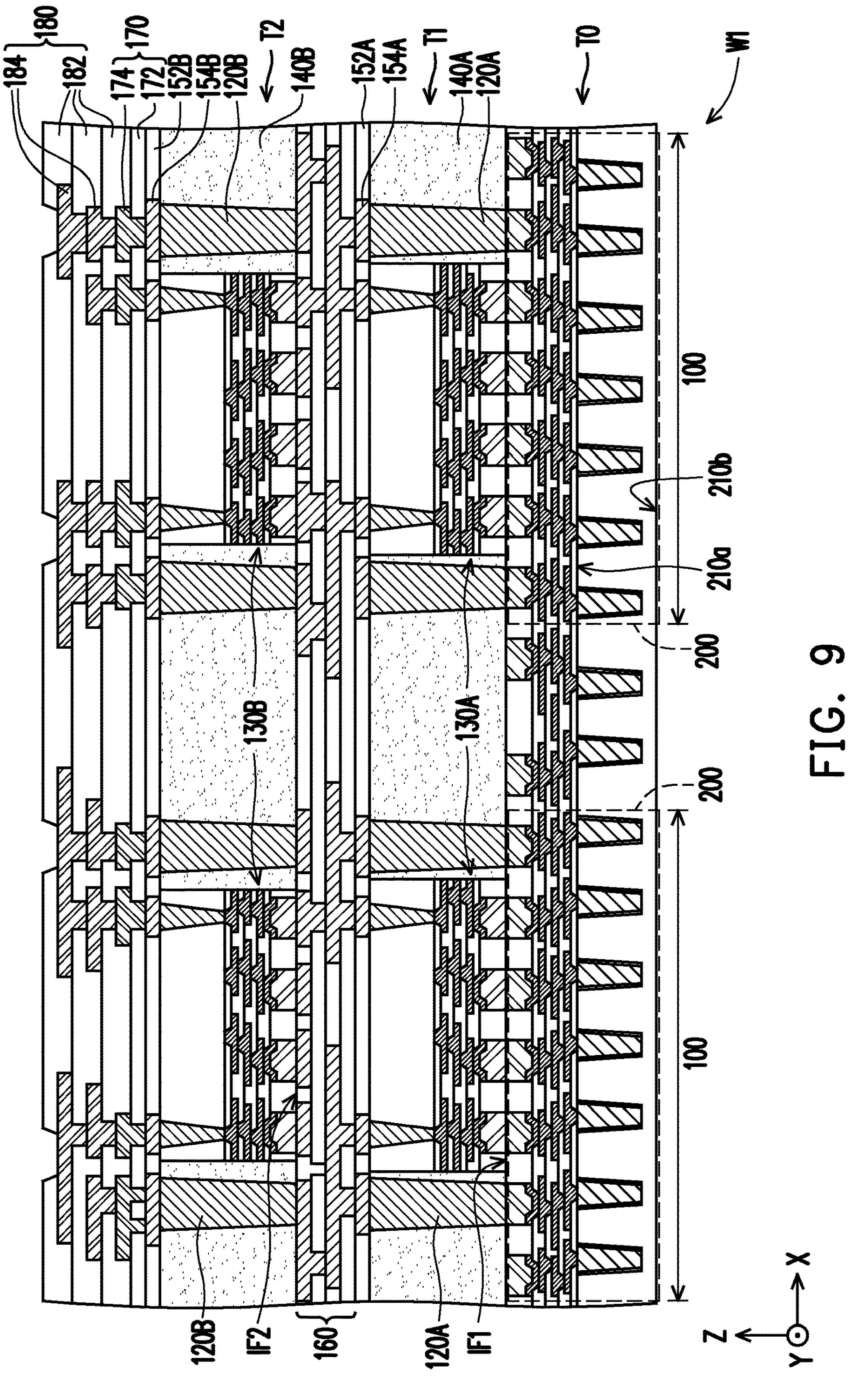

Referring to FIG. 9, in some embodiments, a redistribution circuit structure 180 is formed on the connecting structure 170. In some embodiments, the redistribution circuit structure 180 is fabricated to electrically connect with one or more connectors underneath. Here, the afore-said underlying connectors may be the patterned conductive layer 174. In other words, the redistribution circuit structure 180 is electrically connected to the semiconductor dies (e.g., 200, 130A, 130B) of the die stack in each device region 100 through the connecting structure 170. The redistribution circuit structure 180 may be referred to as a redistribution layer of the die stack in each device region 100.

In some embodiments, the redistribution circuit structure 180 includes a plurality of inter-dielectric layers 182 and a plurality of redistribution conductive layers 184 stacked alternately. For example, the redistribution conductive layers 184 are electrically connected to the patterned conductive layer 174. As shown in FIG. 9, in some embodiments, a top surface of the patterned conductive layer 174 is in contact with a bottommost one of the redistribution conductive layers 184. In some embodiments, the top surface of the patterned conductive layer 174 is partially covered by the bottommost inter-dielectric layer 182. In some embodiments, the topmost redistribution conductive layer 184 is exposed by the topmost one of the inter-dielectric layers 182 for electrically connecting to one or more connectors above. Here, the afore-said overlying connectors may be later-formed connectors, such as conductive terminals or the like.

In some embodiments, the material of the inter-dielectric layers 182 includes PI, epoxy resin, acrylic resin, phenol resin, BCB, PBO, or any other suitable polymer-based dielectric material, and the inter-dielectric layers 182 may be formed by deposition. In some embodiments, the material of the redistribution conductive layers 184 includes aluminum, titanium, copper, nickel, tungsten, and/or alloys thereof, and the redistribution conductive layers 184 may be formed by electroplating or deposition. The numbers of the layers of the inter-dielectric layers 182 and the redistribution conductive layers 184 may be may be designated based on the demand and/or design layout, and is not specifically limited to the disclosure.

Referring to FIG. 10, in some embodiments, a plurality of conductive elements 190 are formed on the redistribution circuit structure 180. The conductive elements 190 each include an under-ball metallurgy (UBM) pattern 192 and a conductive terminal 194 located over and connected to the UBM pattern 192, for example. In some embodiments, the conductive terminals 194 are electrically connected to the redistribution circuit structure 180 through the UBM patterns 192. For example, the conductive elements 190 are electrically connected to the topmost redistribution conductive layer 184 exposed by the topmost inter-dielectric layer 182. That is, in some embodiments, the conductive elements 190 are electrically connected to the redistribution conductive layers 184 of the redistribution circuit structure 180, and the conductive elements 190 are electrically connected to the die stack in the semiconductor structure 10A through the redistribution circuit structure 180.

For example, some of the conductive elements 190 are electrically connected to the conductive pillars 120B of the second tier T2 through the redistribution circuit structure 180, the connecting structure 170 and the contact pads 150. For example, some of the conductive elements 190 are electrically connected to the integrated circuit components 130B of the second tier T2 through the redistribution circuit structure 180, the connecting structure 170 and the contact pads 150. For example, some of the conductive elements 190 are electrically connected to the conductive pillars 120A of the first tier T1 through the redistribution circuit structure 180, the connecting structure 170, the contact pads 150 between the connecting structure 170 and the second tier T2, some of the conductive pillars 120B or some of the integrated circuit components 130B, the redistribution circuit structure 160 and the contact pads 150 between the redistribution circuit structure 160 and the first tier T1. For example, some of the conductive elements 190 are electrically connected to the integrated circuit components 130A of the first tier T1 through the redistribution circuit structure 180, the connecting structure 170, the contact pads 150 between the connecting structure 170 and the second tier T2, some of the conductive pillars 120B or some of the integrated circuit components 130B, the redistribution circuit structure 160 and the contact pads 150 between the redistribution circuit structure 160 and the first tier T1. The numbers of the conductive elements 190 is not limited in accordance with the disclosure. In certain embodiments, some of the conductive elements 190 may be electrically floated or grounded, the disclosure is not limited thereto. In the disclosure, the redistribution circuit structure 180 may be considered as a global interconnect in the semiconductor structure 10A.

In some embodiments, after the formation of the redistribution circuit structure 180, the UBM patterns 192 are disposed on some of the top surface of the topmost redistribution conductive layer 184 exposed by the topmost inter-dielectric layer 182 for electrically connecting with the conductive terminals 194. The UBM patterns 192 may be a metal layer, which may include a single layer or a composite layer comprising a plurality of sub-layers formed of different materials. In some embodiments, the materials of the UBM patterns 192 includes copper, nickel, titanium, molybdenum, tungsten, titanium nitride, titanium tungsten, or alloys thereof or the like, and may be formed by an electroplating process, for example. The UBM patterns 192 each may include titanium layer and a copper layer over the titanium layer. In some embodiments, the UBM patterns 192 are formed using, for example, sputtering, PVD, or the like. The shape and number of the UBM patterns 192 are not limited in this disclosure. The number of the UBM patterns 192 may be controlled by adjusting the numbers of openings formed in the topmost layer of the topmost inter-dielectric layer 182 exposing the top surface of the topmost redistribution conductive layer 184.

In a further alternative embodiment, besides the formation of the UBM patterns 192, additional conductive pads (not shown) are also formed for mounting semiconductor passive components/devices (not shown) thereon. The semiconductor passive components/devices may be integrated passive devices (IPDs) or surface mount devices (SMDs). The materials of the conductive pads and the UBM patterns 192 may be the same. Alternatively, the material of the UBM patterns 192 may be different from the material of the conductive pads. The disclosure is not limited thereto.

In some embodiments, the conductive terminals 194 are disposed on the UBM patterns 192 by ball placement process or reflow process. The conductive terminals 194 may be micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The numbers of the conductive terminals 194 may correspond to the numbers of the UBM patterns 192. When solder is used, the solder may include either eutectic solder or non-eutectic solder. The solder may include lead or be lead-free, and may include Sn—Ag, Sn—Cu, Sn—Ag—Cu, or the like. The conductive terminals 194 may be referred to as conductive input/output terminals of a semiconductor package structure (e.g. the semiconductor structure 10A). Up to here, the semiconductor structure 10A is manufactured.

In some embodiments, the semiconductor structure 10A is a wafer-form (or wafer-scale or a wafer-size) semiconductor package. Referring to FIG. 10 and FIG. 11, in some embodiments, FIG. 11 is the top view of the semiconductor structure 10A, where FIG. 10 illustrates the enlarged, schematic cross-sectional view of a part of the semiconductor structure 10A indicated by the dashed box A of FIG. 11. For example, if considering the top view (perpendicular to the stacking direction Z of the integrated circuit components 200, 130A and 130B shown in FIG. 10) on the X-Y plane of FIG. 11, the semiconductor structure 10A has a size (e.g., a diameter D1) about 4 inches or more. For example, the semiconductor structure 10A has a diameter D1 of about 6 inches. In some examples, the semiconductor structure 10A has a diameter D1 of about 8 inches. In some other examples, the semiconductor structure 10A has a diameter D1 of about 12 inches. In some further examples, the semiconductor structure 10A has a diameter D1 of about more than 12 inches. The semiconductor structure 10A may be referred to as a reconstructed wafer having multi-chip (or multi-die) modules. The afore-said multi-chip (or multi-die) modules may be referred to the die stacks respectively located in the device regions 100, where each die stack includes at least two tiers. For example, in the semiconductor structure 10A, each die stack of the device region 100 includes at least one base tier T0 (including at least one integrated circuit component 200) and two inner tiers T1, T2 (respectively including at least one integrated circuit component 130A and at least one integrated circuit component 130B). However, the disclosure is not limited thereto; alternatively, each die stack may include one base tier and one inner tier (considered as the outmost/topmost inner tier), or each die stack may include two or more than two inner tiers (e.g., two inner tiers at the ends of the die stack being respectively considered as an innermost/bottommost inner tier and an outmost/topmost inner tier).

Due to the semiconductor structure 10A includes multiple die stacks each having the integrated circuit components 200, 130A and 130B (independently, in part or all, with same types and/or different types) for forming at least one computing system, the semiconductor structure 10A is also referred to as a system-on-wafer (SoW) package, for example. In some embodiments, each die stack in the device region 100 may be referred to as a System-on-Integrate-Chips (SoIC). In some embodiments, the SoICs (e.g., the die stacks) are arranged aside to each other along the direction X and/or the direction Y. For example, as shown in FIG. 11, the SoICs are arranged into an array having a cross-form. Furthermore, a plurality of additional input/output (I/O) interface dies may be located aside of the SoICs, where the additional I/O interface dies (not shown) may be arranged into four arrays having a linear-line form and respectively positioned in correspondence with four ends of the cross-form array of the SoICs for providing additional input/output circuitries thereto, and thus more I/O counts are provided to the SoICs. However, the disclosure is not limited thereto.

In alternative embodiments, the SoICs are arranged in the form of a matrix, such as a N×N array or a N×M array (N, M>0, N may or may not be equal to M) in another shape (e.g., a circle-shape, a rectangle-shape, a square-shape, or the like), while the additional I/O interface dies are arranged to surround the SoICs (arranged into the array/matrix). The matrix of the additional I/O interface dies may be a N×N array or a N×M array (N, M>0, N may or may not be equal to M). In alternative embodiments, the types of additional I/O interface dies are electrical and/or optical components. That is, in such embodiments, the additional I/O interface dies are arranged into an array surrounding the perimeter of the array formed by the SoICs. In other alternative embodiments, the SoICs and the additional I/O interface dies are together arranged in the form of a matrix, such as the N×N array or N×M arrays (N, M>0, N may or may not be equal to M). With such embodiments, the SoICs and the additional I/O interface dies are arranged into the matrix in an alternation manner. In a further alternative embodiment, the SoICs are arranged in the form of a first matrix and the additional I/O interface dies are arranged in the form of a second matrix, where the first and second matrices are N×N array or N×M arrays (N, M>0, N may or may not be equal to M), and the first and second matrices are positioned next to each other along the direction X or the direction Y.

As shown in FIG. 11, the SoICs (e.g., the die stacks) have the same sizes and shapes, for example. That is, the SoICs (e.g., the die stacks) included in the semiconductor structure 10A have the identical architectures. However, the disclosure is not limited thereto. Alternatively, the sizes of some of SoICs may be different from each other, while some of SoICs may have the same sizes. Or, the sizes of SoICs may be different from each other. Alternatively, the shapes of some of SoICs may be different from each other, while some of SoICs may have identical shapes. Or, the shapes of SoICs may be different from each other. In other words, the SoICs (e.g., the die stacks) in one semiconductor structure may have different architectures, in part or all (will be described later in conjunction with FIG. 34 through FIG. 50).

However, the disclosure is not limited thereto; in alternative embodiments, the UBM patterns 192 are omitted. Referring to FIG. 12, for some examples, the conductive elements 190 includes a plurality of conductive terminals 196, instead of the UBM patterns 192 and the conductive terminals 194. The conductive terminals 196 may include a plurality of micro-bumps or metal pillars. That is, in the embodiments of which the conductive elements 190 includes a plurality of conductive terminals 196, the UBM patterns 192 are omitted.

In some embodiments, as shown in FIG. 12, a dicing (or singulation) process is sequentially performed to cut through the semiconductor structure 10A depicted in FIG. 10 into individual and separated SoICs 1000A, where each SoIC 1000A is a single die stack of one device region 100 included in the semiconductor structure 10A. In one embodiment, the dicing process is a wafer dicing process including mechanical blade sawing or laser cutting. The disclosure is not limited thereto. Up to this, the SoICs 1000A are manufactured. In some embodiments, as shown in FIG. 12 and FIG. 13, a sidewall of the integrated circuit component 200 is substantially aligned with a sidewall of the redistribution circuit structure 160, a sidewall of the connecting structure 170, and a sidewall of the redistribution circuit structure 180. In addition, as shown in FIG. 12, for example on the X-Y plane, a projection area of a positioning location the integrated circuit component 200 (e.g. the base tier T0) is greater than a projection area of a positioning location the integrated circuit component 130A (e.g. the first tier T1), and the projection area of the positioning location the integrated circuit component 130A is greater than a projection area of a positioning location the integrated circuit component 130B (e.g. the second tier T2).

However, the disclosure is not limited thereto; alternatively, on the X-Y plane, the projection area of the positioning location the integrated circuit component 200 (e.g. the base tier T0) is greater than the projection area of the positioning location the integrated circuit component 130A (e.g. the first tier T1) and the projection area of the positioning location the integrated circuit component 130B (e.g. the second tier T2), and the projection area of the positioning location the integrated circuit component 130A is substantially equal to the projection area of the positioning location the integrated circuit component 130B. Or, the projection area of the positioning location the integrated circuit component 200 (e.g. the base tier T0) is substantially equal to the projection area of the positioning location the integrated circuit component 130A (e.g. the first tier T1) and the projection area of the positioning location the integrated circuit component 130B (e.g. the second tier T2). On other hand, the sidewall of the integrated circuit component 200 may not aligned with the sidewall of the redistribution circuit structure 160, the sidewall of the connecting structure 170, and the sidewall of the redistribution circuit structure 180, but may be substantially aligned with a sidewall of the integrated circuit component 130A or the sidewalls of the integrated circuit components 130A and 130B.

Figure 14:
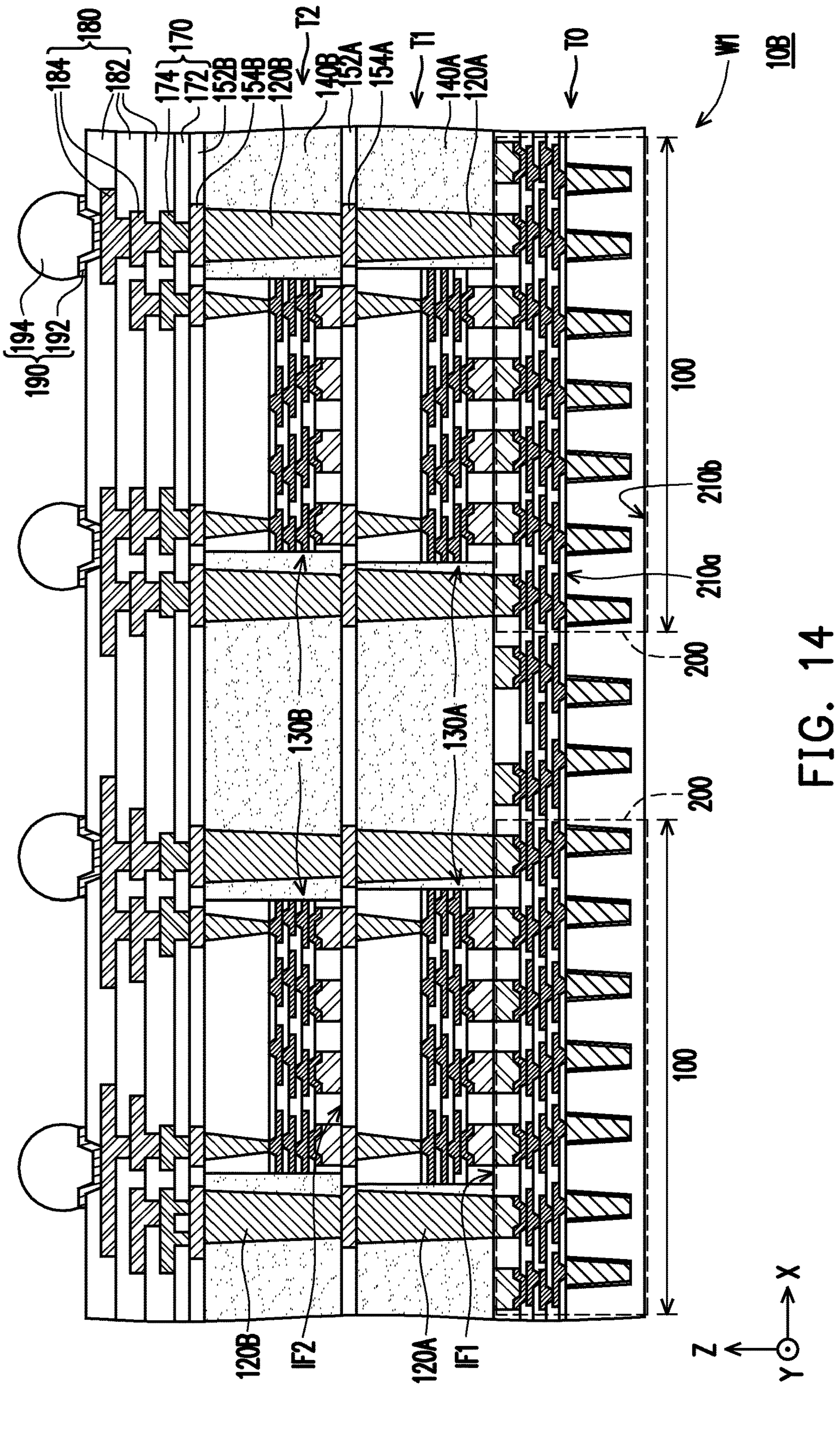
FIG. 14 is a schematic cross-sectional view showing a semiconductor structure in accordance with some embodiments of the disclosure.
Figure 15:
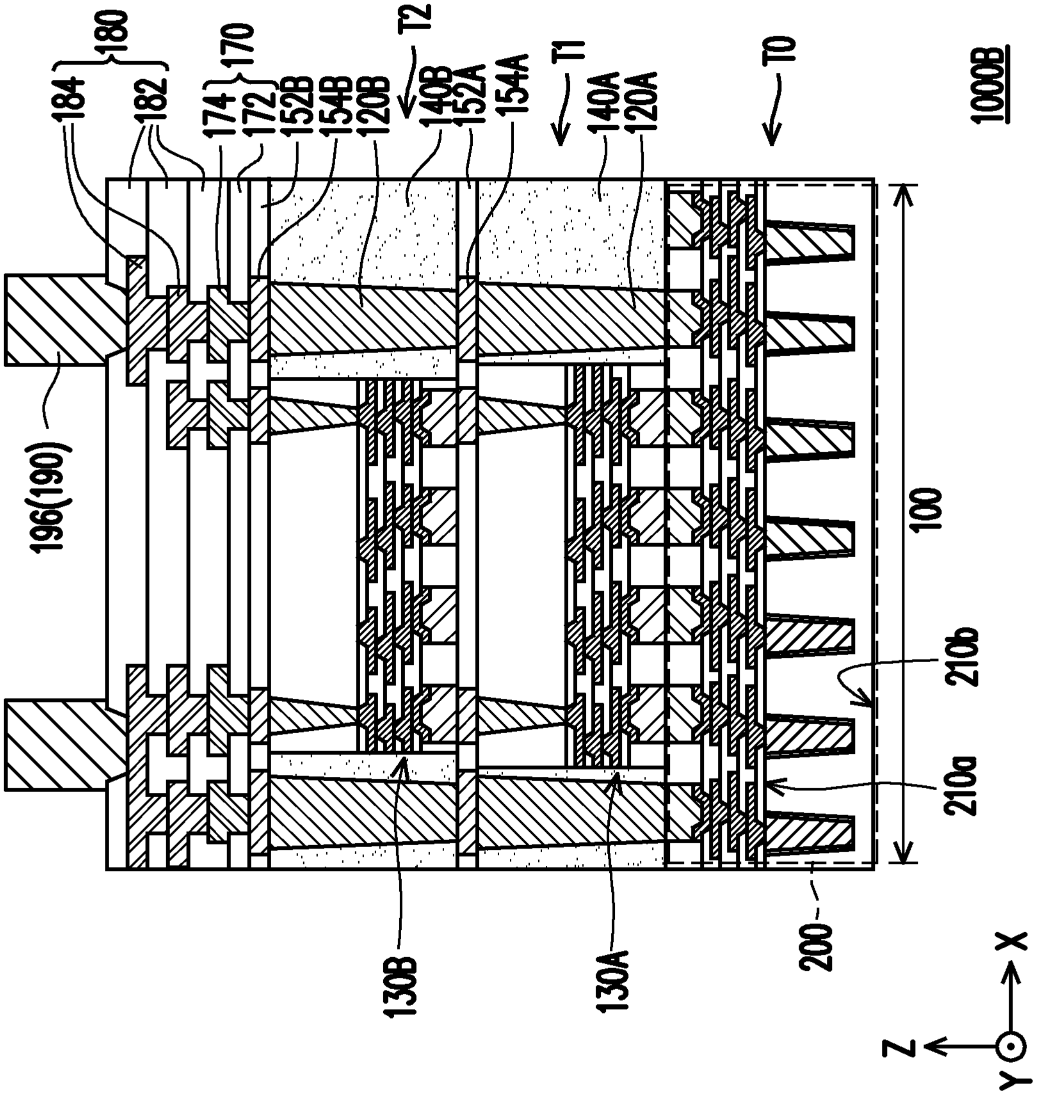
FIG. 15 is a schematic cross-sectional view showing a SoIC in accordance with some embodiments of the disclosure.
Figure 16:
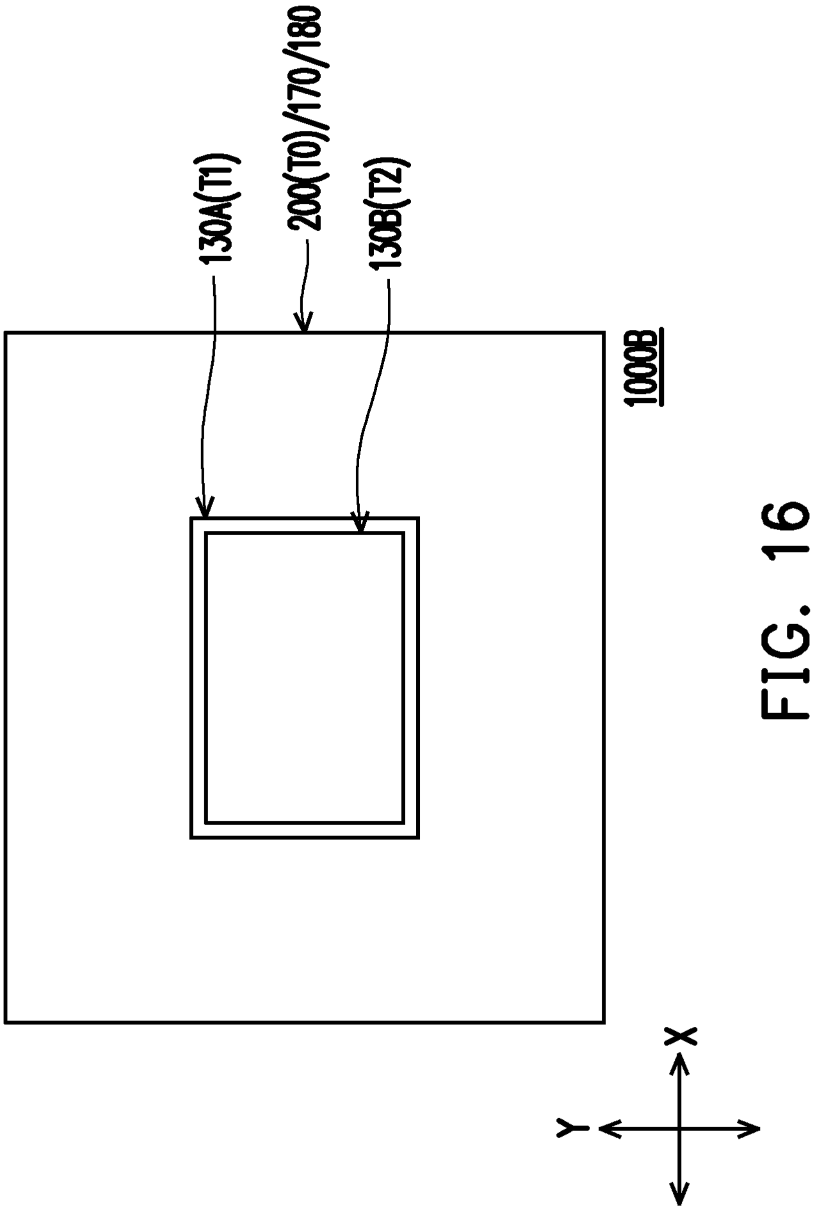
FIG. 16 is a schematic top view of the SoIC depicted in FIG. 15.

FIG. 14 is a schematic cross-sectional view showing a semiconductor structure in accordance with some embodiments of the disclosure. FIG. 15 is a schematic cross-sectional view showing a SoIC in accordance with some embodiments of the disclosure. FIG. 16 is a schematic top view of the SoIC depicted in FIG. 15. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 10 and FIG. 14 together, the semiconductor structure 10A depicted in FIG. 10 and a semiconductor structure 10B depicted in FIG. 14 are similar; the difference is that, the semiconductor structure 10B excludes the presence of a connecting structure 160. In such embodiment of the semiconductor structure 10B, electrical connection among the conductive pillars 120A and the integrated circuit components 130A of the first tier T1 and the conductive pillars 120B and the integrated circuit components 130B of the second tier T2 are achieved via the contact pads 154A located therebetween.

In some embodiments, as shown in FIG. 15, the semiconductor structure 10B depicted in FIG. 14 is diced into individual and separated SoICs 1000B, where each SoIC 1000B is a single die stack of one device region 100 included in the semiconductor structure 10B. In some embodiments, as shown in FIG. 15 and FIG. 16, a sidewall of the integrated circuit component 200 is substantially aligned with a sidewall of the connecting structure 170 and a sidewall of the redistribution circuit structure 180. In addition, as shown in FIG. 15, for example on the X-Y plane, a projection area of a positioning location the integrated circuit component 200 (e.g. the base tier T0) is greater than a projection area of a positioning location the integrated circuit component 130A (e.g. the first tier T1), and the projection area of the positioning location the integrated circuit component 130A is greater than a projection area of a positioning location the integrated circuit component 130B (e.g. the second tier T2). Similar modifications of the sizes of integrated circuit components 200, 130A and 130B discussed in the SoIC 1000A of FIG. 12 and FIG. 13 can also applied on the integrated circuit components 200, 130A and 130B in the SoIC 1000B of FIG. 15 and FIG. 16, and thus are not repeated herein for simplicity. It is appreciated that, for example, the conductive elements 190 may include the conductive terminals 196 instead of the conductive terminals 194 and the UBM patterns 192 underneath, as demonstrated in FIG. 14 and FIG. 15.

Figure 17:
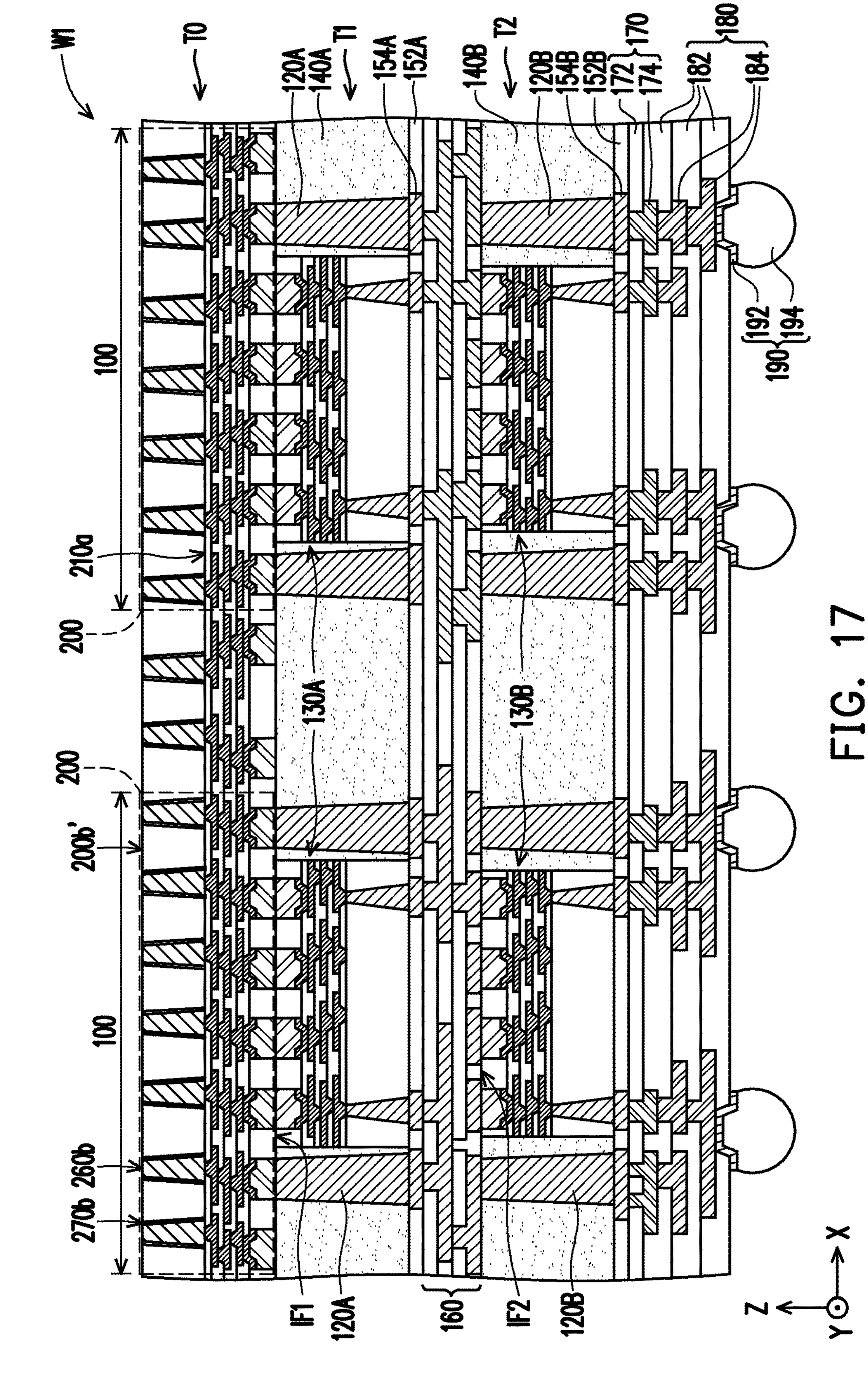
FIG. 17 through FIG. 18 are schematic cross-sectional views showing various stages in a manufacturing method of a semiconductor structure in accordance with some embodiments of the disclosure.
Figure 18:
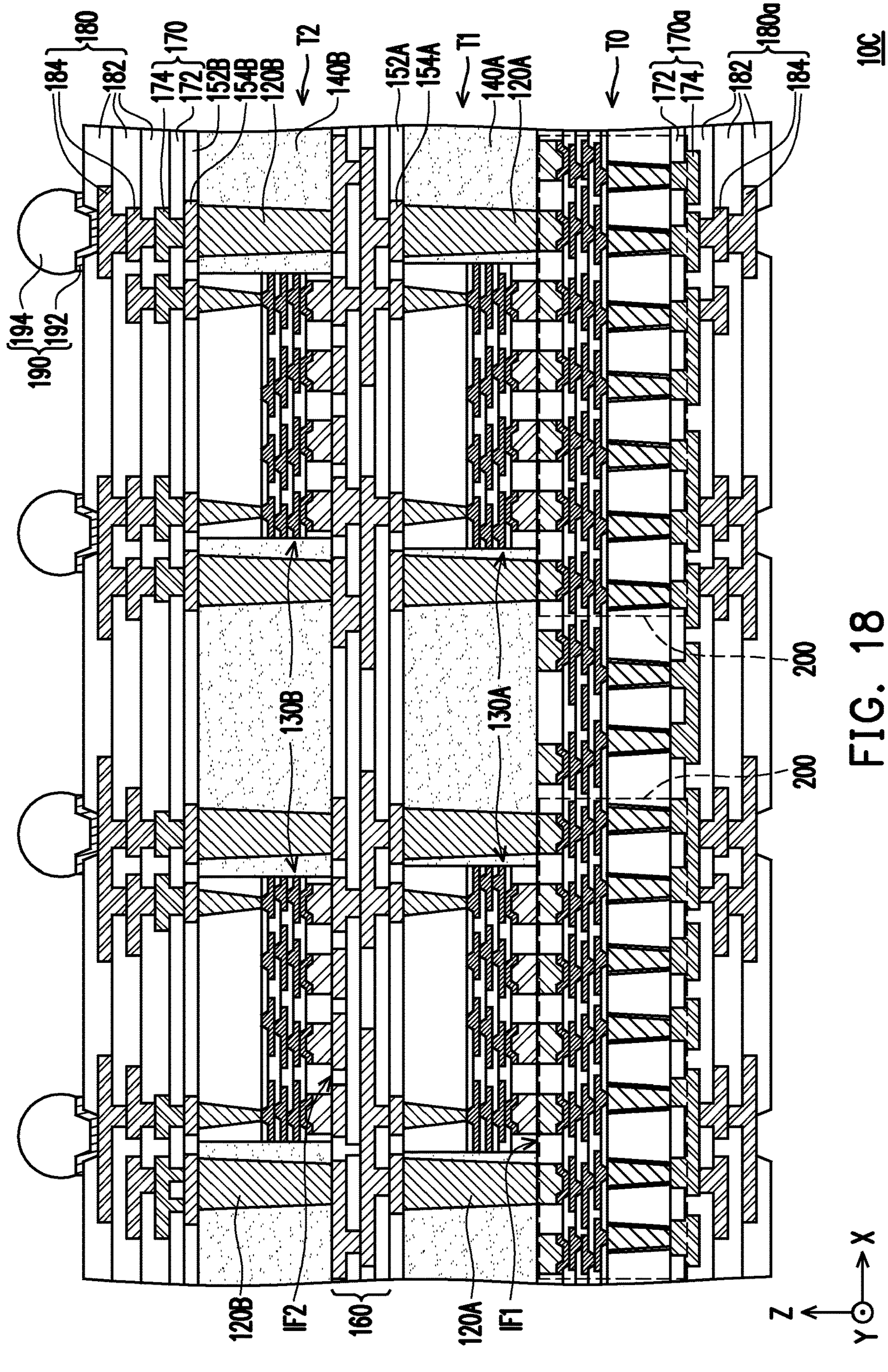
Figure 19:
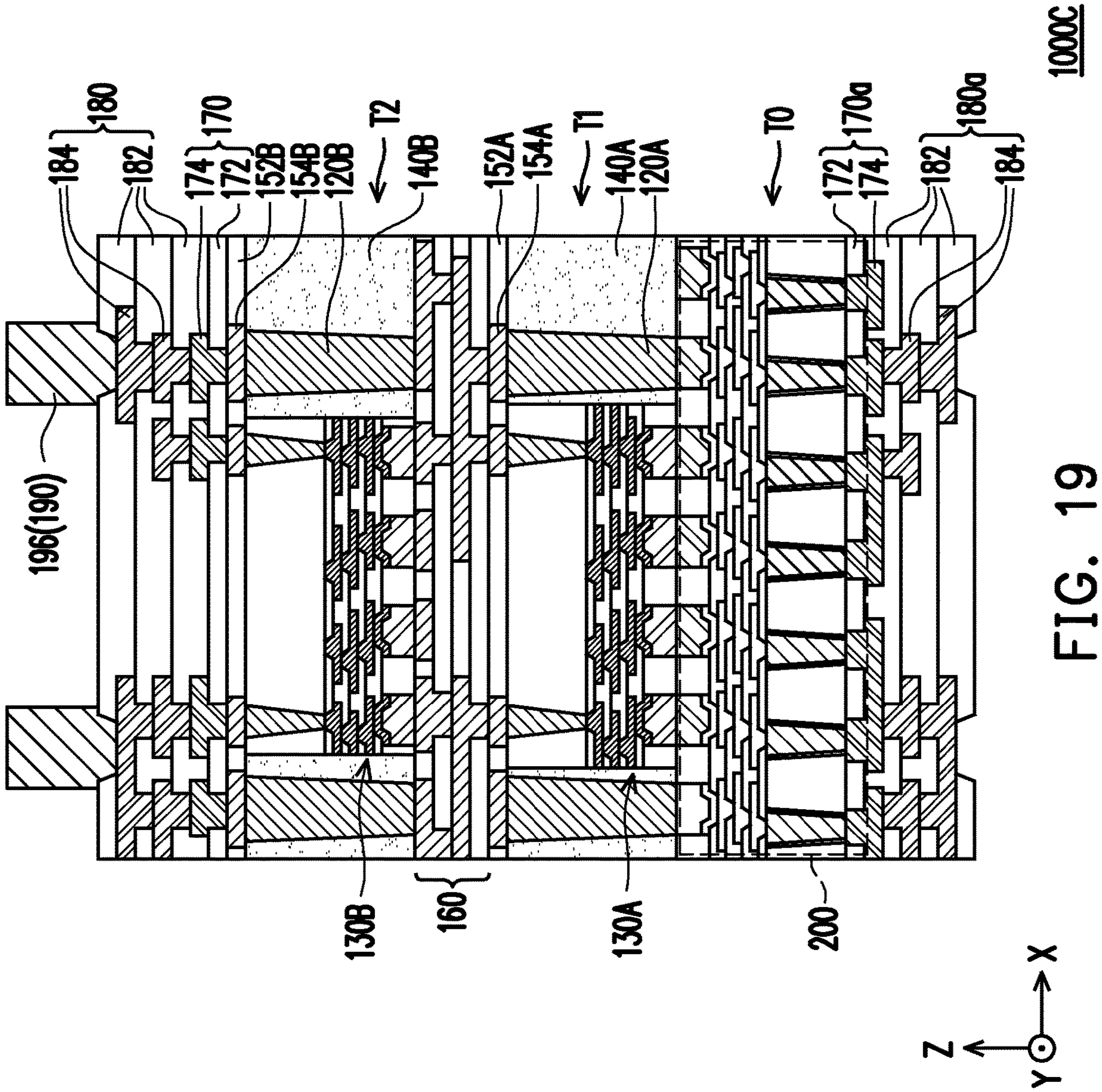
FIG. 19 is a schematic cross-sectional view showing a SoIC in accordance with some embodiments of the disclosure.
Figure 20:
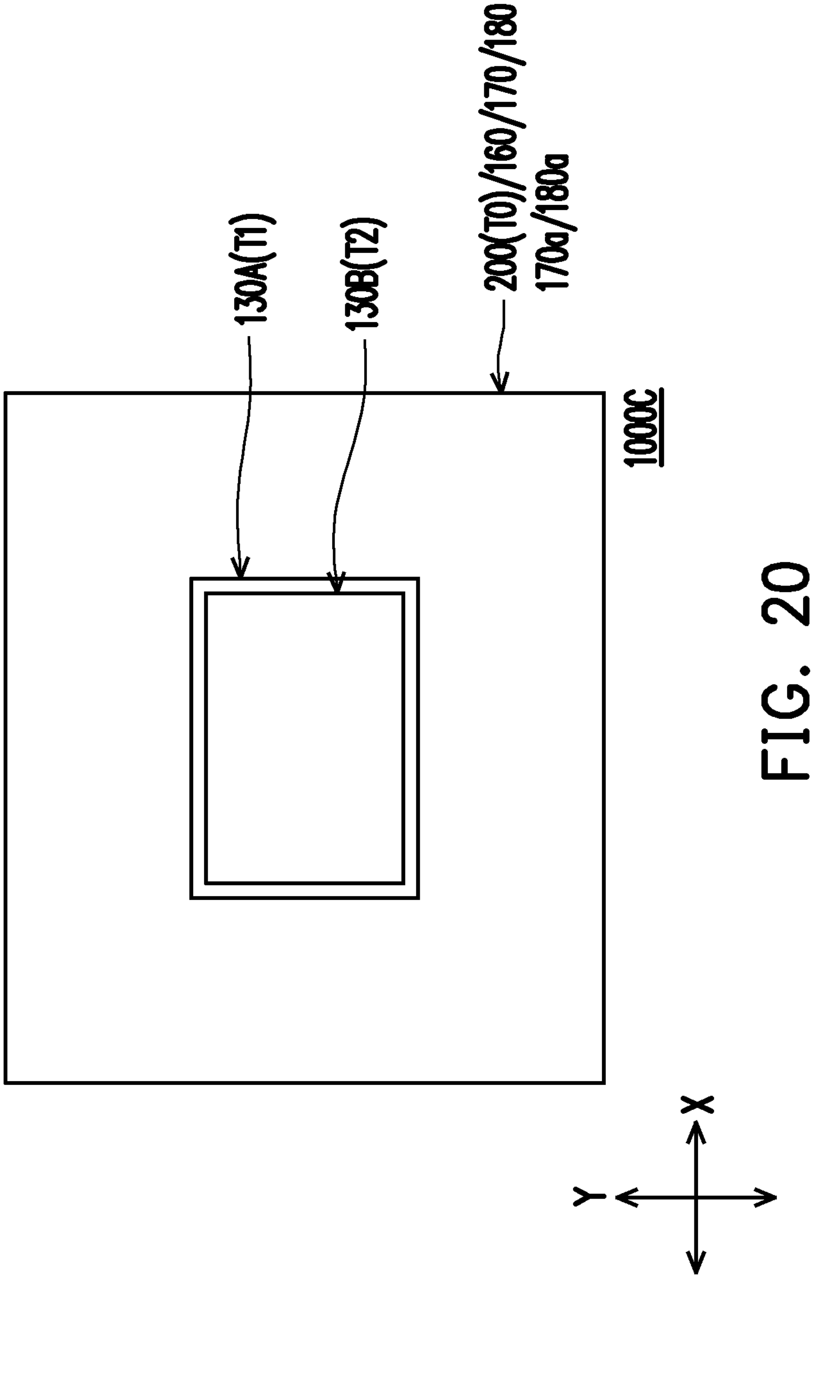
FIG. 20 is a schematic top view of the SoIC depicted in FIG. 19.

FIG. 17 through FIG. 18 are schematic cross-sectional views showing various stages in a manufacturing method of a semiconductor structure in accordance with some embodiments of the disclosure. FIG. 19 is a schematic cross-sectional view showing a SoIC in accordance with some embodiments of the disclosure. FIG. 20 is a schematic top view of the SoIC depicted in FIG. 19. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 17, in some embodiments, the semiconductor structure 10A is flipped (turned upside down), and a planarizing process is performed to expose the conductive pillars 260. In some embodiments, a portion of the semiconductor substrate 210 is removed to obtain a bottom surface 210*b*' exposing the conductive pillars 260. For example, bottom surface 260*b* of the conductive pillars 260 are substantially leveled with the bottom surface 210*b*' of the semiconductor substrate 210. In other words, the bottom surface 260*b* of the conductive pillars 260 are substantially coplanar to the bottom surface 210*b*' of the semiconductor substrate 210. During the planarizing process, the conductive pillars 260 and the liners 270 may also be partially removed. In some embodiments, the planarizing process may include a grinding process or a CMP process. After the planarizing process, a cleaning process may be optionally performed, for example to clean and remove the residue generated from the planarizing process. However, the disclosure is not limited thereto, and the planarizing process may be performed through any other suitable method. In some embodiments, the liners 270 surrounding the conductive pillars 260 are also exposed by the bottom surface 210*b*', as shown in FIG. 17.

Referring to FIG. 18, in some embodiments, an additional connecting structure 170*a* and an additional redistribution circuit structure 180*a* are sequentially formed over the bottom surface 210*b*' of the semiconductor substrate 210 to form a semiconductor structure 10C. The formation and material of the additional connecting structure 170*a* are similar to or the same as the formation and material of the connecting structure 170 as described in FIG. 8, the formation and material of the additional redistribution circuit structure 180*a* are similar to or the same as the formation and material of the redistribution circuit structure 180 as described in FIG. 9, and thus are not repeated for brevity. The additional redistribution circuit structure 180*a* may be also referred to as a redistribution layer of the die stack in each device region 100. Up to here, the semiconductor structure 10C is manufactured, and is considered as a wafer package structure having dual-side terminals.

In some embodiments, the devices formed in the semiconductor substrates 210 of the integrated circuit components 200 are electrically connected to the additional connecting structure 170*a* through the conductive pillars 260, and are electrically connected to the additional redistribution circuit structure 180*a* through the conductive pillars 260 and the additional connecting structure 170*a*. For example, the conductive pillars 120A and the integrated circuit components 130A in the first tier T1 are electrically connected to the additional redistribution circuit structure 180*a* through the conductive pillars 260 of the integrated circuit components 200 in the base tier T0 and the additional connecting structure 170*a*, while the conductive pillars 120B and the integrated circuit components 130B in the second tier T2 are electrically connected to the additional redistribution circuit structure 180*a* through the redistribution circuit structure 160, the contact pads 154A, the conductive pillars 120A and/or the integrated circuit components 130A in the first tier T1, the integrated circuit components 200 in the base tier T0 and the additional connecting structure 170*a*. Similarly, the conductive elements 190, the redistribution circuit structure 180 and the connecting structure 170 may electrically connected to the additional connecting structure 170*a* and the additional redistribution circuit structure 180*a* through at least the first tier T1, the second tier T2, the base tier T0, and the contact pads 154A, 154B with or without the redistribution circuit structure 160.

In some embodiments, the semiconductor structure 10C depicted in FIG. 18 is diced into individual and separated SoICs 1000C. As shown in FIG. 19, for example, each SoIC 1000C is a single die stack of one device region 100 included in the semiconductor structure 10C depicted in FIG. 18. In some embodiments, as shown in FIG. 19 and FIG. 20, a sidewall of the integrated circuit component 200 is substantially aligned with a sidewall of the redistribution circuit structure 160, a sidewall of the connecting structure 170, a sidewall of the redistribution circuit structure 180, a sidewall of the additional connecting structure 170*a* and a sidewall of the additional redistribution circuit structure 180*a*. Similarly, the modifications of the conductive elements 190 and the modifications of the sizes of integrated circuit components 200, 130A and 130B discussed in the SoIC 1000A of FIG. 12 and FIG. 13 can also applied on the integrated circuit components 200, 130A and 130B in the SoIC 1000C of FIG. 19 and FIG. 20, and thus are not repeated herein for simplicity.

Figure 21:
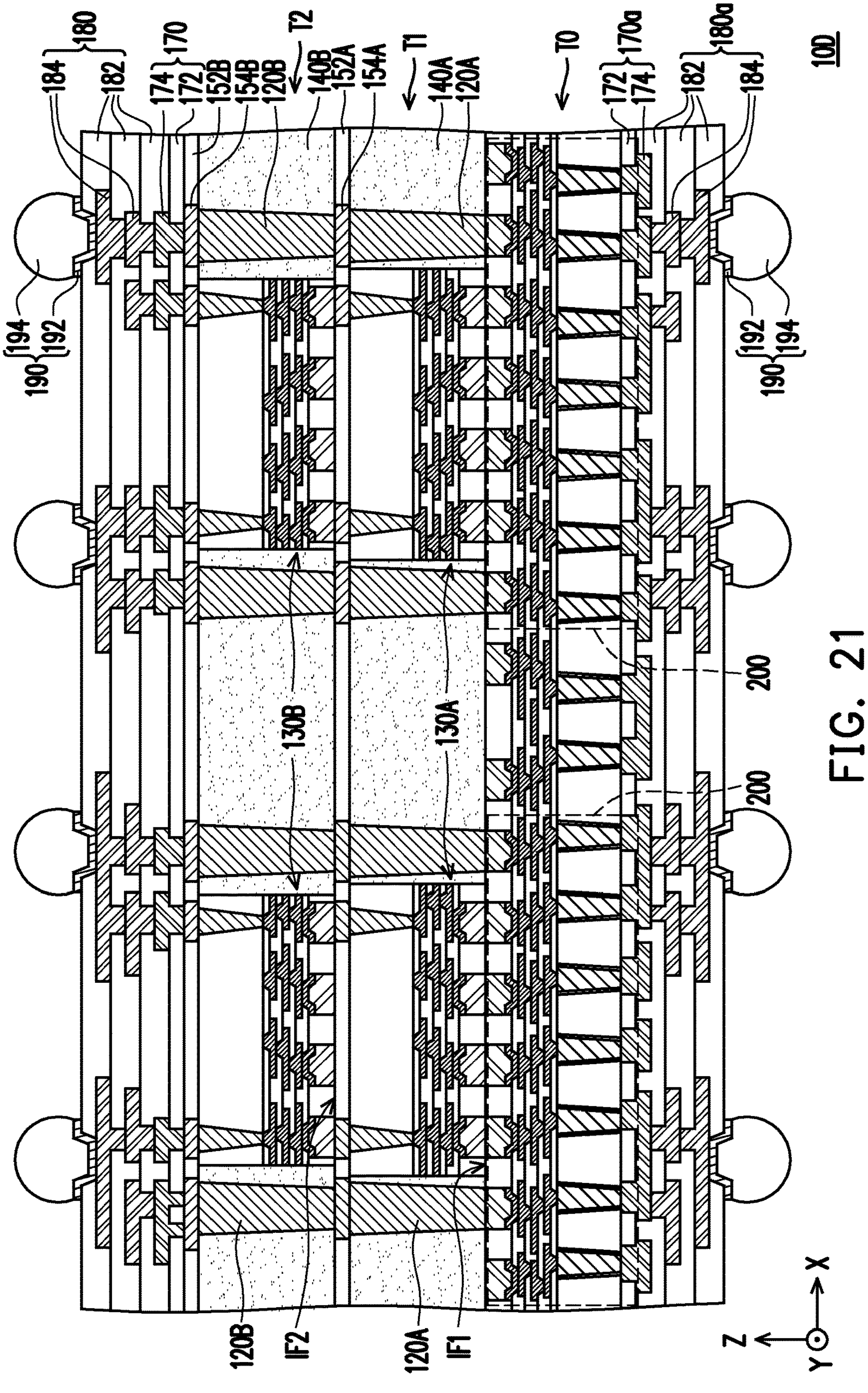
FIG. 21 is a schematic cross-sectional view showing a semiconductor structure in accordance with some embodiments of the disclosure.
Figure 22:
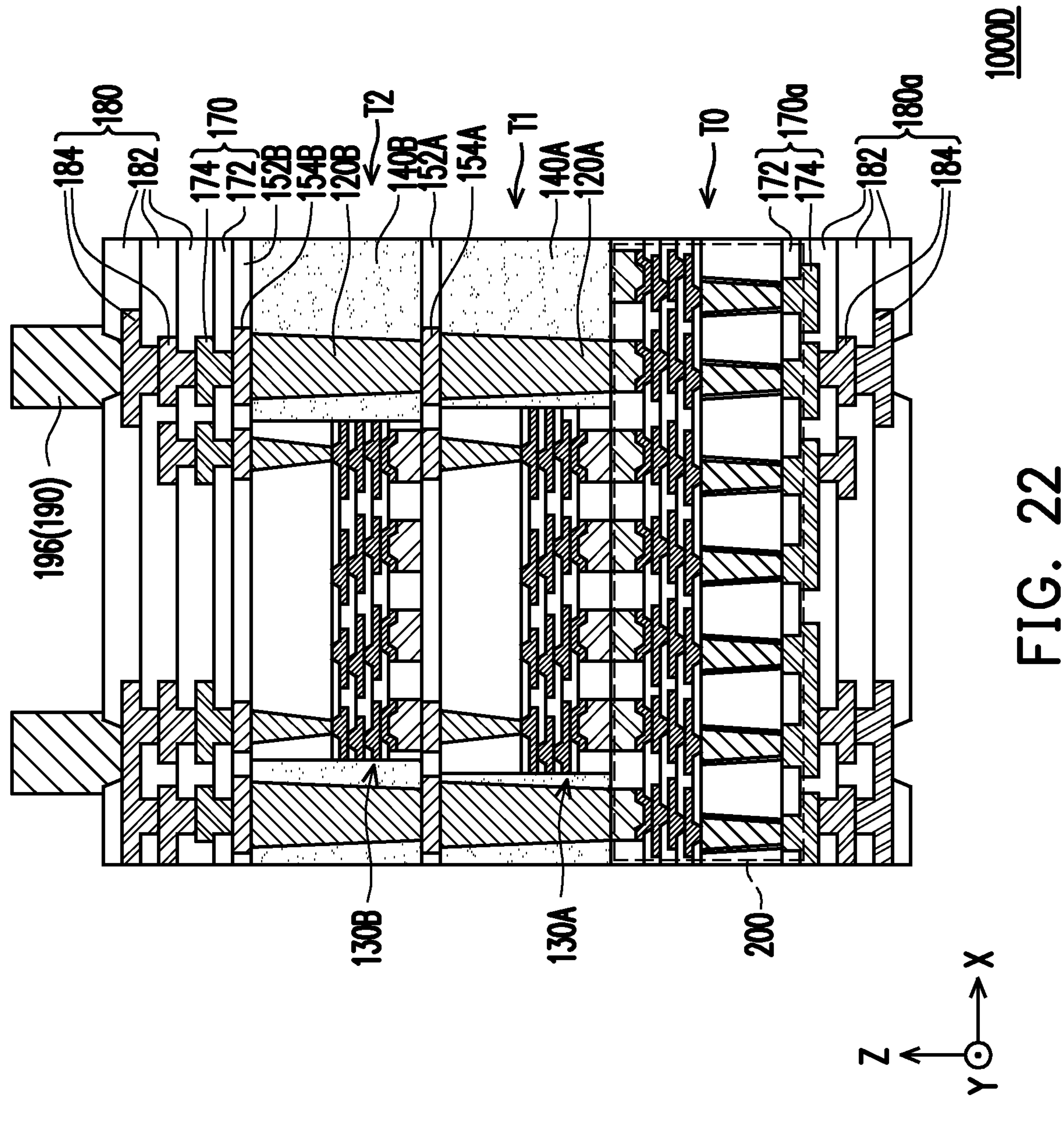
FIG. 22 is a schematic cross-sectional view showing a SoIC in accordance with some embodiments of the disclosure.
Figure 23:
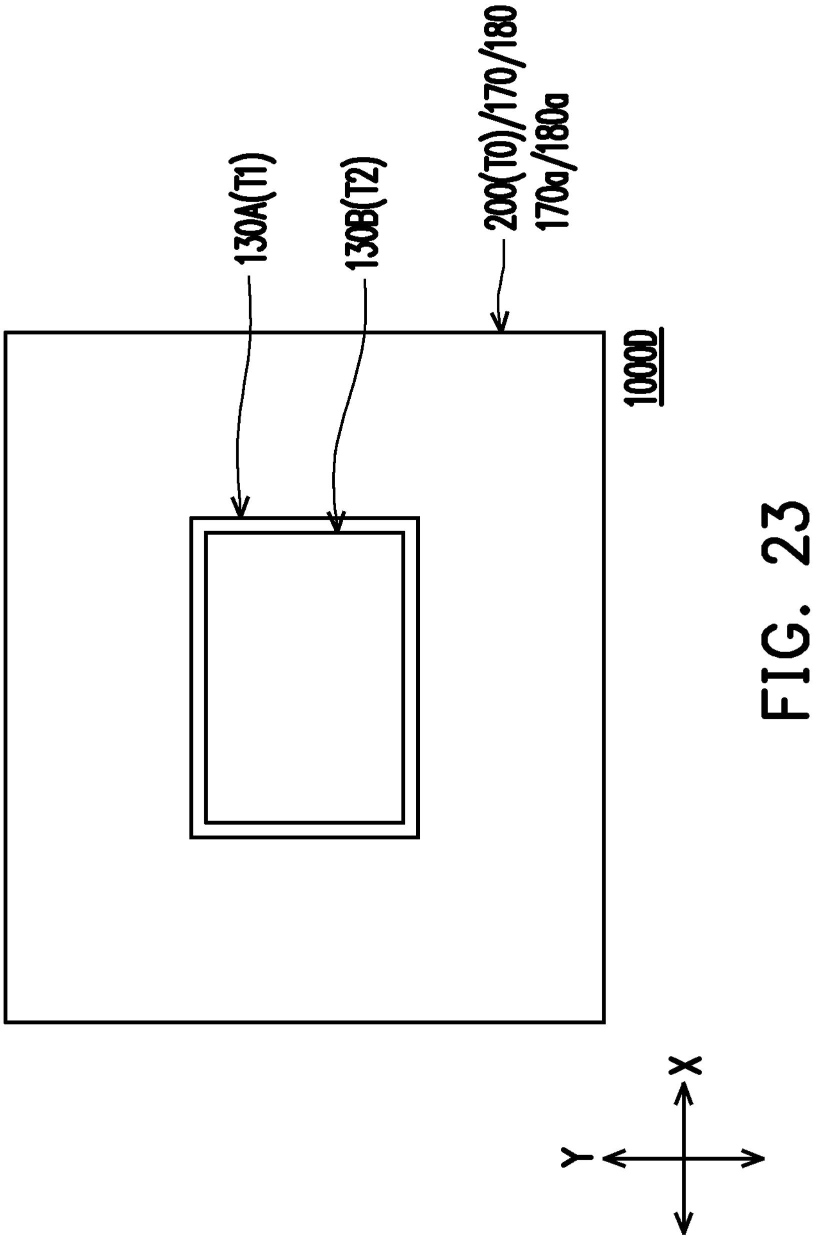
FIG. 23 is a schematic top view of the SoIC depicted in FIG. 22.

FIG. 21 is a schematic cross-sectional view showing a semiconductor structure in accordance with some embodiments of the disclosure. FIG. 22 is a schematic cross-sectional view showing a SoIC in accordance with some embodiments of the disclosure. FIG. 23 is a schematic top view of the SoIC depicted in FIG. 22. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. Referring to FIG. 18 and FIG. 21 together, the semiconductor structure 10C depicted in FIG. 18 and a semiconductor structure 10D depicted in FIG. 21 are similar; the difference is that, the semiconductor structure 10D excludes the presence of a connecting structure 160. In such embodiment of the semiconductor structure 10D, electrical connection among the conductive pillars 120A and the integrated circuit components 130A of the first tier T1 and the conductive pillars 120B and the integrated circuit components 130B of the second tier T2 are achieved via the contact pads 154A located therebetween.

In some embodiments, as shown in FIG. 22, the semiconductor structure 10D depicted in FIG. 21 is diced into individual and separated SoICs 1000D, where each SoIC 1000D is a single die stack of one device region 100 included in the semiconductor structure 10D. In some embodiments, as shown in FIG. 22 and FIG. 23, a sidewall of the integrated circuit component 200 is substantially aligned with a sidewall of the redistribution circuit structure 160, a sidewall of the connecting structure 170, a sidewall of the redistribution circuit structure 180, a sidewall of the additional connecting structure 170*a* and a sidewall of the additional redistribution circuit structure 180*a*. In addition, as shown in FIG. 23, for example on the X-Y plane, a projection area of a positioning location the integrated circuit component 200 (e.g. the base tier T0) is greater than a projection area of a positioning location the integrated circuit component 130A (e.g. the first tier T1), and the projection area of the positioning location the integrated circuit component 130A is greater than a projection area of a positioning location the integrated circuit component 130B (e.g. the second tier T2). Similarly, the modifications of the conductive elements 190 and the modifications of the sizes of integrated circuit components 200, 130A and 130B discussed in the SoIC 1000A of FIG. 12 and FIG. 13 can also applied on the integrated circuit components 200, 130A and 130B in the SoIC 1000D of FIG. 22 and FIG. 23, and thus are not repeated herein for simplicity.

It is appreciated that the number of the integrated circuit components in each inner tier (e.g. T1 or T2) and in a base tier (e.g., T0) of one die stack in a semiconductor structure may be one or more than one. On the other hand, the sizes of the integrated circuit components in each inner tier (e.g. T1 or T2) and in the base tier (e.g., T0) of one die stack in a semiconductor structure may be the same, in part or all. The disclosure is not limited thereto. Furthermore, the integrated circuit components of one inner tier (e.g. T1 or T2) may be overlapped with the integrated circuit components of the base tier (e.g., T0), with or without overlapped with the integrated circuit components of an adjacent inner tier underlying or overlying thereto. In addition, it is also appreciated that the conductive pillars 120A or 120B presented in the die stack of one device region 100 may be omitted, and a vertical electrical connection between two adjacent tiers are achieved by the conductive pillars 136, alternatively. The disclosure is not limited thereto.

FIG. 24 through FIG. 28 are schematic top views respectively a relative position of integrated circuit components of tiers in a semiconductor structure according to some embodiments of the disclosure. FIG. 29 is a schematic cross-sectional view showing a semiconductor structure in accordance with some embodiments of the disclosure, where FIG. 29 is the cross-sectional view taken along a line AA' depicted in FIG. 24. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 24:
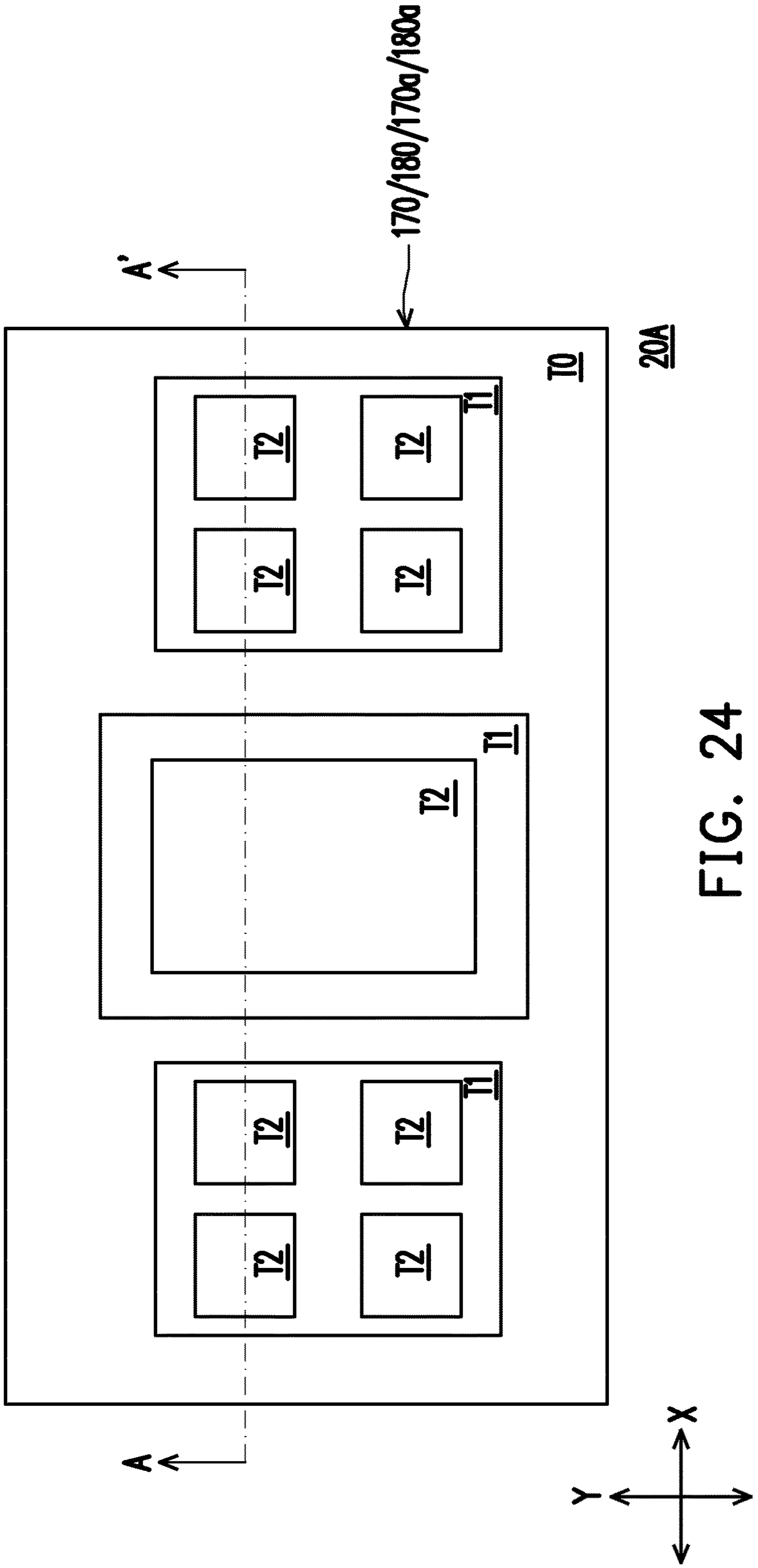
FIG. 24 through FIG. 28 are schematic top views respectively illustrating a relative position of integrated circuit components of tiers in a semiconductor structure according to some embodiments of the disclosure.

As illustrated in FIG. 24 and FIG. 29, in some embodiments, within one device region 100 of a semiconductor structure 20A, a die stack (e.g., one SoIC) includes a base tier T0 including at least one integrated circuit component 200, a first tier T1 including at least one integrated circuit component 130A, a second tier T2 including at least one integrated circuit component 130B, a connecting structure 170, an additional connecting structure 170*a*, a redistribution circuit structure 180, an additional redistribution circuit structure 180*a*, and conductive elements 190. In some embodiments, the first tier T1 is located between and electrically connected to the base tier T0 and the second tier T2, the connecting structure 170 and the redistribution circuit structure 180 are orderly located on and electrically connected to the second tier T2, the additional connecting structure 170*a* and the additional redistribution circuit structure 180*a* are orderly located on and electrically connected to the base tier T0, and the conductive elements 190 are located on and electrically connected to the additional redistribution circuit structure 180*a*. For example, the connecting structure 170 is located between the second tier T2 and the redistribution circuit structure 180, the additional connecting structure 170*a* is located between the base tier T0 and the additional redistribution circuit structure 180*a*, and the additional redistribution circuit structure 180*a* is located between the conductive elements 190 and the additional connecting structure 170*a*. The details of each of the integrated circuit component 200, the integrated circuit components 130A, the integrated circuit components 130B, the connecting structure 170, the additional connecting structure 170*a*, the redistribution circuit structure 180, the additional redistribution circuit structure 180*a*, and the conductive elements 190 are previously described in FIG. 1 through FIG. 10 and FIG. 17 through FIG. 18, and thus are omitted herein for brevity. As shown in FIG. 29, a sidewall of the integrated circuit component 200 (e.g., the base tier T0) is substantially aligned with sidewalls of the connecting structure 170, the additional connecting structures 170*a*, sidewalls of the redistribution circuit structure 180, the additional redistribution circuit structure 180*a*.

For example, one integrated circuit component 200, three integrated circuit components 130A and nine integrated circuit components 130B respectively included in the base tier T0, the first tier T1 and the second tier T2 are presented in the semiconductor structure 20A of FIG. 24 for illustrative purposes, where the number of the integrated circuit component 200 in the die stack of each device region 100, the number of the integrated circuit components 130A located on one integrated circuit component 200, and the number of the integrated circuit components 130B located on one integrated circuit component 130A are not limited to the disclosure. As shown in FIG. 24, in some embodiments, sizes of two of the integrated circuit components 130A are the same, but are different from a size of other one of the integrated circuit components 130A. In some embodiments, sizes of eight of the integrated circuit components 130B are the same, but are different from a size of other one of the integrated circuit components 130B. In some embodiments, none of the sizes of the integrated circuit components 130B are the same as the sizes of the integrated circuit components 130A, and none of the sizes of the integrated circuit components 130A are the same as a size of the integrated circuit component 200. For example, as shown in FIG. 24, the integrated circuit components 200, 130A and 130B respectively include a N-node logic die, (N-1)-node logic dies and (N-2)-node logic dies.

Figure 25:
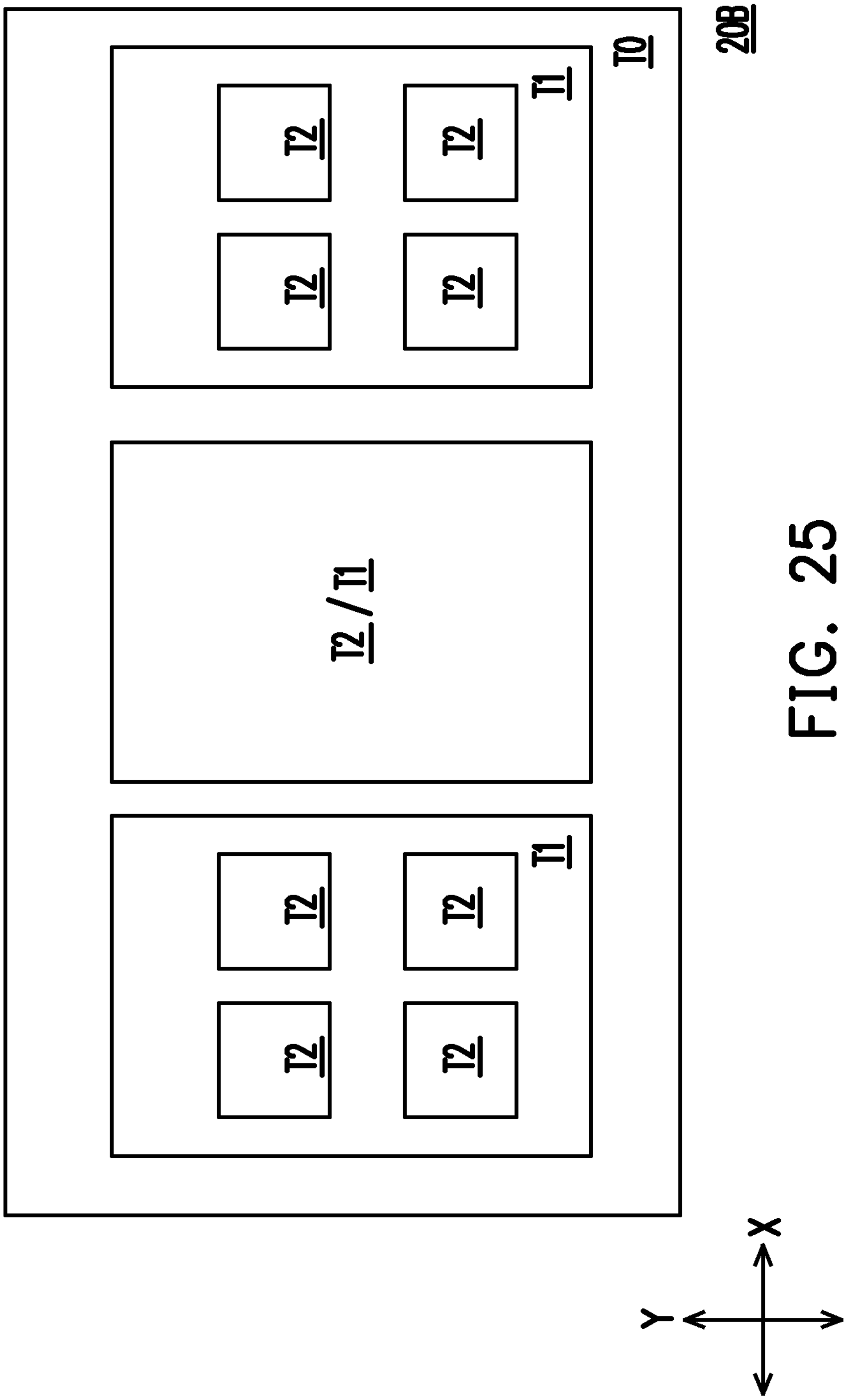

The disclosure is not limited thereto. In some embodiments, for a semiconductor structure 20B of FIG. 25, sizes of two of the integrated circuit components 130A are the same, but are different from a size of other one of the integrated circuit components 130A. In some embodiments, sizes of eight of the integrated circuit components 130B are the same, but are different from a size of other one of the integrated circuit components 130B. In some embodiments, the size of one of the integrated circuit components 130B is the same as the size of an underlying one of the integrated circuit components 130A, and none of the sizes of the integrated circuit components 130A, 130B are the same as a size of the integrated circuit component 200. For example, as shown in FIG. 25, the integrated circuit component 200 includes a logic die, the integrated circuit components 130A independently include a logic die or a memory, and the integrated circuit components 130B include a memory.

Figure 26:
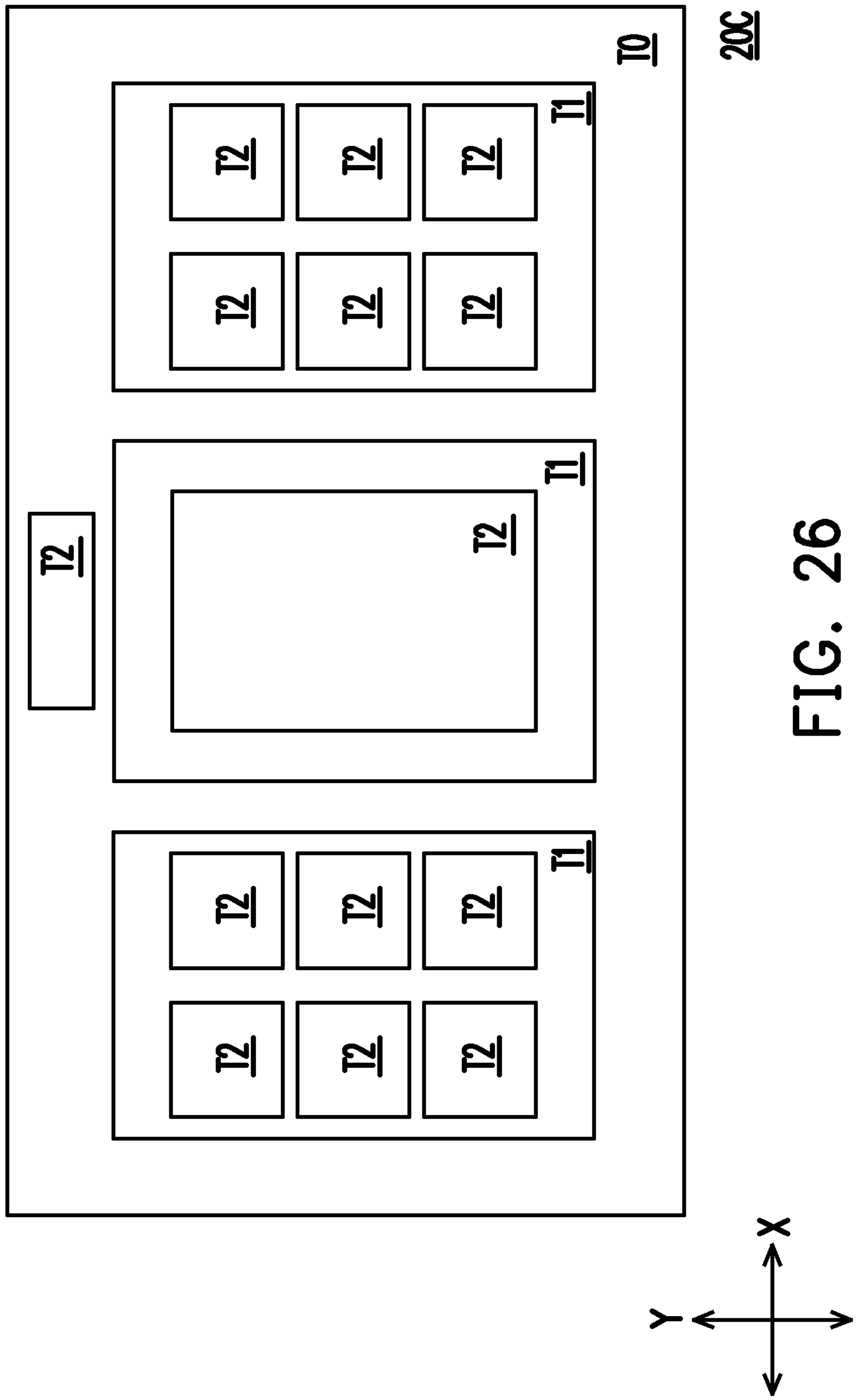
Figure 27:
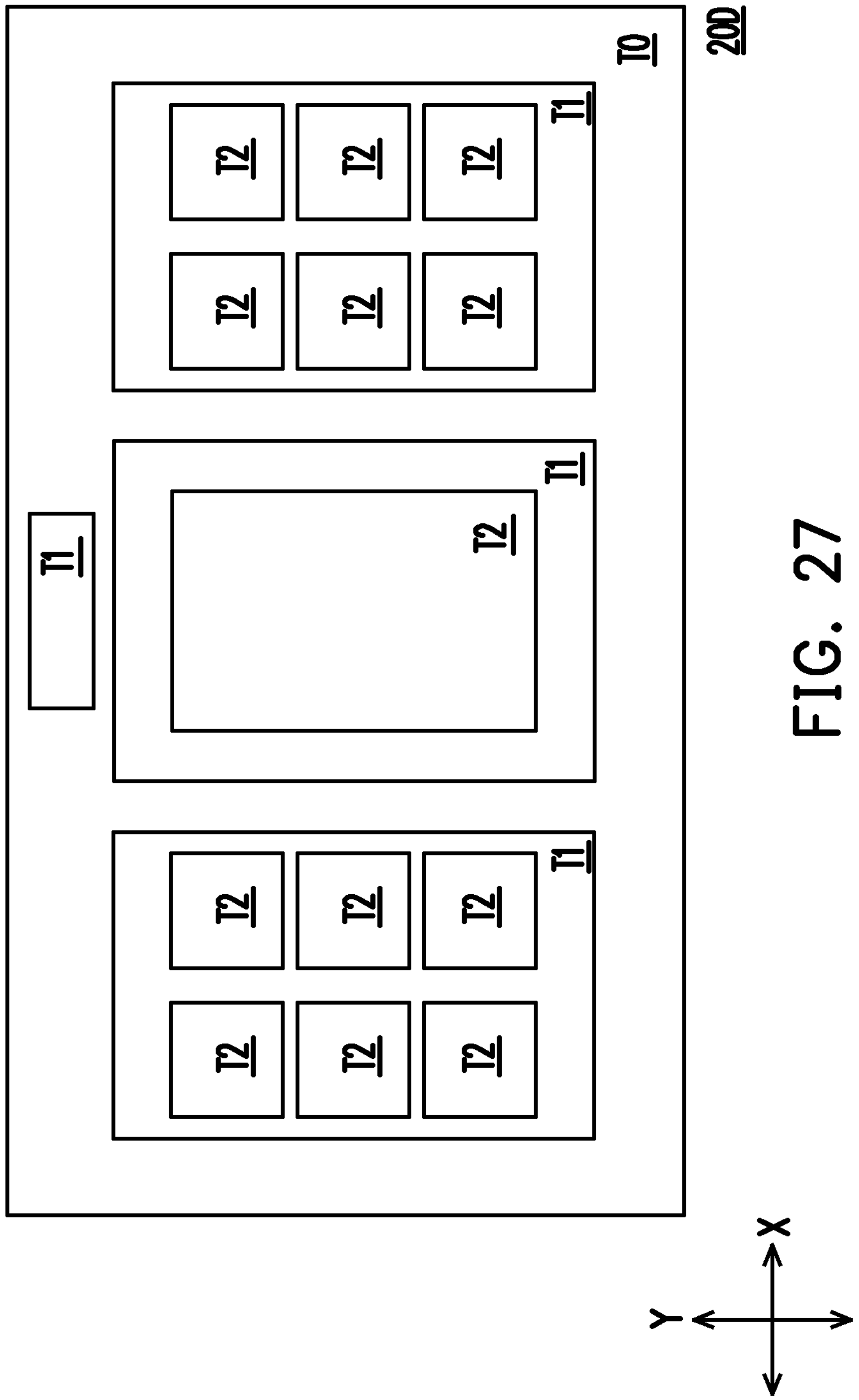

In other examples, one integrated circuit component 200, three integrated circuit components 130A and fourteen integrated circuit components 130B respectively included in the base tier T0, the first tier T1 and the second tier T2 are presented in a the semiconductor structure 20C of FIG. 26 and in a the semiconductor structure 20D of FIG. 27 for illustrative purposes, where the number of the integrated circuit component 200 in the die stack of each device region 100, the number of the integrated circuit components 130A located on one integrated circuit component 200, and the number of the integrated circuit components 130B located on one integrated circuit component 130A are not limited to the disclosure. As shown in FIG. 26 and FIG. 27, in some embodiments, sizes of all of the integrated circuit components 130A are the same, and the integrated circuit components 130B are grouped in three group by different sizes, where none of the sizes of the integrated circuit components 130B are the same as the sizes of the integrated circuit components 130A, and none of the sizes of the integrated circuit components 130A are the same as a size of the integrated circuit component 200. In the embodiments of the semiconductor structure 20C as shown in FIG. 26, at least one of the integrated circuit components 130B in the second tier T2 is only overlapped with the integrated circuit component 200 in the base tier T0 and is located aside of (e.g. not overlapped with) the integrated circuit components 130A in the first tier T1. However, the disclosure is not limited thereto. For example, as shown in FIG. 26, the integrated circuit component 200 includes a logic die such as GPU or an application-specific die such as FPGA or a local silicon interconnect die with multiple features such as IPD, DTC, VR, network circuit interfaces, the integrated circuit components 130A independently include a memory such as SRAM, and the integrated circuit components 130B include an input/output (I/O) interface die, a logic die such as CPU core, and a AI engine such as an AI accelerator.

In alternative embodiments of the semiconductor structure 20D as shown in FIG. 27, at least one of the integrated circuit components 130A in the first tier T1 is only overlapped with the integrated circuit component 200 in the base tier T0 and is located aside of (e.g. not overlapped with) the integrated circuit components 130B in the second tier T2. For example, as shown in FIG. 27, the integrated circuit component 200 includes a logic die such as GPU or an application-specific die such as FPGA, or a local silicon interconnect die with multiple features such as IPD, DTC, VR, network circuit interfaces, the integrated circuit components 130A include an input/output (I/O) interface die, a logic die such as CPU core, and a AI engine such as an AI accelerator, and the integrated circuit components 130B independently include a memory such as SRAM.

Figure 28:
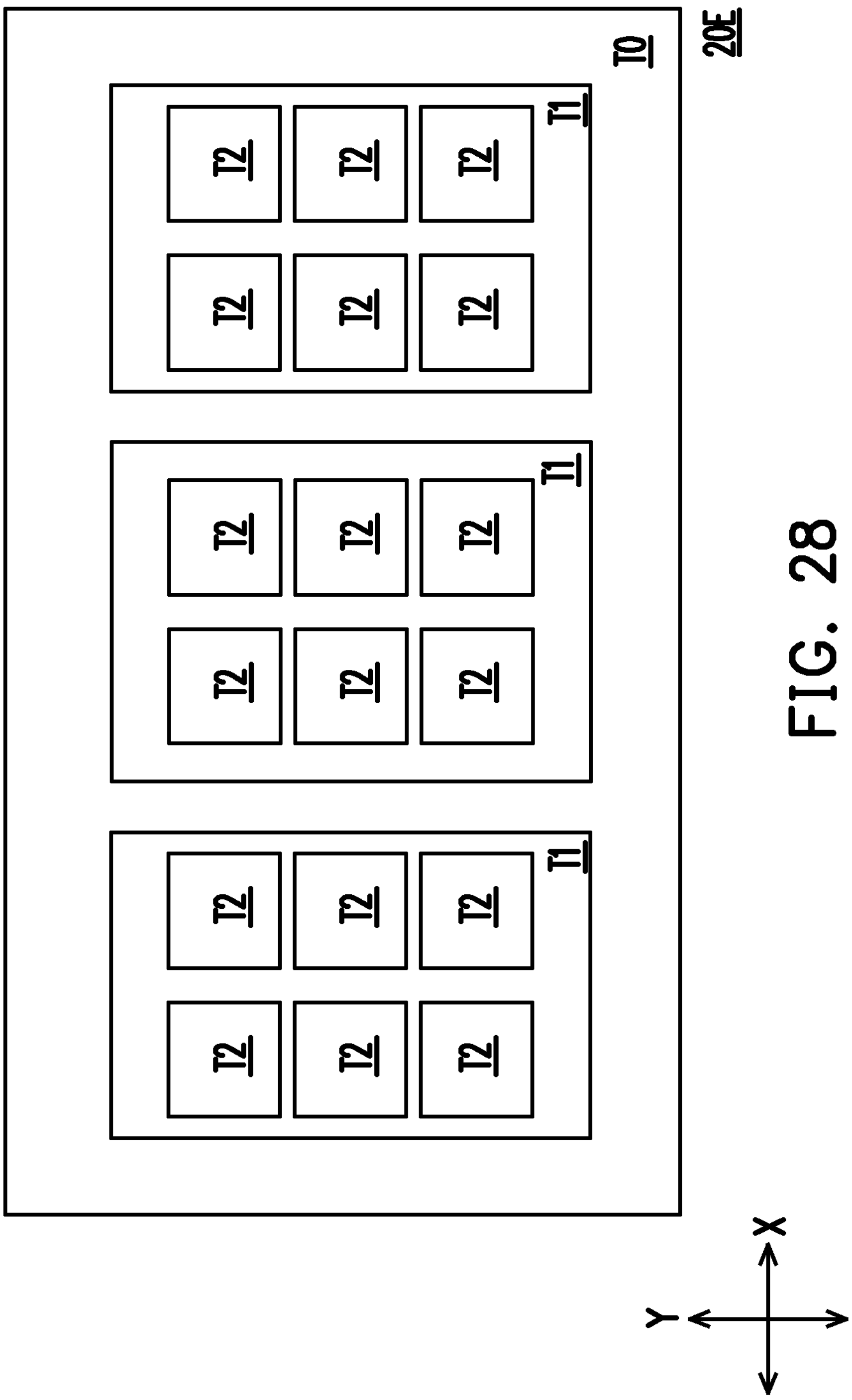
Figure 29:
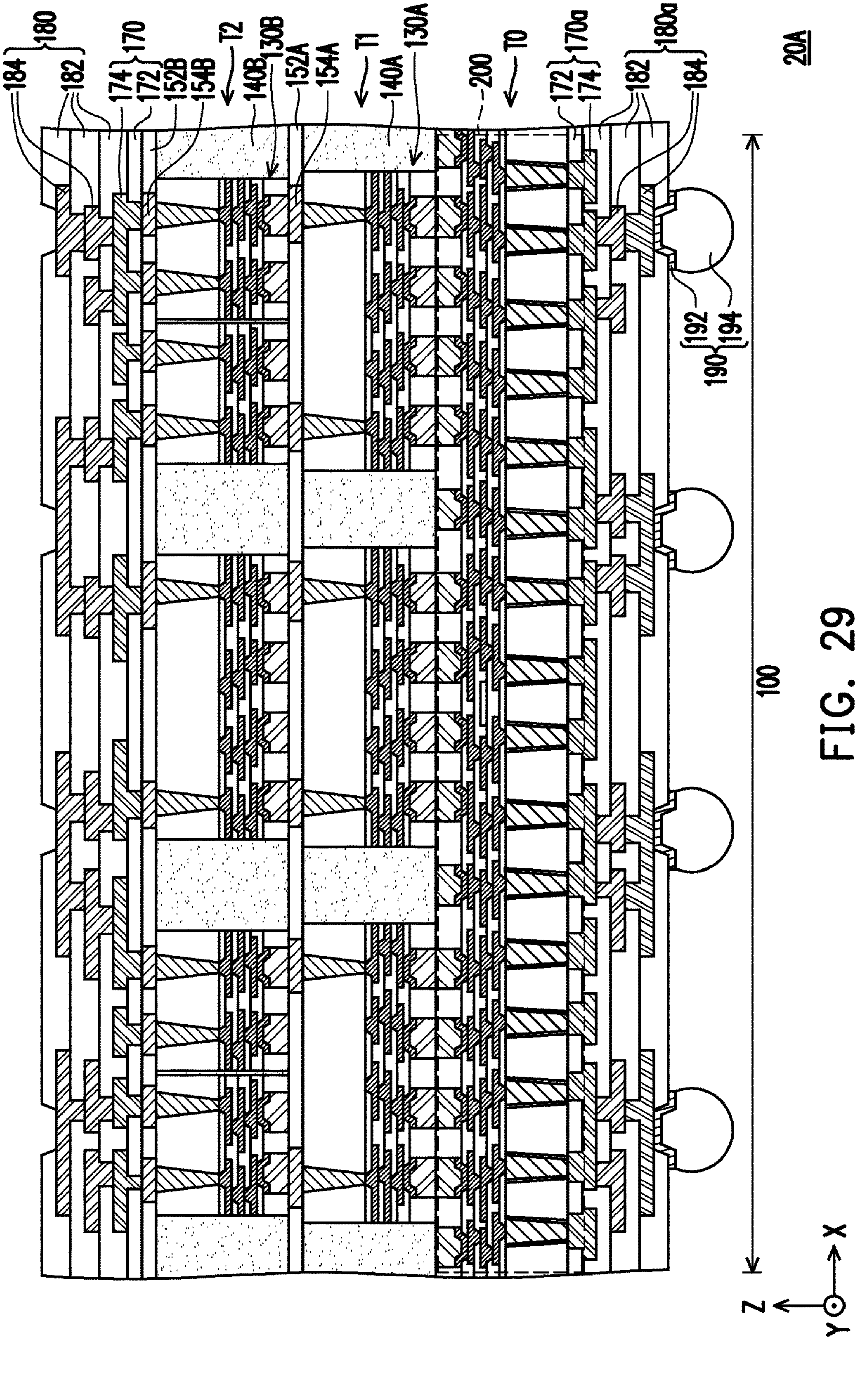
FIG. 29 is a schematic cross-sectional view showing a semiconductor structure in accordance with some embodiments of the disclosure.

In an alternative example, one integrated circuit component 200, three integrated circuit components 130A and twelve integrated circuit components 130B respectively included in the base tier T0, the first tier T1 and the second tier T2 are presented in a semiconductor structure 20E of FIG. 28 for illustrative purposes, where the number of the integrated circuit component 200 in the die stack of each device region 100, the number of the integrated circuit components 130A located on one integrated circuit component 200, and the number of the integrated circuit components 130B located on one integrated circuit component 130A are not limited to the disclosure. As shown in FIG. 28, in some embodiments, sizes of all of the integrated circuit components 130A are the same, and sizes of all of the integrated circuit components 130B are the same, where none of the sizes of the integrated circuit components 130B are the same as the sizes of the integrated circuit components 130A, and none of the sizes of the integrated circuit components 130A are the same as a size of the integrated circuit component 200. For example, as shown in FIG. 28, the integrated circuit component 200 includes a logic die, the integrated circuit components 130A independently include a logic die or a memory, and the integrated circuit components 130B include a memory.

It is appreciated that for one die stack in a semiconductor structure, a base tier may be omitted, and the number of inner tiers may be two or more than two. The disclosure is not limited thereto.

Figure 30:
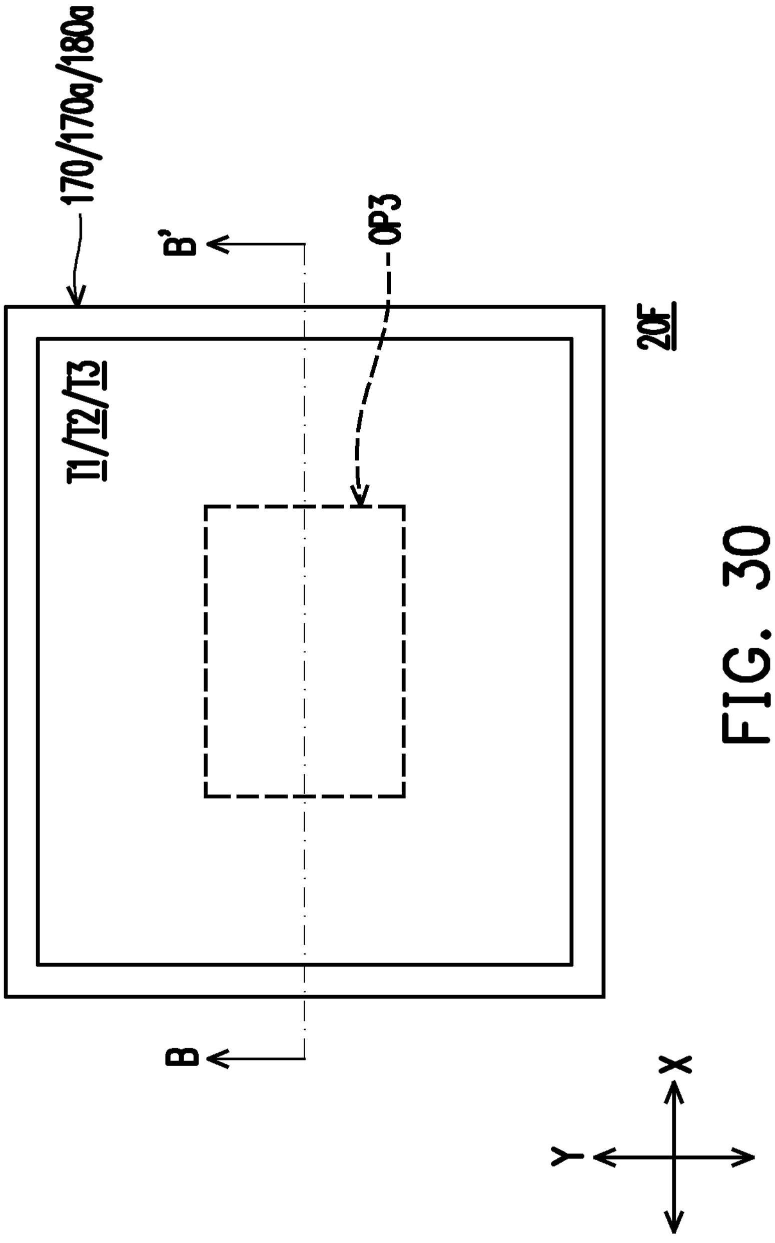
FIG. 30 is a schematic top view illustrating a relative position of integrated circuit components of tiers in a semiconductor structure in accordance with some embodiments of the disclosure.
Figure 31:
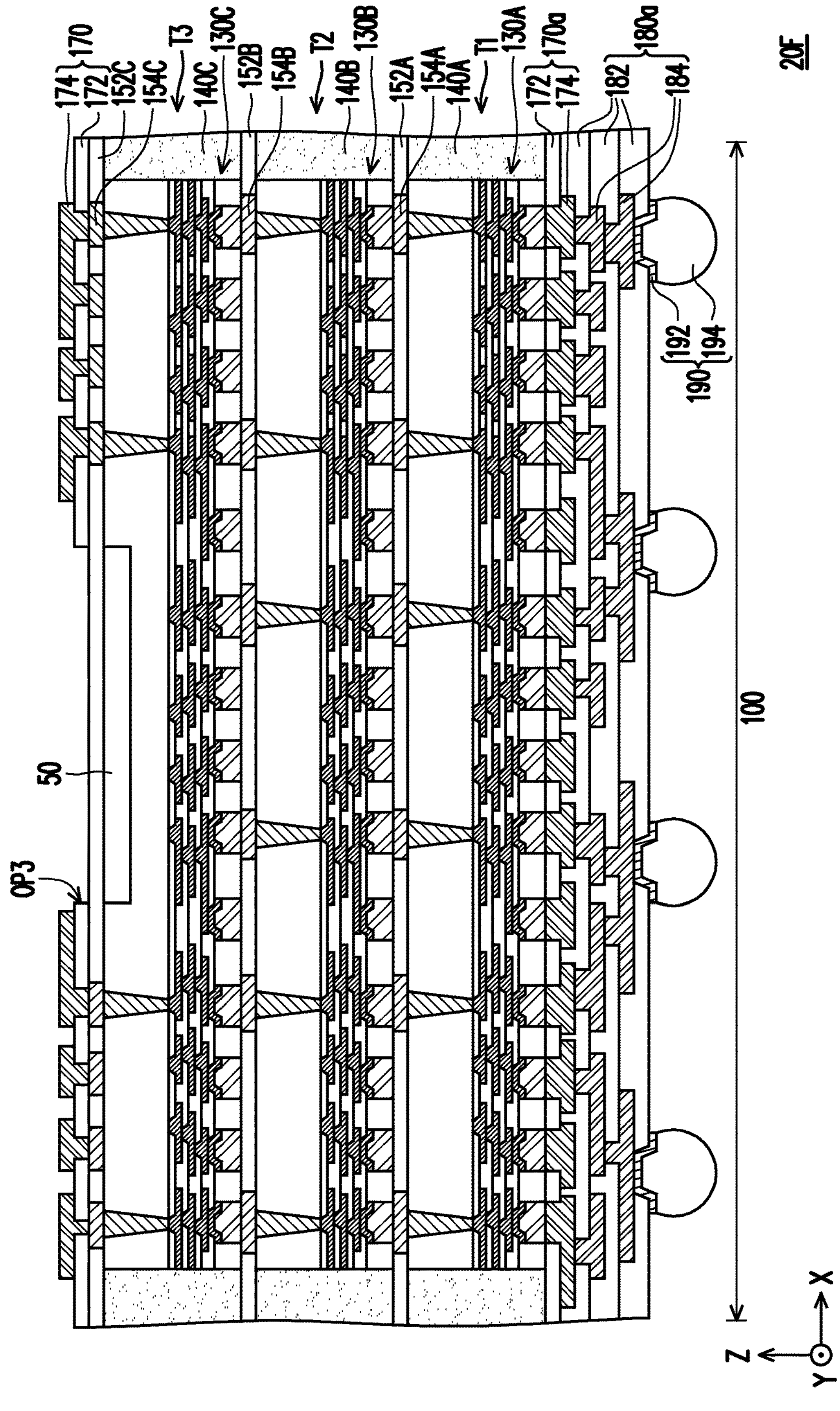
FIG. 31 is a schematic cross-sectional view showing a semiconductor structure in accordance with some embodiments of the disclosure.

FIG. 30 is a schematic top view illustrating a relative position of integrated circuit components of tiers in a semiconductor structure in accordance with some embodiments of the disclosure. FIG. 31 is a schematic cross-sectional view showing a semiconductor structure in accordance with some embodiments of the disclosure, where FIG. 31 is the cross-sectional view taken along a line BB' depicted in FIG. 30. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

As illustrated in FIG. 30 and FIG. 31, in some embodiments, within one device region 100 of a semiconductor structure 20F, a die stack (e.g., one SoIC) includes a first tier T1 including at least one integrated circuit component 130A, a second tier T2 including at least one integrated circuit component 130B, a third tier T3 including at least one integrated circuit component 130C, a connecting structure 170, an additional connecting structure 170*a*, an additional redistribution circuit structure 180*a*, and conductive elements 190. In some embodiments, the second tier T2 is located between and electrically connected to the first tier T1 and the third tier T3, the connecting structure 170 is located on and electrically connected to the third tier T3, the additional connecting structure 170*a* and the additional redistribution circuit structure 180*a* are orderly located on and electrically connected to the first tier T1, and the conductive elements 190 are located on and electrically connected to the additional redistribution circuit structure 180*a*. For example, the second tier T2 is located between the connecting structure 170 and the first tier T1, the additional connecting structure 170*a* is located between the first tier T1 and the additional redistribution circuit structure 180*a*, and the additional redistribution circuit structure 180*a* is located between the conductive elements 190 and the additional connecting structure 170*a*. The details of each of the integrated circuit component 130A, the integrated circuit component 130B, the connecting structure 170, the additional connecting structure 170*a*, the additional redistribution circuit structure 180*a* and the conductive elements 190 are previously described in FIG. 1 through FIG. 10 and FIG. 17 through FIG. 18, and thus are omitted herein for brevity. In addition, the formation and material and the configuration of the integrated circuit component 130C are similar to or substantially the same as the formation and material and the configuration of the integrated circuit component 130A or 130B as respectively described in FIG. 5 and FIG. 7, and thus are not repeated herein.

For example, one integrated circuit component 130A, one integrated circuit component 130B and one integrated circuit component 130C respectively included in the first tier T1, the second tier T2 and the third tier T3 are presented in the semiconductor structure 20F of FIG. 31 for illustrative purposes, where the number of the integrated circuit component 130A in the die stack of each device region 100, the number of the integrated circuit components 130B located on one integrated circuit component 130A, and the number of the integrated circuit components 130C located on one integrated circuit component 130B are not limited to the disclosure. As shown in FIG. 30 and FIG. 31, in some embodiments, sizes of the integrated circuit components 130A, 130B and 130C are the same. In some embodiments, as shown in FIG. 30 and FIG. 31, sidewalls of the integrated circuit components 130A, 130B and 130C are substantially aligned with each other. In some embodiment, a projection area of a positioning location of each of the connecting structure 170, the additional connecting structure 170*a* and the additional redistribution circuit structure 180*a* is greater than a projection area of a positioning location of each of the integrated circuit components 130A, 130B and 130C, on the X-Y plane.

For example, as shown in FIG. 31, the integrated circuit component 130A includes an AI engine such as an AI accelerator in combination with a computing system such as an AI server, the integrated circuit component 130B independently include a memory such as DRAM, RRAM or MRAM, or the like, and the integrated circuit component 130C include a sensor die. In the embodiments of which the integrated circuit component 130C include the sensor die, the integrated circuit component 130C has a sensor device 50 formed therein, where the connecting structure 170 includes at least one opening OP3 exposing the sensor device 50.

For example, the sensor device 50 is configurated to convert light signals (photons) from a light source to electrical signals, where the electrically signals are transmitted to the active components and/or the passive components (and/or further to the additional semiconductor dies) for processing. In some embodiments, peripheral circuits (not shown) used for processing of the electrical signals from the sensor device 50 may be formed in the integrated circuit component 130C (and/or an additional integrated circuit component in the same tier or other integrated circuit component in different tiers, if need). The peripheral circuits may include image signal processing (ISP) circuits which including analog-to-digital converters (ADCs), correlated double sampling (CDS) circuits, row decoders and the like.

The sensor device 50 may include an image sensor, such as a photo-sensitive metal-oxide-semiconductor (MOS) transistor or a photo-sensitive diode. For example, the sensor device 50 include a photo-sensitive diode (or saying photo diode). However, the disclosure is not limited thereto, and in an alternative embodiment, the sensor device 50 may be an image sensor of other types. As shown in FIG. 31, for example, the inner tier including the sensor die (e.g., the integrated circuit component 130C) is referred to as the topmost/outermost tier of the die stack in one device region 100.

The disclosure is not limited thereto. In some alternative embodiments, at least one additional tier may be presented between the first tier T1 and the second tier T2, between the second tier T2 and the third tier T3, or a combination thereof. For example, if considering the additional tier is the first tier T1 and the second tier T2, the additional tier includes at least one integrated circuit components including an AI engine such as an AI accelerator in combination with a computing system such as an AI server. For other example, if considering the additional tier is the second tier T2 and the third tier T3, the additional tier includes at least one integrated circuit components including a memory such as DRAM, RRAM or MRAM, or the like.

Figure 32:
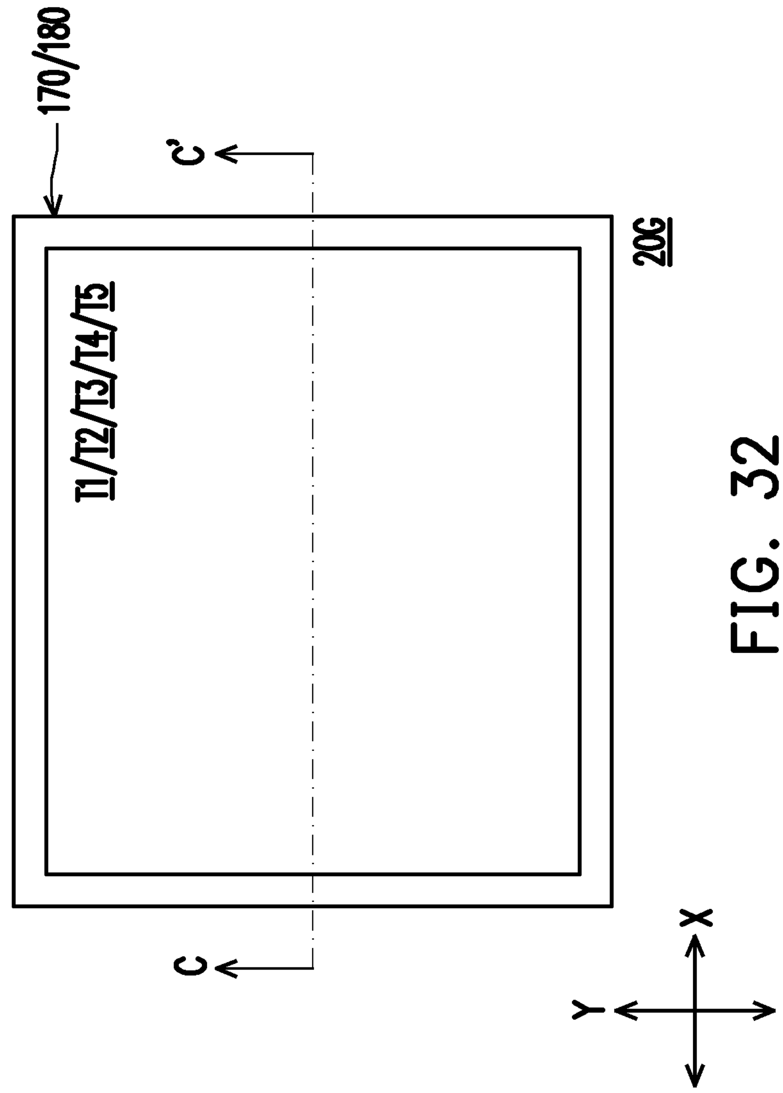
FIG. 32 is a schematic top view illustrating a relative position of integrated circuit components of tiers in a semiconductor structure in accordance with some embodiments of the disclosure.
Figure 33:
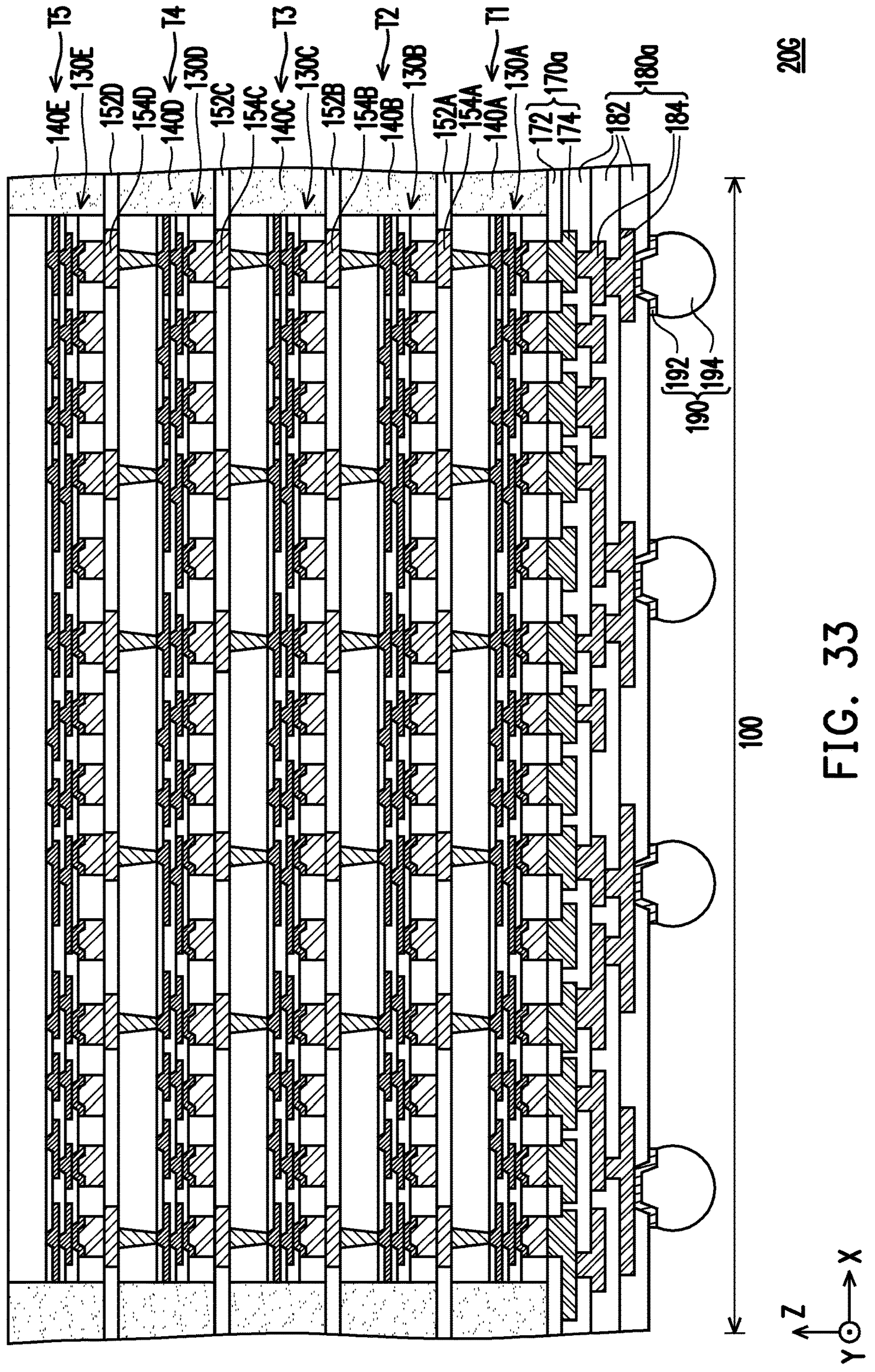
FIG. 33 is a schematic cross-sectional view showing a semiconductor structure in accordance with some embodiments of the disclosure.

FIG. 32 is a schematic top view illustrating a relative position of integrated circuit components of tiers in a semiconductor structure in accordance with some embodiments of the disclosure. FIG. 33 is a schematic cross-sectional view showing a semiconductor structure in accordance with some embodiments of the disclosure, where FIG. 33 is the cross-sectional view taken along a line CC' depicted in FIG. 32. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

As illustrated in FIG. 32 and FIG. 33, in some embodiments, within one device region 100 of a semiconductor structure 20G, a die stack (e.g., one SoIC) includes a first tier T1 including at least one integrated circuit component 130A, a second tier T2 including at least one integrated circuit component 130B, a third tier T3 including at least one integrated circuit component 130C, a fourth tier T1 including at least one integrated circuit component 130D, a fifth tier T1 including at least one integrated circuit component 130E, an additional connecting structure 170*a*, an additional redistribution circuit structure 180*a*, and conductive elements 190. In some embodiments, the first tier T1 to the fifth tier t5 are sequentially stacked on and electrically connected to each other, the additional connecting structure 170*a* and the additional redistribution circuit structure 180*a* are orderly located on and electrically connected to the first tier T1, and the conductive elements 190 are located on and electrically connected to the additional redistribution circuit structure 180*a*. For example, the second tier T2 is located between and electrically connected to the first tier T1 and the third tier T3, the third tier T3 is located between and electrically connected to the second tier T2 and the fourth tier T4, the fourth tier T4 is located between and electrically connected to the third tier T3 and the fifth tier T5, the additional connecting structure 170*a* is located between the first tier T1 and the additional redistribution circuit structure 180*a*, and the additional redistribution circuit structure 180*a* is located between the conductive elements 190 and the additional connecting structure 170*a*. The details of each of the integrated circuit component 130A, the integrated circuit component 130B, the additional connecting structure 170*a*, the additional redistribution circuit structure 180*a* and the conductive elements 190 are previously described in FIG. 1 through FIG. 10 and FIG. 17 through FIG. 18, and thus are omitted herein for brevity. In addition, the formation and material and the configuration of each of the integrated circuit components 130C through 130E are similar to or substantially the same as the formation and material and the configuration of the integrated circuit component 130A or 130B as respectively described in FIG. 5 and FIG. 7, and thus are not repeated herein.

For example, one integrated circuit component 130A, one integrated circuit component 130B, one integrated circuit component 130C, one integrated circuit component 130D and one integrated circuit component 130E respectively included in the first tier T1 through the fifth tier T5 are presented in the semiconductor structure 20G of FIG. 33 for illustrative purposes, where the number of the integrated circuit component 130A in the die stack of each device region 100, the number of the integrated circuit components 130B located on one integrated circuit component 130A, the number of the integrated circuit components 130C located on one integrated circuit component 130B, the number of the integrated circuit components 130D located on one integrated circuit component 130C, and the number of the integrated circuit components 130E located on one integrated circuit component 130D are not limited to the disclosure. As shown in FIG. 32 and FIG. 33, in some embodiments, sizes of the integrated circuit components 130A to 130E are the same. In some embodiments, as shown in FIG. 32 and FIG. 33, sidewalls of the integrated circuit components 130A to 130E are substantially aligned with each other. In some embodiment, a projection area of a positioning location of each of the additional connecting structure 170*a* and the additional redistribution circuit structure 180*a* is greater than a projection area of a positioning location of each of the integrated circuit components 130A to 130E, on the X-Y plane.

For example, as shown in FIG. 33, the integrated circuit components 130A and 130B independently include an AI engine such as an AI accelerator in combination with a computing system such as an AI server, and the integrated circuit components 130C, 130D and 130E independently include a memory such as DRAM, RRAM, MRAM, SRAM or WIO. In other words, for example, in the semiconductor structure 20G, the die stack of one device region 100 includes two tiers of an AI engine and three tiers of a memory. In some embodiments, the two tiers of an AI engine individually or in combination form an artificial intelligence system including a plurality of core chips for parallel calculation, and the three tiers of a memory include a plurality of different types of memories for providing storage, individually or in combination, to the artificial intelligence system.

In the above embodiments, the semiconductor structures 10A-10D and 20A-20E independently have SoICs with an identical architecture. However, the disclosure is not limited thereto. Alternatively, a semiconductor structure may have SoICs, in part or all, with different architectures.

FIG. 34 through FIG. 39 are schematic cross-sectional views showing various stages in a manufacturing method of a semiconductor structure in accordance with some embodiments of the disclosure. FIG. 40 is a schematic top view illustrating a relative position of SoICs in a semiconductor structure in accordance with some embodiments of the disclosure, where FIG. 34 through FIG. 39 are the cross-sectional views taken along a line DD' depicted in FIG. 40.

Figure 41:
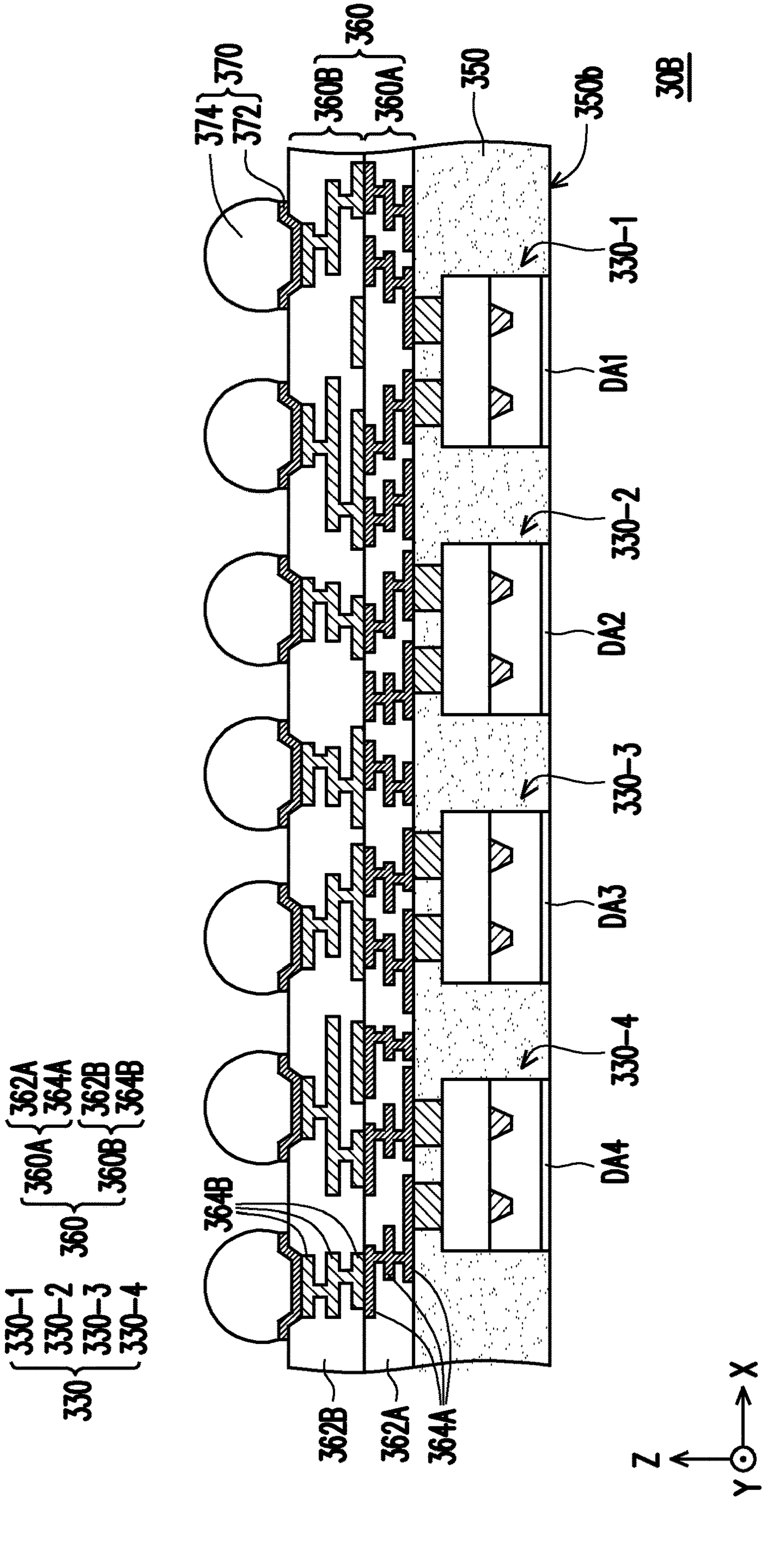
FIG. 41 is a schematic cross-sectional view showing a semiconductor structure in accordance with some embodiments of the disclosure.
Figure 42:
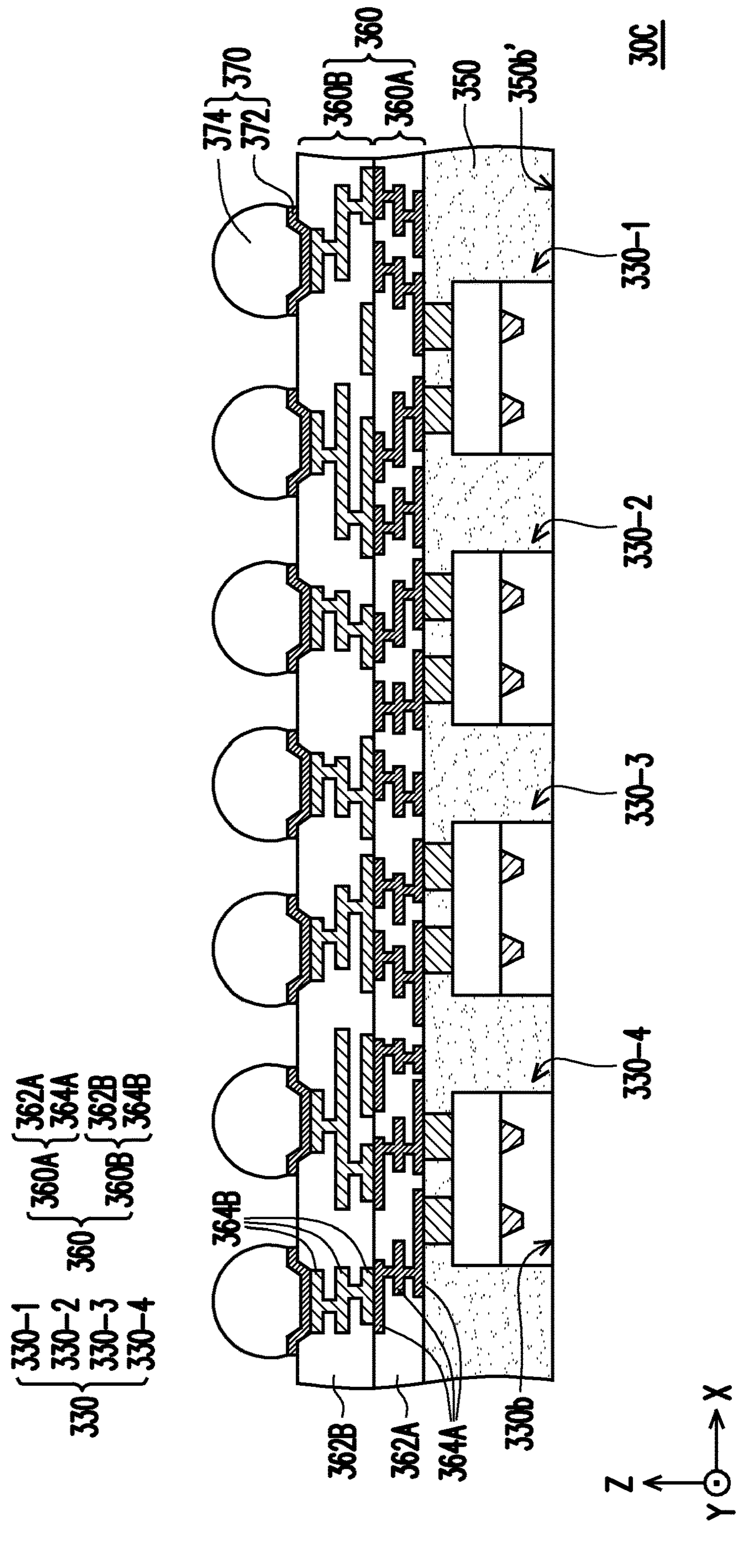
FIG. 42 is a schematic cross-sectional view showing a semiconductor structure in accordance with some embodiments of the disclosure.
Figure 43:
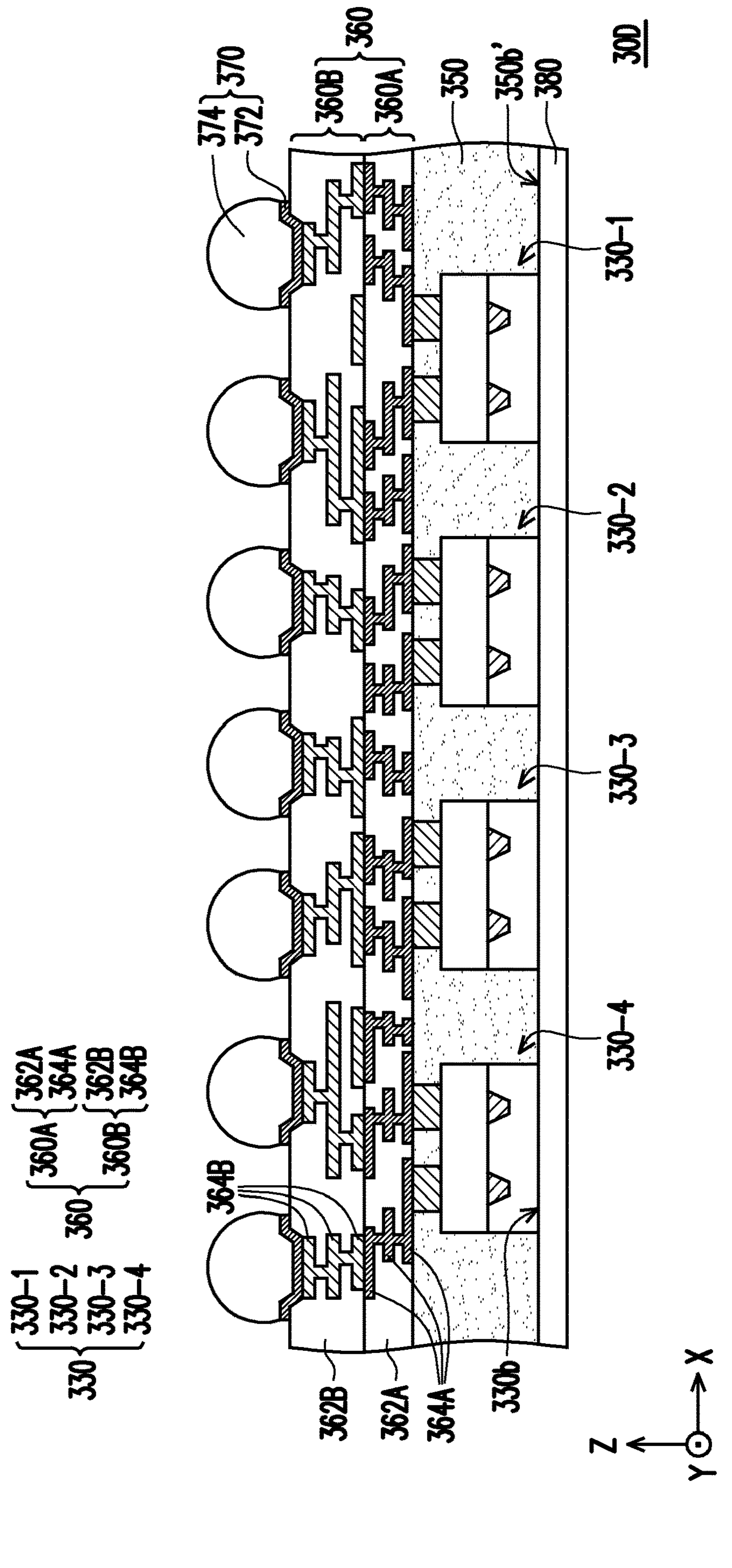
FIG. 43 is a schematic cross-sectional view showing a semiconductor structure in accordance with some embodiments of the disclosure.

FIG. 41 is a schematic cross-sectional view showing a semiconductor structure in accordance with some embodiments of the disclosure. FIG. 42 is a schematic cross-sectional view showing a semiconductor structure in accordance with some embodiments of the disclosure. FIG. 43 is a schematic cross-sectional view showing a semiconductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 34:
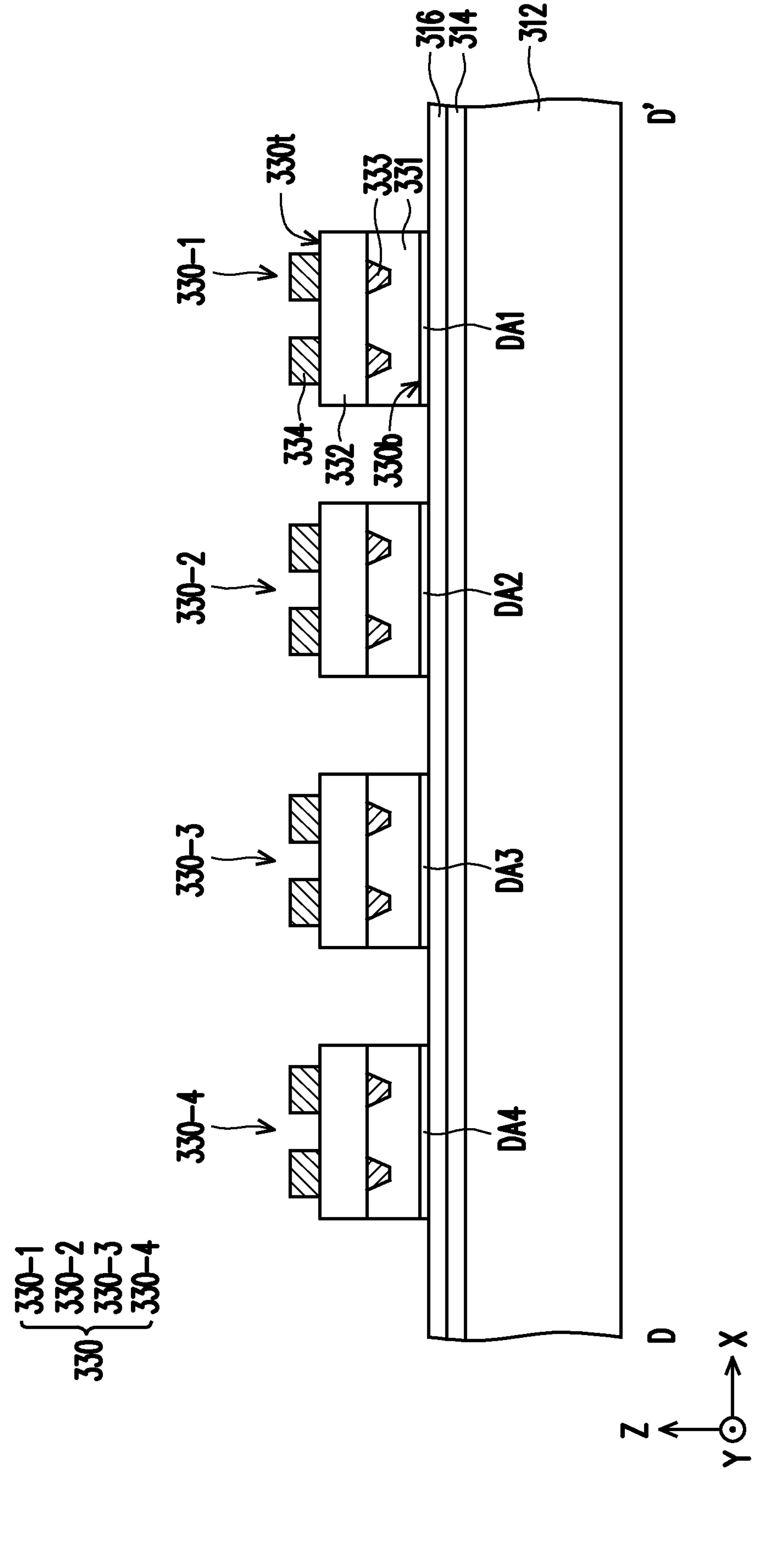
FIG. 34 through FIG. 39 are schematic cross-sectional views showing various stages in a manufacturing method of a semiconductor structure in accordance with some embodiments of the disclosure.

Referring to FIG. 34, in some embodiments, a carrier 312 with a debond layer 314 and a buffer layer 316 coated thereon is provided. In one embodiment, the carrier 312 may be a glass carrier or any suitable carrier for carrying a semiconductor wafer or a reconstituted wafer for the manufacturing method of the semiconductor package. In some embodiments, the debond layer 314 is disposed on the carrier 312, and the material of the debond layer 314 may be any material suitable for bonding and debonding the carrier 312 from the above layer(s) (e.g. the buffer layer 316) or any wafer(s) (e.g. the carrier 312) disposed thereon. In some embodiments, the debond layer 314 may include a release layer (such as a light-to-heat conversion ("LTHC") layer) or an adhesive layer (such as an ultra-violet curable adhesive or a heat curable adhesive layer).

As shown in FIG. 34, in some embodiments, the buffer layer 316 is disposed on the debond layer 314, and the debond layer 314 is located between the carrier 312 and the buffer layer 316. In some embodiments, the buffer layer 316 may be a dielectric material layer. In some embodiments, the buffer layer 316 may be a polymer layer which made of PI, PBO, BCB, or any other suitable polymer-based dielectric material. In some embodiments, the buffer layer 316 may be Ajinomoto buildup film (ABF), solder resist film (SR), or the like. The top surface of the buffer layer 316 may be levelled and may have a high degree of coplanarity. For example, the debond layer 314 and the buffer layer 316 may be formed by a suitable fabrication technique such as spin-coating, lamination, deposition, or the like. The disclosure is not specifically limited thereto.

Continued on FIG. 34, in some embodiments, at least one SoIC 330 is provided. As shown in FIG. 34, for example, the at least one SoIC 330 includes a plurality of SoICs 330 (e.g., 330-1, 330-2, 330-3 and 330-4). In some embodiments, the SoICs 330-1 to 330-4 are picked and placed over the carrier 312 and disposed on the buffer layer 316. For example, as shown in FIG. 34, the SoICs 330-1, 330-2, 330-3, 330-4 are arranged aside to each other along a direction X, and the direction X is perpendicular to a stacking direction Z of the carrier 312, the debond layer 314, the buffer layer 316 and the SoICs 330. As shown in FIG. 34, only fourth SoICs 330 (e.g., 330-1 to 330-4) are presented for illustrative purposes, however, it should be noted that the number of the SoICs 330 may be more or less than that, the disclosure is not limited thereto.

The SoICs 330 may be arranged in an array on a X-Y plane. In some embodiments, the SoICs 330 are arranged in the form of a matrix, such as a N×N array or a N×M array (N, M>0, N may or may not be equal to M) along the direction X and a direction Y. The direction X and the direction Y are not the same to each other and are perpendicular to each other and to the stacking direction Z, for example. For example, as shown in FIG. 40, the SoICs 330 are arranged into an array having a cross-form, however the disclosure is not limited thereto.

In some embodiments, each of the SoICs 330 (e.g., 330-1 to 330-4) includes a tier 331, a tier 332, conductive pillars 333 and conductive terminals 334, where the tier 332 is electrically coupled to and located over the tier 331, the conductive pillars 333 are embedded in the tier 331 and electrically coupled to the tiers 331-332, and the conductive terminals are located over the tier 332 and electrically coupled to the tiers 331-332. In some embodiment, the conductive pillars 333 are electrically connected to the conductive terminals 334.

In one embodiment, if considering one SoIC 330 including the SoIC 1000C depicted in FIG. 19, the SoIC 1000D depicted in FIG. 22, or one SoIC (the die stack in one device region 100) of the semiconductor structures 20A (FIG. 24 and FIG. 29), 20B (FIG. 25), 20C (FIG. 26), 20D (FIG. 27), 20E (FIG. 28), one of the tier 331 and the tier 332 is considered as a base tier (e.g., T0) and other one of the tier 331 and the tier 332 is considered as at least one inner tier (e.g., T1, T2, or both), while the conductive terminals 334 are considered as the conductive terminals 196 and the conductive pillars 333 are considered as the conductive pillars 260. In an alternative embodiment, if considering one SoIC 330 including one SoIC (the die stack in one device region 100) of the semiconductor structures 20F (FIG. 30 and FIG. 31), 20G (FIG. 32 and FIG. 33), one of the tier 331 and the tier 332 is considered as at least one inner tier (e.g., one of T1-T3 or one of T1-T5) and other one of the tier 331 and the tier 332 is considered as rest of inner tiers (e.g., other one or rest of T1-T3, or other one or rest of T1-T5).

For example, the number of tiers in one SoIC 330 are two for illustrative purpose and simplicity, where the number of the tiers may be two or more than two, the disclosure is not limited thereto. In other words, each of the SoICs 330 (e.g., 330-1 to 330-4) may independently include the SoIC 1000A depicted in FIG. 12, the SoIC 1000B depicted in FIG. 15, the SoIC 1000C depicted in FIG. 19, the SoIC 1000D depicted in FIG. 22, or one SoIC (the die stack in one device region 100) of the semiconductor structures 20A (FIG. 24 and FIG. 29), 20B (FIG. 25), 20C (FIG. 26), 20D (FIG. 27), 20E (FIG. 28), 20F (FIG. 30 and FIG. 31), 20G (FIG. 32 and FIG. 33). The details of the above non-limiting examples (e.g., the SoICs 1000A-1000D and one SoIC of each of the semiconductor structures 20A-20G) have been previously described, and thus are not repeated here for brevity. In one embodiment, the SoICs 330 all have the same architecture. In an alternative embodiment, the SoICs 330 all have different architectures. Or, alternatively, the SoICs 330 may, in part, have the same architecture, while the rest of the SoICs 330 may have different architectures.

Continued on FIG. 34, in some embodiments, the SoICs 330-1 to 330-4 are attached or adhered on the buffer layer 316 through connecting films DA1 to DA4, respectively. In some embodiments, the connecting film DA1 is located between the SoIC 330-1 and the buffer layer 316, and two opposite sides of the connecting film DA1 physically contacts a bottom surface 330*b* of the SoIC 330-1 and the buffer layer 316. In some embodiments, the connecting film DA2 is located between the SoIC 330-2 and the buffer layer 316, and two opposite sides of the connecting film DA2 physically contacts the bottom surface 330*b* of the SoIC 330-2 and the buffer layer 316. In some embodiments, the connecting film DA3 is located between the SoIC 330-3 and the buffer layer 316, and two opposite sides of the connecting film DA3 physically contacts the bottom surface 330*b* of the SoIC 330-3 and the buffer layer 316. In some embodiments, the connecting film DA4 is located between the SoIC 330-4 and the buffer layer 316, and two opposite sides of the connecting film DA4 physically contacts the bottom surface 330*b* of the SoIC 330-4 and the buffer layer 316. In some embodiments, due to the above connecting films DA1-DA4, the SoICs 330-1 to 330-4 are stably adhered to the buffer layer 316.

In some embodiments, the above connecting films DA1-DA4 are, but not limited to, a die attach film or a layer made of adhesives, epoxy-based resin, acrylic polymer, other suitable insulating material, or the like, and which may be with or without fillers filled therein (such as silica, alumina, or the like). The disclosure is not limited thereto. In alternative embodiments, the buffer layer 316 may be optionally omitted from the debond layer 314 (not shown), where each of the SoICs 330-1 to 330-4 is then disposed on the debond layer 314 in a direct contact manner.

Figure 35:
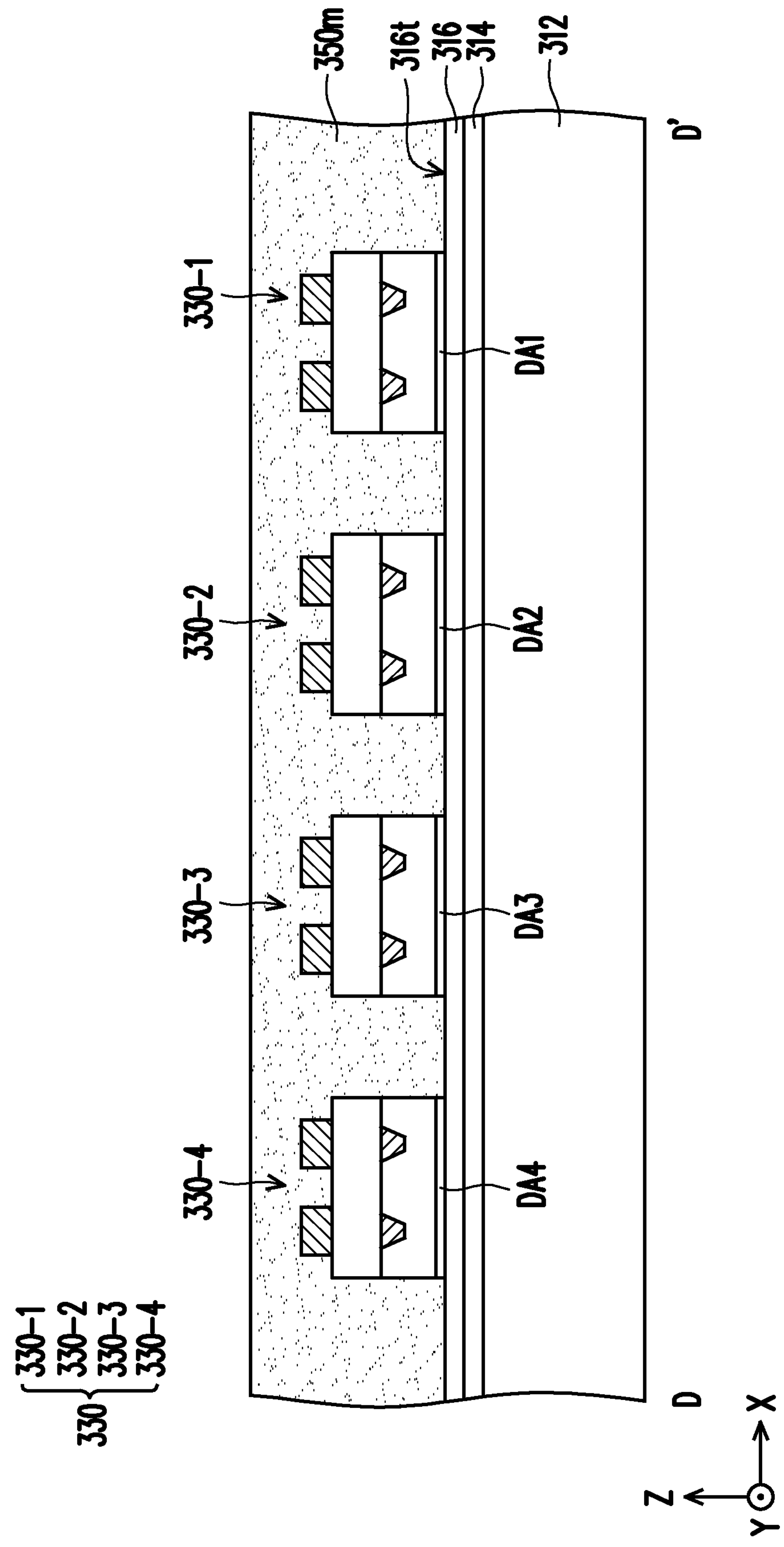

Referring to FIG. 35, in some embodiments, the SoICs 330-1 to 330-4 are encapsulated in an insulating encapsulation 350*m*. In some embodiments, the insulating encapsulation 350*m* is formed on the buffer layer 316 and over the carrier 312. As shown in FIG. 35, the insulating encapsulation 350*m* at least fills up the gaps between the SoICs 330-1 to 330-4 and between the connecting films DA1-DA4, for example. In some embodiments, the insulating encapsulation 350*m* covers the SoICs 330-1 to 330-4 and a surface 316*t* of the buffer layer 316 exposed by the SoICs 330-1 to 330-4. In other words, for example, the SoICs 330-1 to 330-4 are not accessibly revealed by and embedded in the insulating encapsulation 350*m*.

In some embodiments, the insulating encapsulation 350*m* is a molding compound formed by a molding process. In some embodiments, the insulating encapsulation 350*m*, for example, may include polymers (such as epoxy resins, phenolic resins, silicon-containing resins, or other suitable resins), dielectric materials, or other suitable materials. In an alternative embodiment, the insulating encapsulation 350*m* may include an acceptable insulating encapsulation material. In some embodiments, the insulating encapsulation 350*m* may further include inorganic filler or inorganic compound (e.g. silica, clay, and so on) which can be added therein to optimize coefficient of thermal expansion (CTE) of the insulating encapsulation 350*m*.

The disclosure is not limited thereto. If considering the insulating encapsulation 350*m* being a dielectric material formed by deposition, where the dielectric material may include an oxide (e.g. silicon oxide), a nitride (e.g. silicon nitride), TEOS, or the like) or any suitable insulating materials for gap fill.

Figure 36:
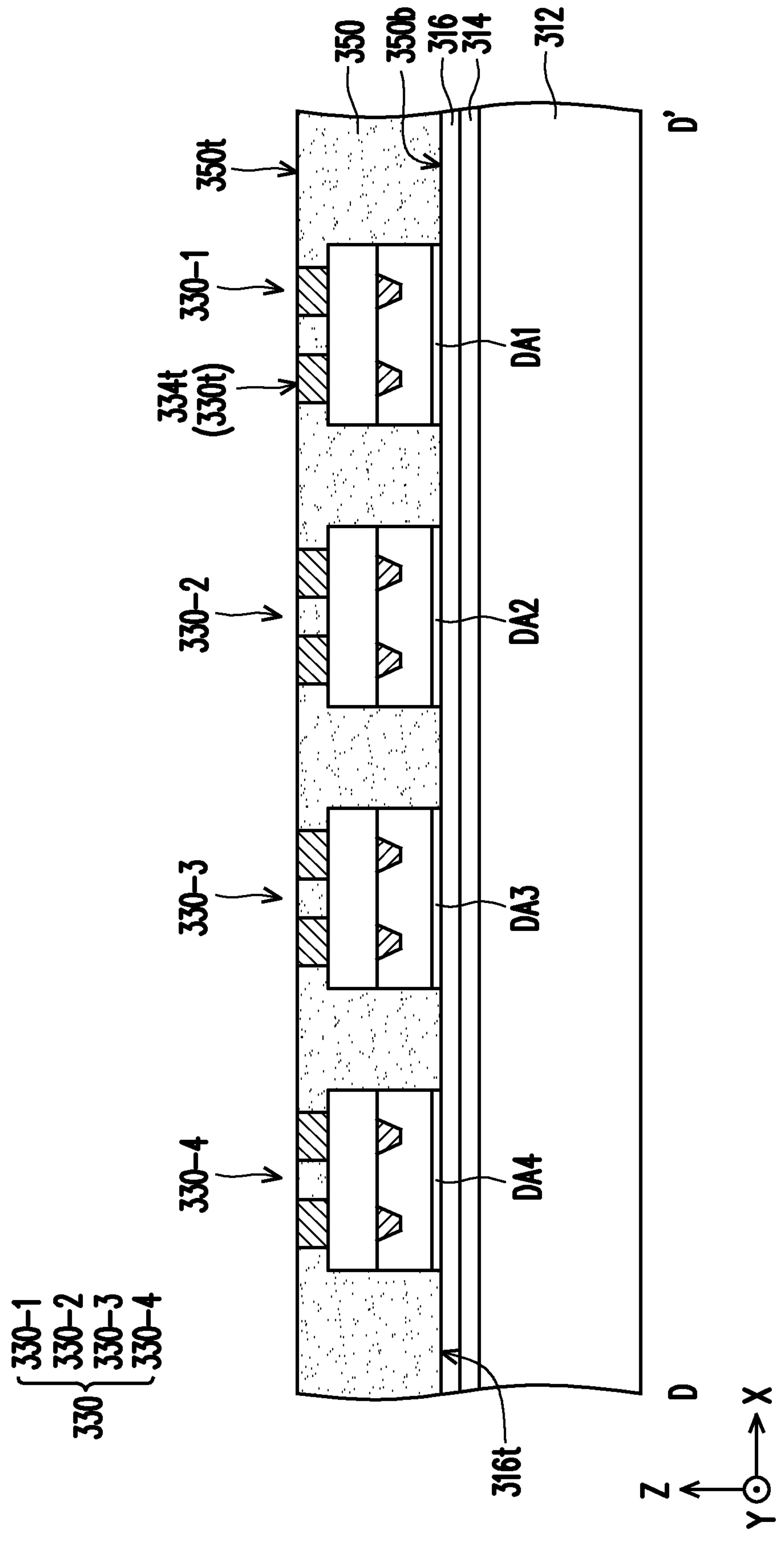

Referring to FIG. 36, in some embodiments, the insulating encapsulation 350*m* is planarized to form an insulating encapsulation 350 exposing the SoICs 330-1 to 330-4. For example, as shown in FIG. 36, after the planarization, top surfaces 330*t* of the SoICs 330-1 to 330-4 (e.g. top surfaces 334*t* of the conductive terminals 334) are exposed by a top surface 350*t* of the insulating encapsulation 350. That is, for example, the top surfaces 330*t* of the SoICs 330-1 to 330-4 become substantially leveled with the top surface 350*t* of the insulating encapsulation 350. In other words, the top surfaces 330*t* of the SoICs 330-1 to 330-4 and the top surface 350*t* of the insulating encapsulation 350 are substantially coplanar to each other. On the other hand, a bottom surface 350*b* of the insulating encapsulation 350 are in contact with the surface 316*t* of the buffer layer 316 exposed by the SoICs 330. In some embodiments, as shown in FIG. 36, the SoICs 330-1 to 330-4 are accessibly revealed by the insulating encapsulation 350. That is, for example, the conductive terminals 334 of the SoICs 330 are accessibly revealed by the insulating encapsulation 350.

The insulating encapsulation 350*m* may be planarized by mechanical grinding or CMP, for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 350*m*, the conductive terminals 334 of the SoICs 330 may, in part or all, also be planarized. In certain embodiments, the planarizing step may be, for example, performed on the over-molded insulating encapsulation 350*m* to level the top surface 350*t* of the insulating encapsulation 350 and the top surfaces 330*t* of the SoICs 330-1 to 330-4 (e.g. top surfaces 334*t* of the conductive terminals 334).

Figure 37:
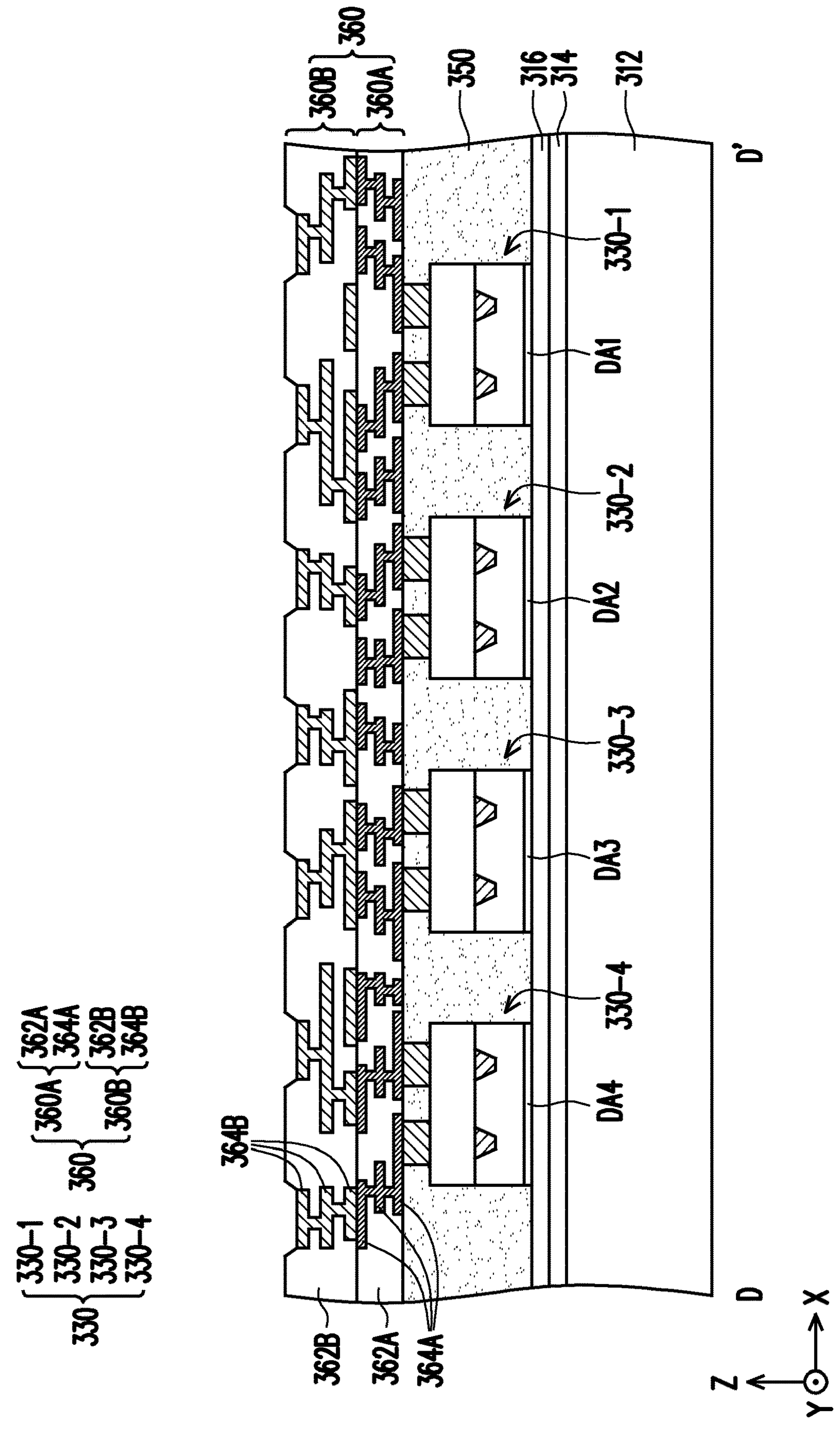

Referring to FIG. 37, in some embodiments, a redistribution circuit structure 360 is formed on the SoICs 330 and the insulating encapsulation 350. For example, the redistribution circuit structure 360, for example, includes a fine-featured portion 360A and a coarse-featured portion 360B, and is electrically connected to the SoICs 330 (e.g., 330-1 to 330-4) through connecting to their conductive terminals 334 exposed by the insulating encapsulation 350. In some embodiments, the fine-featured portion 360A is located between the coarse-featured portion 360B and the SoICs 330 and between the coarse-featured portion 360B and the insulating encapsulation 350. In some embodiments, the fine-featured portion 360A is formed over and electrically coupled to the SoICs 330, and the coarse-featured portion 360B is electrically coupled to the SoICs 330 through the fine-featured portion 360A. In some embodiments, as shown in FIG. 37, the fine-featured portion 360A is capable of providing local electrical communications within each of the SoICs 330 and thus is referred to as an intra-chip redistribution layer (RDL), while the coarse-featured portion 360B is capable of providing global electrical communications among the SoICs 330 and between external devices/apparatus and the SoICs 330 and thus is referred to as an inter-chip RDL.

For example, the fine-featured portion 360A includes a dielectric structure 362A and a metallization pattern 364A located in the dielectric structure 362A, and the coarse-featured portion 360B includes a dielectric structure 362B and a metallization pattern 364B located in the dielectric structure 362B. The metallization patterns 364A and the metallization patterns 364B independently may include one or more patterned conductive layers (which being individually referred to as redistribution layers or redistribution lines having line portions (also referred to as conductive lines or traces) on and extending on the X-Y plane and via portions (also referred to as conductive vias) extending on the stacking direction Z), while the dielectric structures 362A and the dielectric structures 362B independently may include one or more dielectric layers arranged alternatively with the patterned conductive layers. The number of the dielectric layers included in one dielectric structure 362A or 362B and the number of the patterned conductive layers included in one metallization pattern 364A or 364B may not be limited to the drawings of the disclosure, and may be selected and designated based on the demand and design requirements.

The fine-featured portion 360A and the coarse-featured portion 360B of the redistribution circuit structure 360 include metallization patterns and dielectric structures of differing sizes, as shown in FIG. 37, for example. In certain embodiments, the patterned conductive layers included in the metallization pattern 364A are formed from a same first conductive material with a same thickness (e.g., a first thickness) and a same line width (e.g., a first line width), and the patterned conductive layers included in the metallization pattern 364B are formed from a same second conductive material with a same thickness (e.g., a second thickness) and a same line width (e.g., a second line width). Likewise, in some embodiments, the dielectric layers included in the dielectric structure 362A are formed from a same first dielectric material with a same thickness, and the dielectric layers included in the dielectric structure 362B are formed from a same second dielectric material with a same thickness. In some embodiments, along the stacking direction Z, the patterned conductive layers included in the metallization pattern 364A have the first thickness that is smaller than the second thickness of the patterned conductive layers included in the metallization pattern 364B. On the other hand, on the top view (e.g., on the X-Y plane), the patterned conductive layers included in the metallization pattern 364A have the first line width that is smaller than the second line width of the patterned conductive layers included in the metallization pattern 364B.

The material of the dielectric structures 362A, 362B may include PI, epoxy resin, acrylic resin, phenol resin, BCB, PBO, or any other suitable polymer-based dielectric material, and may be formed by deposition, lamination or spin-coating. The material of the metallization patterns 364A, 364B may include aluminum, titanium, copper, nickel, tungsten, and/or alloys thereof, and may be formed by electroplating or deposition. The disclosure is not limited thereto. The dielectric structures 362A, 362B and the metallization patterns 364A, 364B independently may also be patterned by a photolithography and etching process.

The material of the dielectric structure 362A is, for example, as the same as the material of the dielectric structure 362B. For another example, the materials of the dielectric structures 362A and 362B are different from one another. The material of the metallization pattern 364A is, for example, as the same as the material of the metallization pattern 364B. For another example, the materials of the metallization patterns 364A and 364B are different from one another.

The disclosure is not limited thereto. In alternative embodiments, the redistribution circuit structure 360 may include metallization patterns of same size and dielectric structures of same size.

Figure 38:
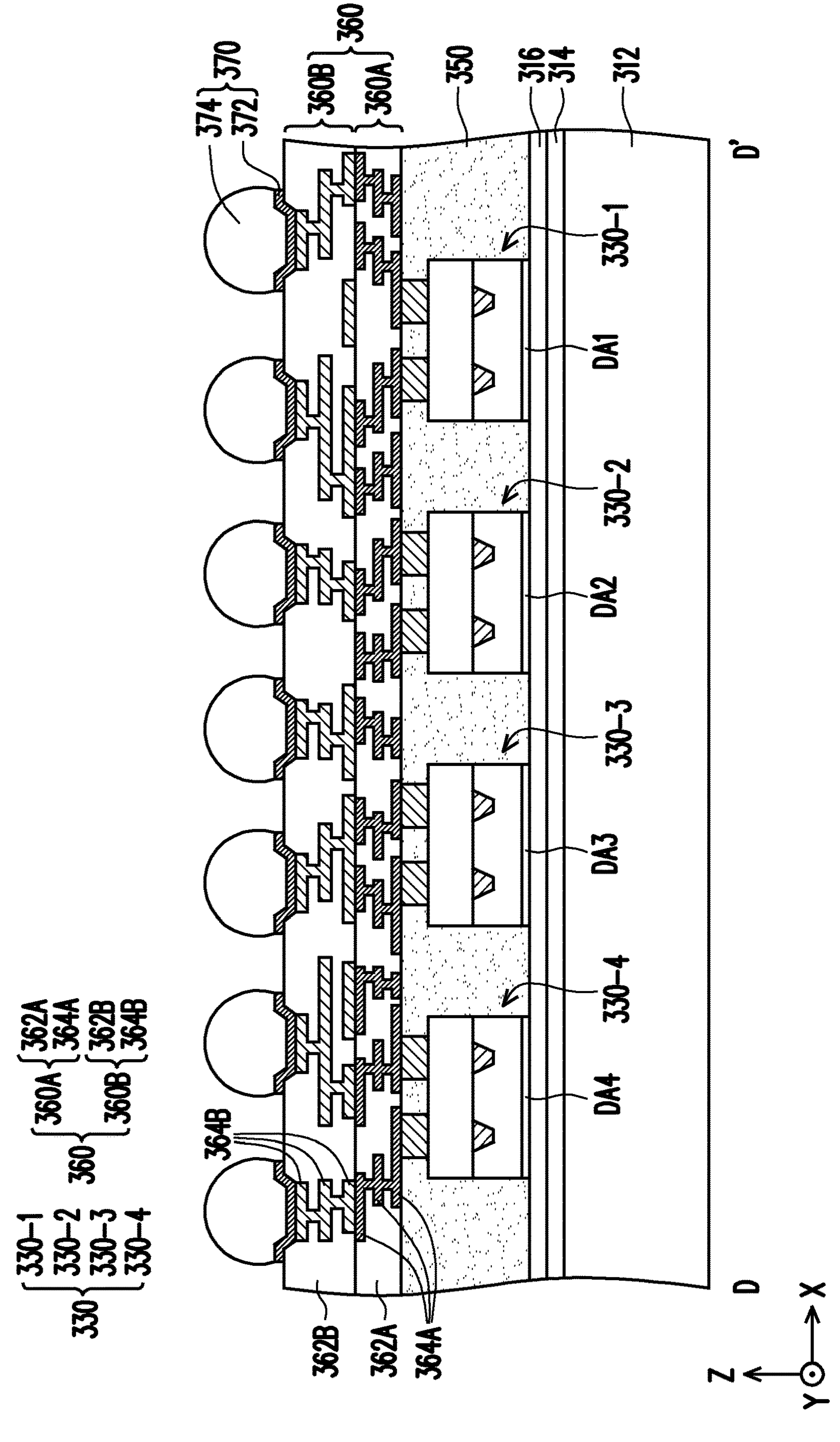

Referring to FIG. 38, in some embodiments, a plurality of under-bump metallurgy (UBM) patterns 372 are disposed on top surfaces of a topmost layer of the metallization pattern 364B exposed by the dielectric structure 362B for electrically connecting with conductive elements (e.g. conductive balls or conductive bumps). For example, the UBM patterns 372 are formed on and electrically connected to the redistribution circuit structure 360. In some embodiments, a plurality of conductive terminals 374 are formed over are disposed on the UBM patterns 372 over the redistribution circuit structure 360. As shown in FIG. 38, the UBM patterns 372 are sandwiched between the redistribution circuit structure 360 and the conductive terminals 374, for example. In some embodiments, some of the conductive terminals 374 are electrically connected to one or more than one the SoICs 330 through the UBM patterns 372 and the redistribution circuit structure 360. The number of the conductive terminals 374 is not limited to the disclosure, and may be designated and selected based on the number of the UBM patterns 372. In the disclosure, one UBM pattern 372 and a respective one of the conductive terminals 374 may be referred to as a conductive connector 370 for connecting with a circuit substrate (e.g., printed circuit board (PCB) or like) or another semiconductor structure for inputting/outputting electric and/or power signals.

However, the disclosure is not limited thereto; in some alternative embodiments, the UBM patterns 372 may be omitted. For example, the conductive terminals 374 may directly disposed on the redistribution circuit structure 360 (e.g. the topmost layer of the metallization pattern 364B exposed by the dielectric structure 362B). The formation and materials of the UBM patterns 372 may be similar to or substantially the same as the formation and material of the UBM pattern 192 as described in FIG. 10, and the formation and materials of the conductive terminals 374 may be similar to or substantially the same as the formation and material of the conductive terminals 194 as described in FIG. 10, and thus are not repeated herein for brevity.

Figure 39:
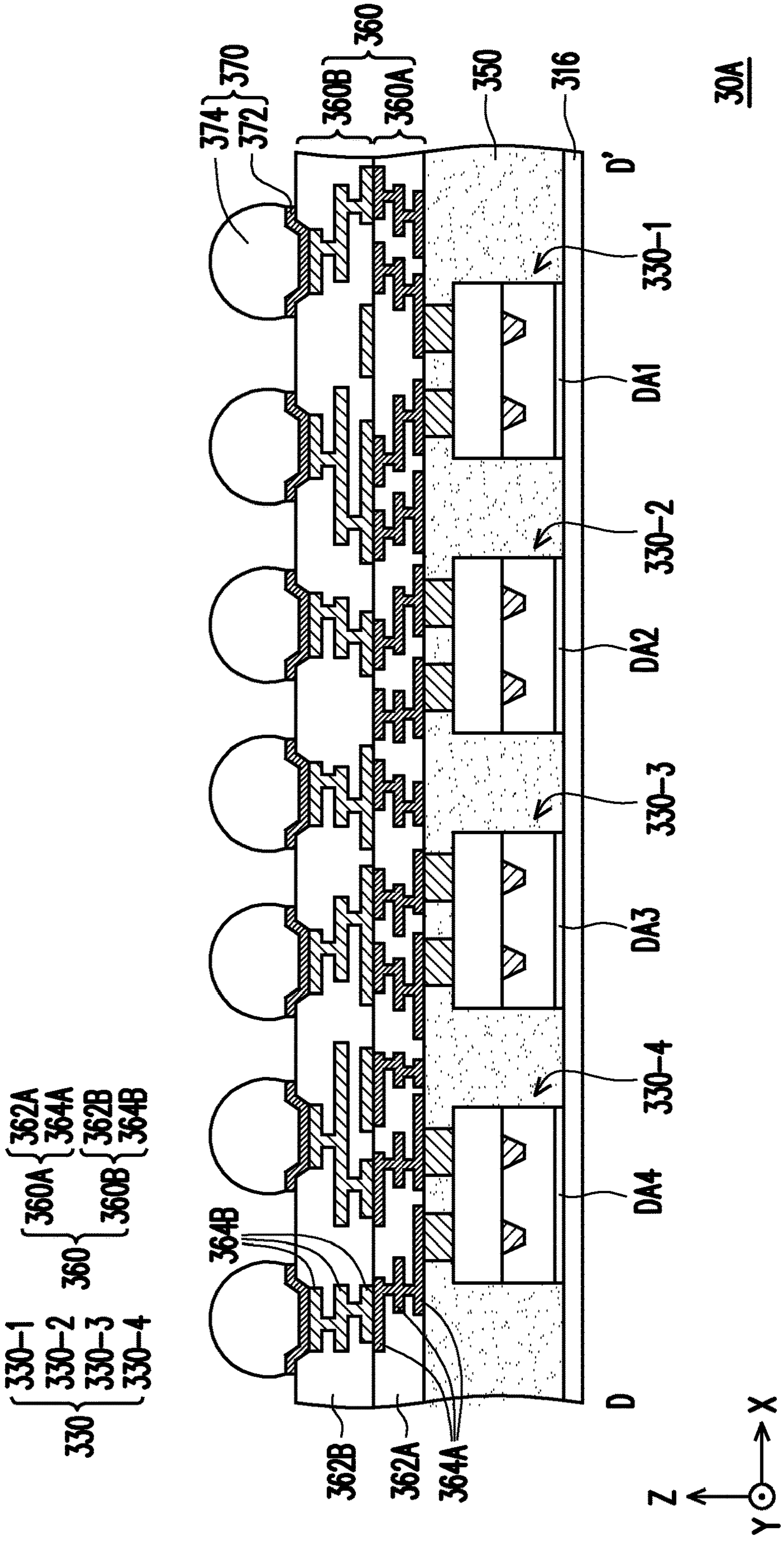
Figure 40:
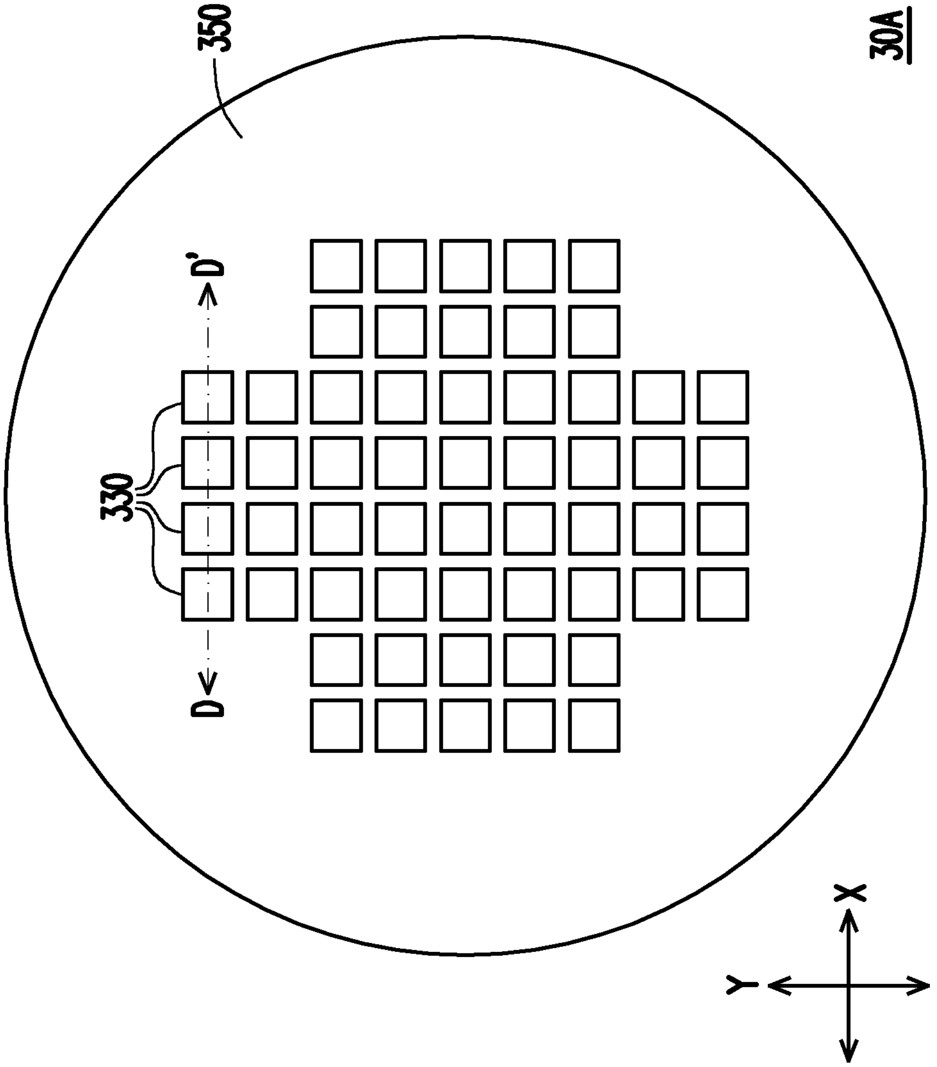
FIG. 40 is a schematic top view illustrating a relative position of SoICs in a semiconductor structure in accordance with some embodiments of the disclosure.

Referring to FIG. 39, in some embodiments, after the conductive connectors 170 are formed, the debond layer 314 the carrier 312 are de-bonded from the buffer layer 316 to form a semiconductor structure 30A. For example, the buffer layer 316 is easily separated from the carrier 312 due to the debond layer 314 carried by the carrier 312. In embodiments where the debond layer 314 is the LTHC release layer, an UV laser irradiation is utilized to facilitate peeling of the buffer layer 316 from the carrier 312. Up to here, the manufacture of the semiconductor structure 30A is completed. Similar to the semiconductor structure 10A, for example, the semiconductor structure 30 has a size (on the X-Y plane) about 4 inches or more.

During the de-bonding step, for example, the semiconductor structure 30A is flipped along with the carrier 312, and a holding device (not shown) is adopted to secure the semiconductor structure 30A before de-bonding the carrier 312 and the debond layer 314, where the conductive connectors 370 are held by the holding device. For example, the holding device may be an adhesive tape, a carrier film or a suction pad. In some embodiments, after the de-bonding step, the conductive connectors 370 are released from the holding device.

Alternatively, the buffer layer 316 may be optionally removed. For example, as shown in a semiconductor structure 30B of FIG. 41, the buffer layer is removed, and (the bottom surface 350*b* of) the insulating encapsulation 350 and the connecting films DA1 to DA4 are exposed.

In other alternative embodiments, the connecting films DA1 to DA4 are removed. For example, as shown in a semiconductor structure 30C of FIG. 42, the connecting films DA1-DA4 are removed via a planarizing process. In some embodiments, before releasing the conductive connectors 370 from the holding device, the planarizing process is performed on the insulating encapsulation 350 to obtain a bottom surface 350*b*' for exposing the bottom surfaces 330*b* of the SoICs 330.

Alternatively, a thermal interface material may be coated on the insulating encapsulation 350 and the SoICs 330 to facilitate the heat dissipation of a semiconductor structure. For example, as shown in a semiconductor structure 30D of FIG. 43, the thermal interface material 380 is formed on the bottom surface 350*b*' of the insulating encapsulation 350 and the bottom surfaces 330*b* of the SoICs 330 exposed by the insulating encapsulation 350. In some embodiment, the thermal interface material 380 includes any suitable thermally conductive material such as a polymer having a good thermal conductivity (e.g., between about 3 W/m·K to about 10 W/m·K or more). The thermal interface material 380 may include an indium sheet, a graphite sheet, or the like; and may be formed on the insulating encapsulation 350 and the SoICs 330 by lamination or the like. The disclosure is not limited thereto, the thermal interface material 380 may also adopted by the semiconductor structures 30A to 30C, if need.

FIG. 44 through FIG. 47 are schematic cross-sectional views showing various stages in a manufacturing method of a semiconductor structure in accordance with some embodiments of the disclosure. FIG. 48 is a schematic top view illustrating a relative position of SoICs in a semiconductor structure in accordance with some embodiments of the disclosure, where FIG. 44 through FIG. 47 are the cross-sectional views taken along a line EE' depicted in FIG. 48. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Figure 44:
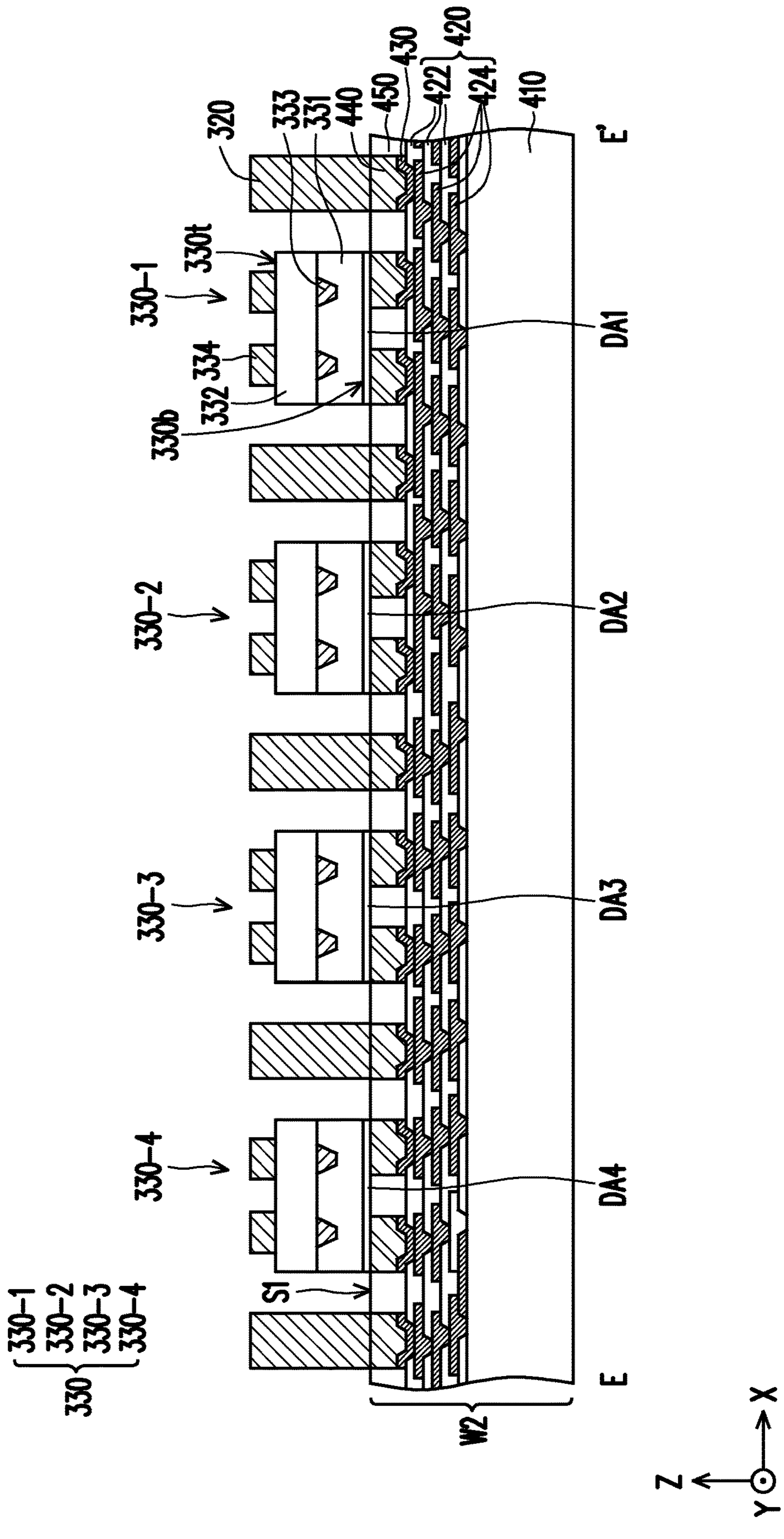
FIG. 44 through FIG. 47 are schematic cross-sectional views showing various stages in a manufacturing method of a semiconductor structure in accordance with some embodiments of the disclosure.

Referring to FIG. 44, in some embodiments, a wafer W2 is provided. In some embodiments, the wafer W2 includes a semiconductor substrate 410 having semiconductor devices (not shown) formed therein, an interconnect structure 420 formed on the semiconductor substrate 410, a plurality of connecting pads 430 formed on the interconnect structure 420, a plurality of connecting vias 440 formed on the connecting pads 430, a protection layer 450 covers the interconnect structure 420, the connecting pads 430 and the connecting vias 440. However, the wafer W2 may include the semiconductor substrate 410, the interconnect structure 420 and the connecting pads 430.

Alternatively, the wafer W2 may further include a plurality of conductive pillars (not shown) formed in the semiconductor substrate 410 and connected to the interconnect structure 420 and the liners (not shown) located between the conductive pillars and the semiconductor substrate 410. The formations and materials of the semiconductor substrate 410, the interconnect structure 420, the connecting pads 430, the connecting vias 440 and the protection layer 450 are substantially the same or similar to the formations and materials of the semiconductor substrate 210, the interconnect structure 220, the connecting pads 230, the connecting vias 240 and the protection layer 250 as described in FIG. 1, respectively; and thus are not repeated herein for simplicity. In addition, the formations and materials of the afore-said conductive pillars and liners are substantially the same or similar to the formations and materials of the conductive pillars 260 and the liners 270 as described in FIG. 1, and thus are also omitted.

In one non-limiting example, the wafer W2 may include one or more integrated circuit components independently providing functionalities similar to or substantially the same as the functionalities provided by the integrated circuit components 200 previously described in FIG. 1. In another one non-limiting example, the wafer W2 may include one or more dummy integrated circuit components providing no functionality similar to or substantially the same as the functionalities provided by the integrated circuit components 200, but only providing physical support to overlying components for warpage control and/or providing better heat dissipation for overlying components. Or, in further one non-limiting example, the wafer W2 may at least include both afore-said non-limiting examples. The disclosure is not limited thereto.

Continued on FIG. 44, for example, a plurality of through pillars 320 and a plurality of SoICs 330 are provided and placed over the wafer W2. As shown in FIG. 44, the SoICs 330 (e.g., 330-1 through 330-4) are picked and placed on a front surface S1 of the wafer W2 through connecting films DA1-DA4, respectively, for example. In some embodiments, the SoICs 330 are bonded to the wafer W2 through the connecting films DA1-DA4, (e.g., dielectrics). The details of the SoICs 330 and the connecting films DA1-DA4 have been previously described in FIG. 34, and thus are not repeated therein.

In some embodiments, the through pillars 320 are formed on the front surface S1 of the wafer W2. For example, the through pillars 320 are through integrated fan-out (InFO) vias. The through pillars 320 may be considered as conductive pillars, also. As shown in FIG. 44, in some embodiments, the through pillars 320 are located on and prop against the connecting vias 440, and are electrically coupled to the wafer W2 through the connecting vias 440. For example, as shown in FIG. 44, a sidewall of each through pillar 320 are vertical (e.g., perpendicular to the front surface S1), however the disclosure is not limited thereto. Alternatively, the sidewall of each through pillar 320 may be slant (e.g., not perpendicular or parallel to the front surface S1).

In some embodiments, the through pillars 320 are formed by photolithography, plating, photoresist stripping processes or any other suitable method. For example, the plating process may include an electroplating plating, an electroless plating, or the like. In one embodiment, the through pillars 320 may be formed by forming a mask pattern (not shown) covering the wafer W2 with openings exposing the connecting vias 440 exposed by the front surface S1 of the wafer W2, forming a metallic material filling the openings formed in the mask pattern to form the through pillars 320 by electroplating or deposition, and then removing the mask pattern. In one embodiment, the mask pattern may be removed by acceptable ashing process and/or photoresist stripping process, such as using an oxygen plasma or the like. In one embodiment, prior to the formation of the mask pattern, a seed layer may be formed conform ally over the wafer W2. The disclosure is not limited thereto. In one embodiment, the material of the through pillars 320 may include a metal material such as copper or copper alloys, or the like.

However, the disclosure is not limited thereto. In alternative embodiments, the through pillars 320 may be pre-fabricated through vias which may be disposed on the wafer W2 by picking- and placing.

As illustrated in FIG. 44 and FIG. 48, in some embodiments, the through pillars 320 are arranged at a periphery of each of SoICs 330. For example, the SoICs 330 are surrounded by the through pillars 320. For simplification, only four SoIC 330 and five through pillars 320 are presented in FIG. 44 for illustrative purposes, however it should be noted that the number of the through pillars 320 and the SoICs 330 may be more than five and more than four (FIG. 48), respectively; the disclosure is not limited thereto. The number of the through pillars 320 and the number of the SoICs 330 may be designated and selected based on the demand and design layout.

In one embodiment, a height of the through pillars 320 is greater than a height of the SoICs 330. Alternatively, the height of the through pillars 320 may be less than or substantially equal to the height of the SoICs 330. In one embodiment, the through pillars 320 are formed prior to the formation of the SoICs 330. Alternatively, the through pillars 320 may be formed after the formation of the SoICs 330. The disclosure is not limited to the disclosure.

Figure 45:
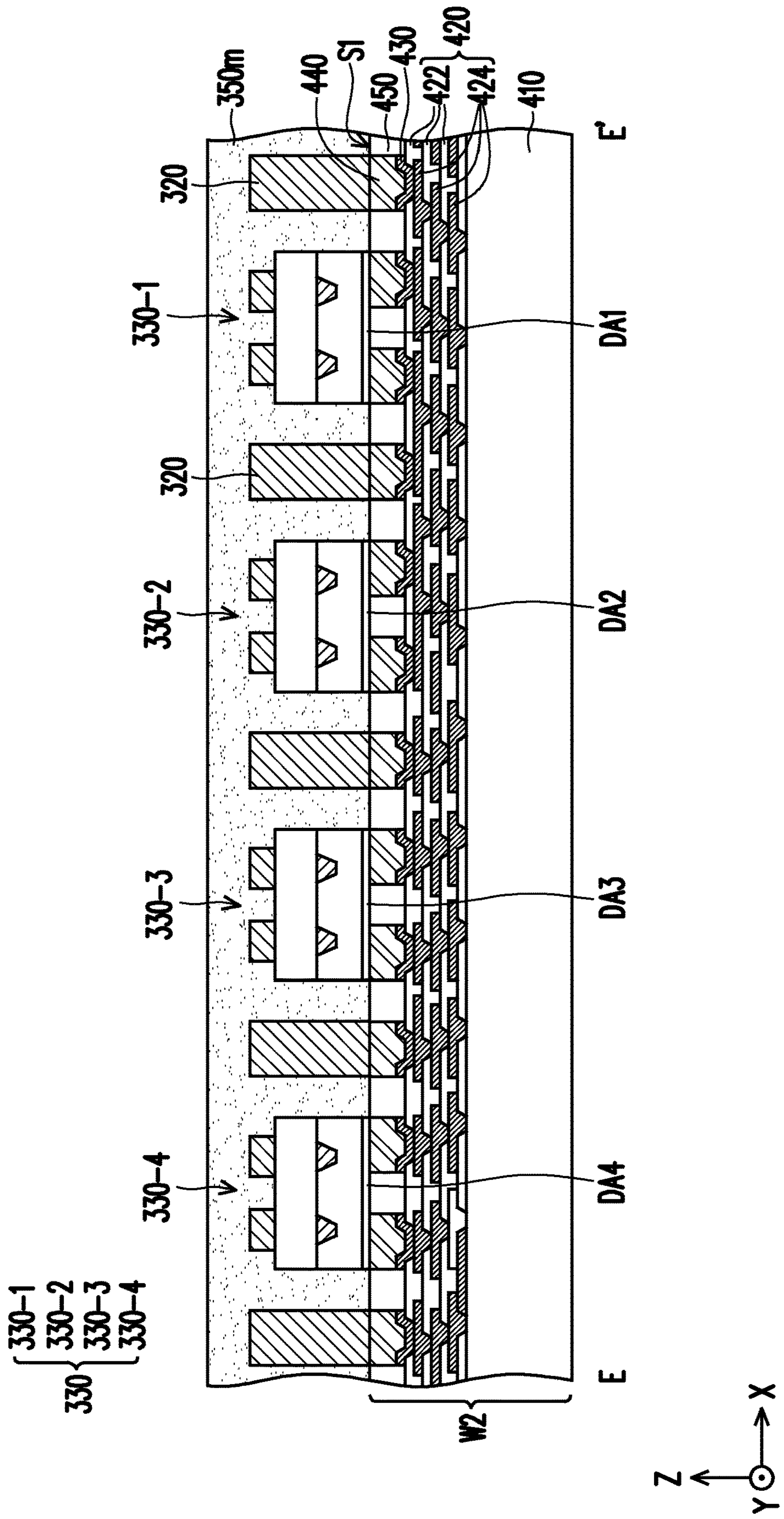

Referring to FIG. 45, in some embodiments, the through pillars 320 and the SoICs 330 are encapsulated in an insulating encapsulation 350*m*. The formation and material of the insulating encapsulation 350*m* have been previously described in FIG. 35, and thus are not repeated herein. As shown in FIG. 45, the through pillars 320 and the SoICs 330 are not accessibly revealed by and embedded in the insulating encapsulation 350*m*.

Figure 46:
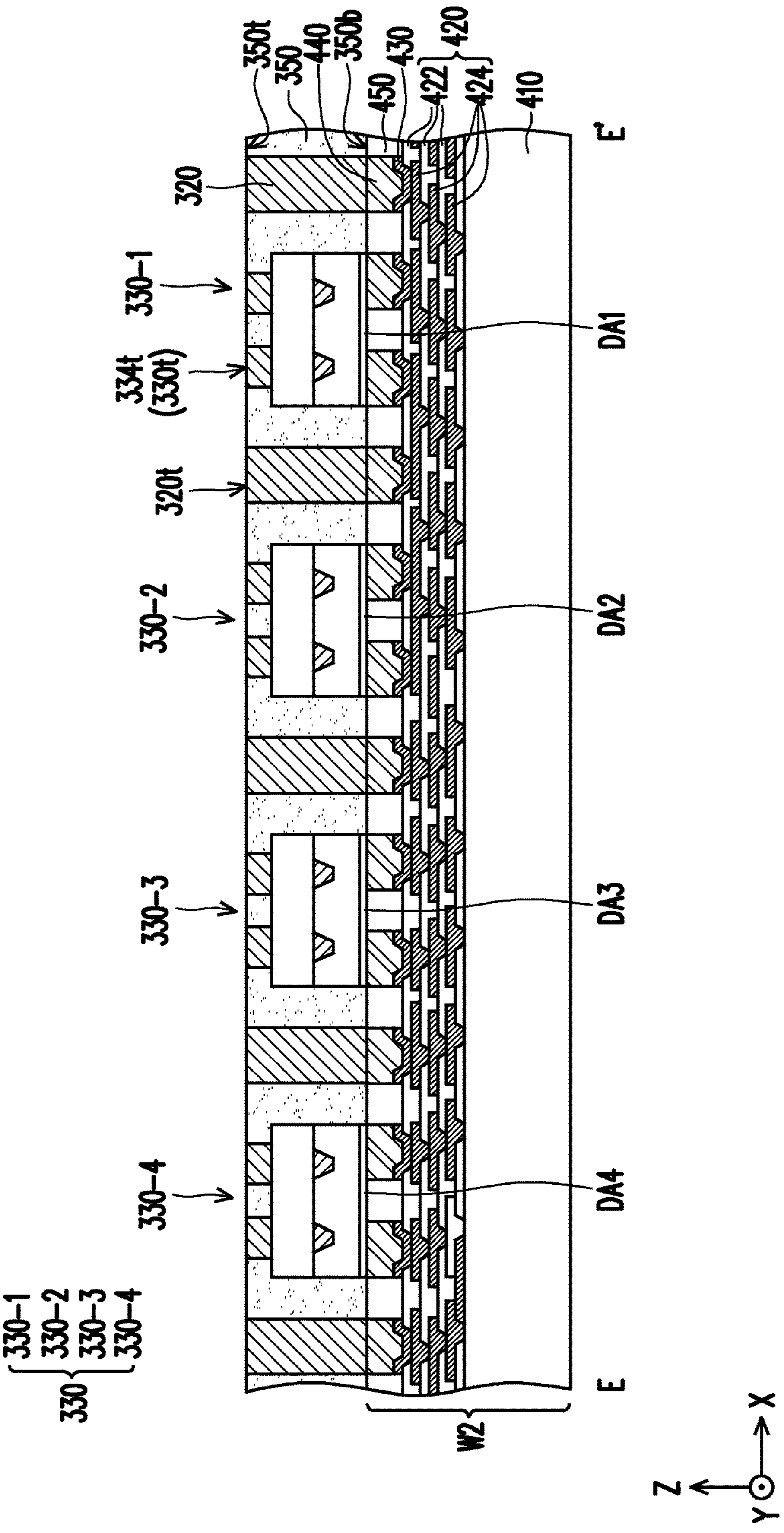

Referring to FIG. 46, in some embodiments, the insulating encapsulation 350*m* is planarized to form an insulating encapsulation 350 exposing the through pillars 320 and the SoICs 330. The formation and material of the insulating encapsulation 350 have been previously described in FIG. 36, and thus are omitted. In some embodiments, top surfaces 320*t* of the through pillars 320 and top surfaces 330*t* (e.g., top surfaces 334*t* of the conductive terminals 334) of the SoICs 330 are substantially leveled with a top surface 350*t* of the insulating encapsulation 350. In other words, the top surfaces 320*t* of the through pillars 320, the top surfaces 330*t* of the SoICs 330 and the top surface 350*t* of the insulating encapsulation 350 are substantially coplanar to each other, in some embodiments. That is, for example, the through pillars 320 and the conductive terminals 334 of the SoICs 330 are accessibly revealed by the insulating encapsulation 350.

Figure 47:
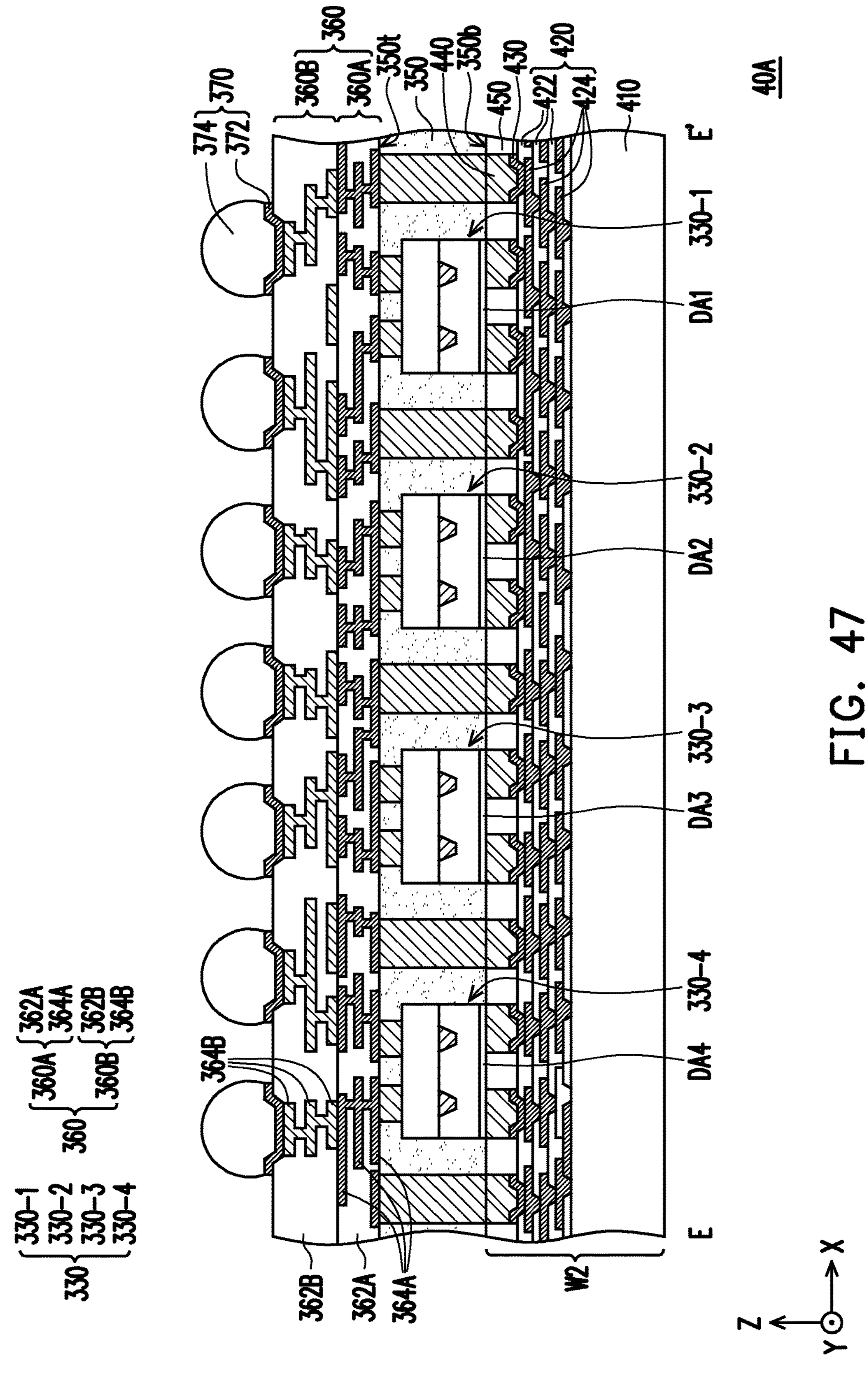
Figure 48:
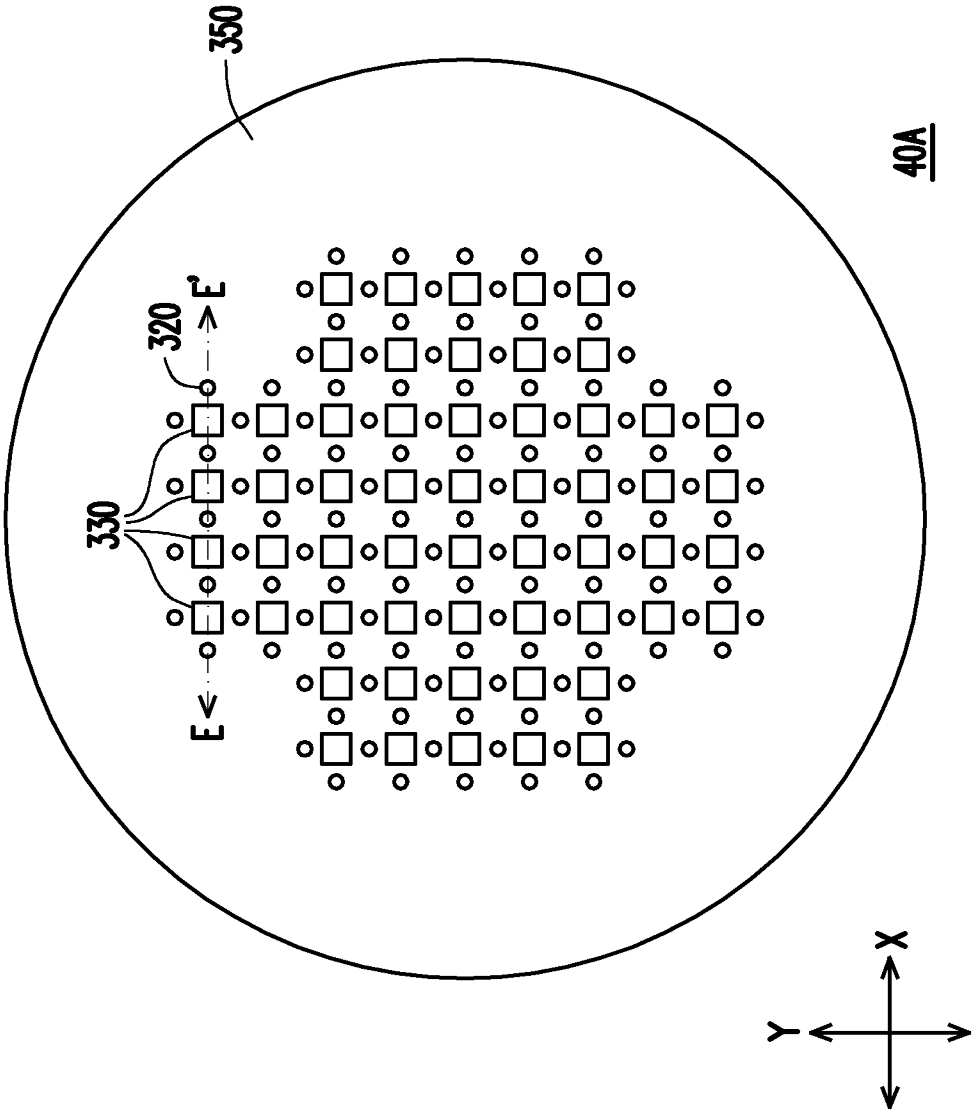
FIG. 48 is a schematic top view illustrating a relative position of SoICs in a semiconductor structure in accordance with some embodiments of the disclosure.

Referring to FIG. 47, in some embodiments, after the formation of the insulating encapsulation 350, a redistribution circuit structure 360 and conductive connectors 370 are sequentially formed over the insulating encapsulation 350, the SoICs 330 and the through pillars 320. Up to here, a semiconductor structure 40A is manufactured. In some embodiments, the redistribution circuit structure 360 includes a fine-featured portion 360A (including a dielectric structure 362A and a metallization pattern 364A formed therein) and a coarse-featured portion 360B (including a dielectric structure 362B and a metallization pattern 364B), where the fine-featured portion 360A is located between the insulating encapsulation 350 and the coarse-featured portion 360B, and the coarse-featured portion 360B is located between the fine-featured portion 360A and the conductive connectors 370. In some embodiments, the fine-featured portion 360A is electrically coupled to the coarse-featured portion 360B through electrically connecting the metallization patterns 364A and 364B. In some embodiments, the conductive connectors 370 each include a conductive terminal 374 and a UBM pattern 372 located between the conductive terminal 374 and the redistribution circuit structure 360, where the conductive connectors 370 are electrically coupled to the redistribution circuit structure 360 through electrically connecting the metallization pattern 364B and the UBM patterns 372. Alternatively, the UBM patterns 372 may be omitted, where the conductive connectors 370 may be electrically coupled to the redistribution circuit structure 360 through electrically connecting the metallization pattern 364B and the conductive terminals 374. The formation and material of the redistribution circuit structure 360 have been previously described in FIG. 37, the formation and material of the conductive connectors 370 have been previously described in FIG. 37, and thus are not omitted for brevity.

In some embodiments, the redistribution circuit structure 360 is located between the conductive connectors 370 and the insulating encapsulation 350 laterally encapsulating the through pillars 320 and the SoICs 330. As shown in FIG. 47, the redistribution circuit structure 360 are electrically connected to the through pillars 320 and the SoICs 330 exposed by the insulating encapsulation 350, for example. In some embodiments, the redistribution circuit structure 360 are electrically coupled to the wafer W2 through the through pillars 320. In some embodiments, the SoICs 330 are electrically coupled to the wafer W2 through the redistribution circuit structure 360 and the through pillars 320. Some of the conductive connectors 370 are electrically coupled to one or more SoICs 330 through the redistribution circuit structure 360, for example. In some embodiments, some of the conductive connectors 370 are electrically coupled to the through pillars 320 through the redistribution circuit structure 360. In some embodiments, some of the conductive connectors 370 are electrically coupled to the wafer W2 through the redistribution circuit structure 360 and the through pillars 320.

Figure 49:
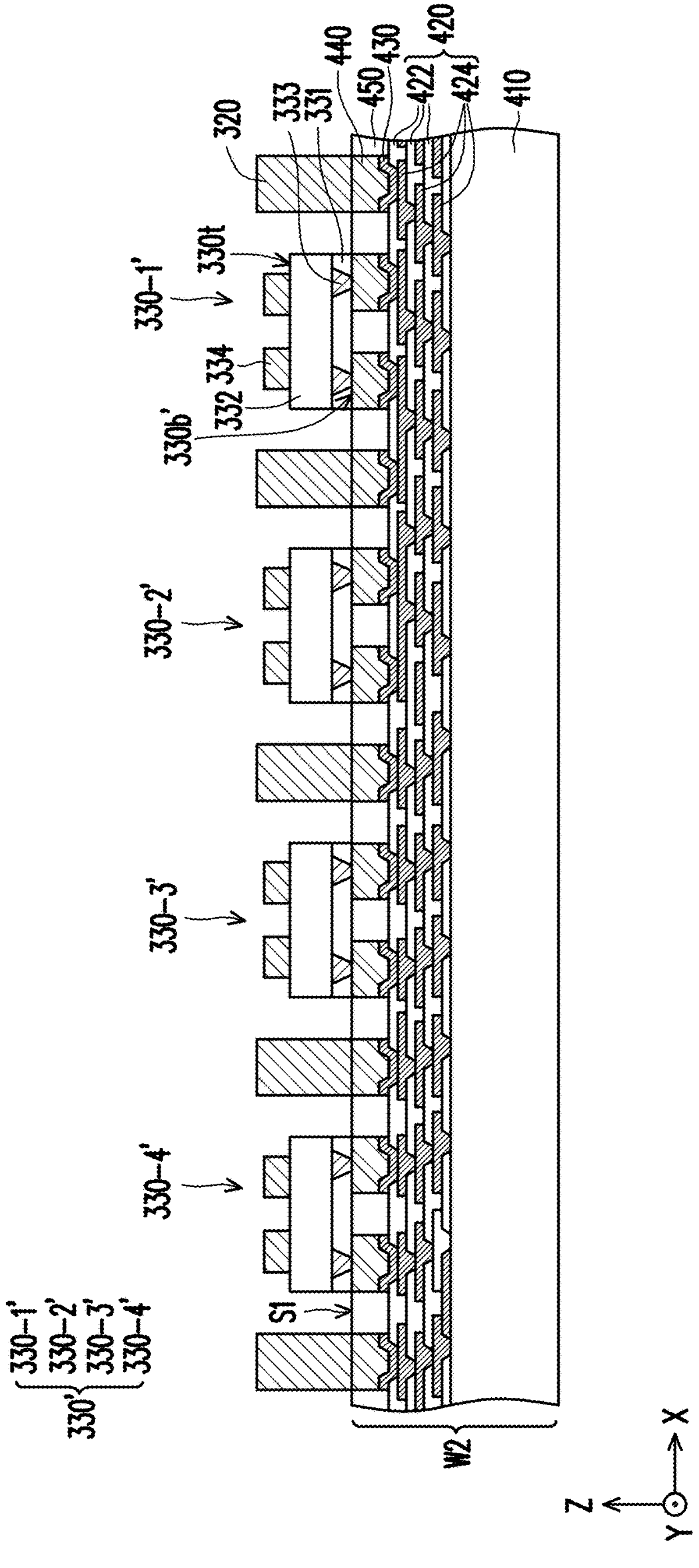
FIG. 49 through FIG. 50 are schematic cross-sectional views showing various stages in a manufacturing method of a semiconductor structure in accordance with some embodiments of the disclosure.
Figure 50:
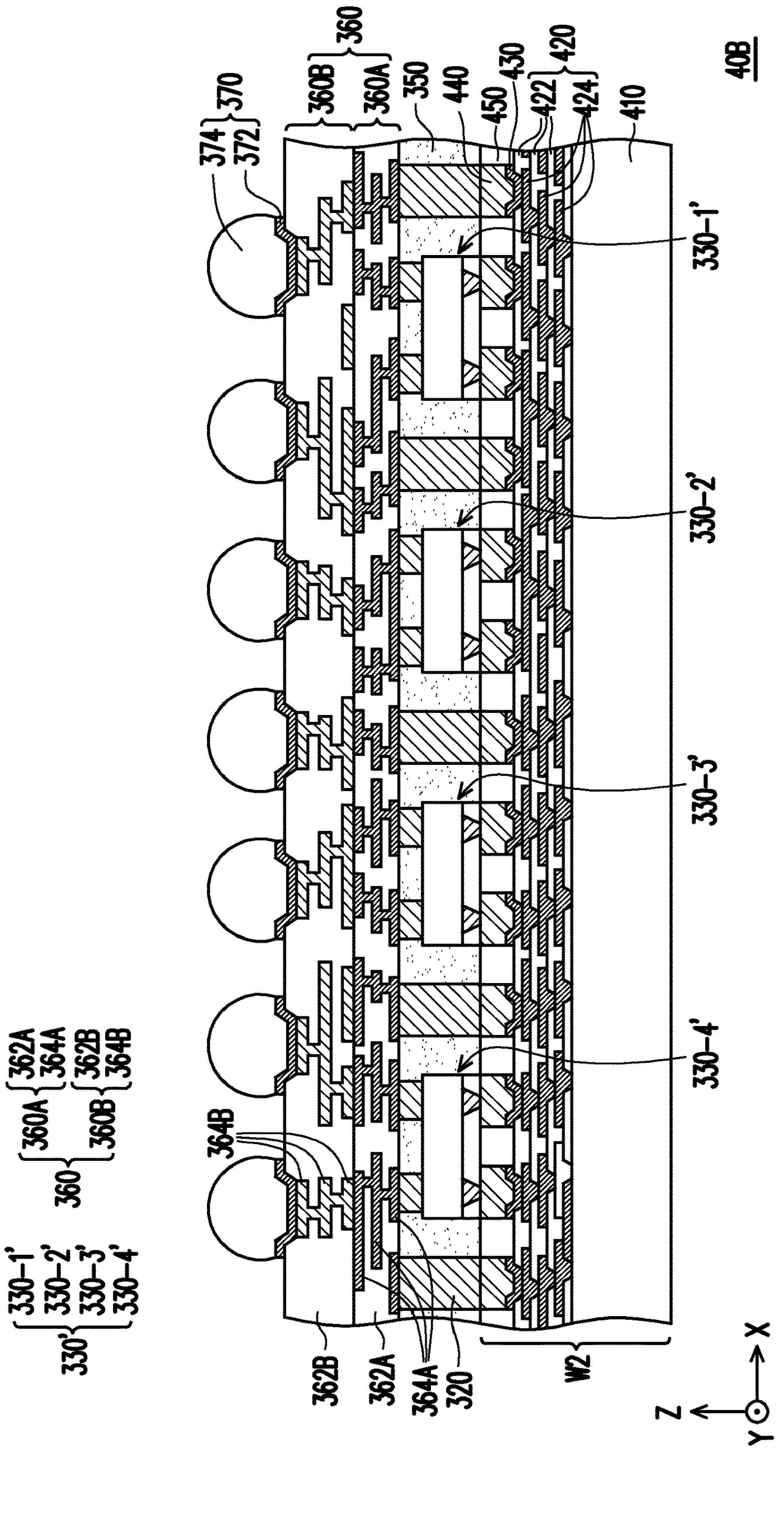

In alternative embodiments, the SoICs are bonded to a base wafer (e.g., the wafer W2) through hybrid bonding. FIG. 49 through FIG. 50 are schematic cross-sectional views showing various stages in a manufacturing method of a semiconductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 49, in some embodiments, a wafer W2 is provided, and a plurality of through pillars 320 and a plurality of SoICs 330' are placed over the wafer W2. In some embodiments, the through pillars 320 are arranged at a periphery of each of SoICs 330'. For example, the SoICs 330' are surrounded by the through pillars 320. For simplification, only four SoIC 330 and five through pillars 320 are presented in FIG. 44 for illustrative purposes, however it should be noted that the number of the through pillars 320 and the SoICs 330 may be more than five and more than four, respectively; the disclosure is not limited thereto.

In some embodiments, the through pillars 320 are formed on the front surface S1 of the wafer W2. In some embodiments, the through pillars 320 are located on and prop against the connecting vias 440, and are electrically connected to the wafer W2 through the connecting vias 440. The details of the wafer W2 and the details of the through pillars 320 have be previously described in FIG. 44, and thus are not repeated herein.

In some embodiments, the formation and material of SoICs 330' of FIG. 49 are similar to or substantially the same as the formation and material of SoICs 330 of FIG. 34; the difference is that, in each of the SoICs 330' (e.g., 330-1', 330-2', 330-3', 330-4') of FIG. 49, the conductive pillars 333 are formed in the tier 331 and exposed by a bottom surface 330*b'*. In the embodiments where the SoICs 330' are adopted, the SoICs 330' are bonded to the front surface S1 of the wafer W2 via a hybrid bonding process.

In such embodiments, a bonding interface IF3 between the SoICs 330' and the wafer W2 includes a dielectric-to-dielectric bonding interface (e.g., an oxide-to-nitride bonding interface between the tier 331 and the protection layer 450) and a metal-to-metal interface (e.g., a copper-to-copper bonding interface between the through pillars 320 and the connecting vias 440). In the disclosure, the bonding interface IF3 may be also referred to as a hybrid bonding interface. Alternatively, the dielectric-to-dielectric bonding interface may include an oxide-to-oxide bonding interface or a nitride-to-nitride interface, the disclosure is not limited thereto.

As illustrated in FIG. 49, for example, the SoICs 330' are electrically connected to the wafer W2 through the through pillars 320 and the connecting vias 440. Referring to FIG. 50, in some embodiments, the previously described manufacturing process as previously described in FIG. 45 to FIG. 47 is then performed on the structure depicted in FIG. 49 to obtain a semiconductor structure 40B depicted in FIG. 50.

Figure 51:
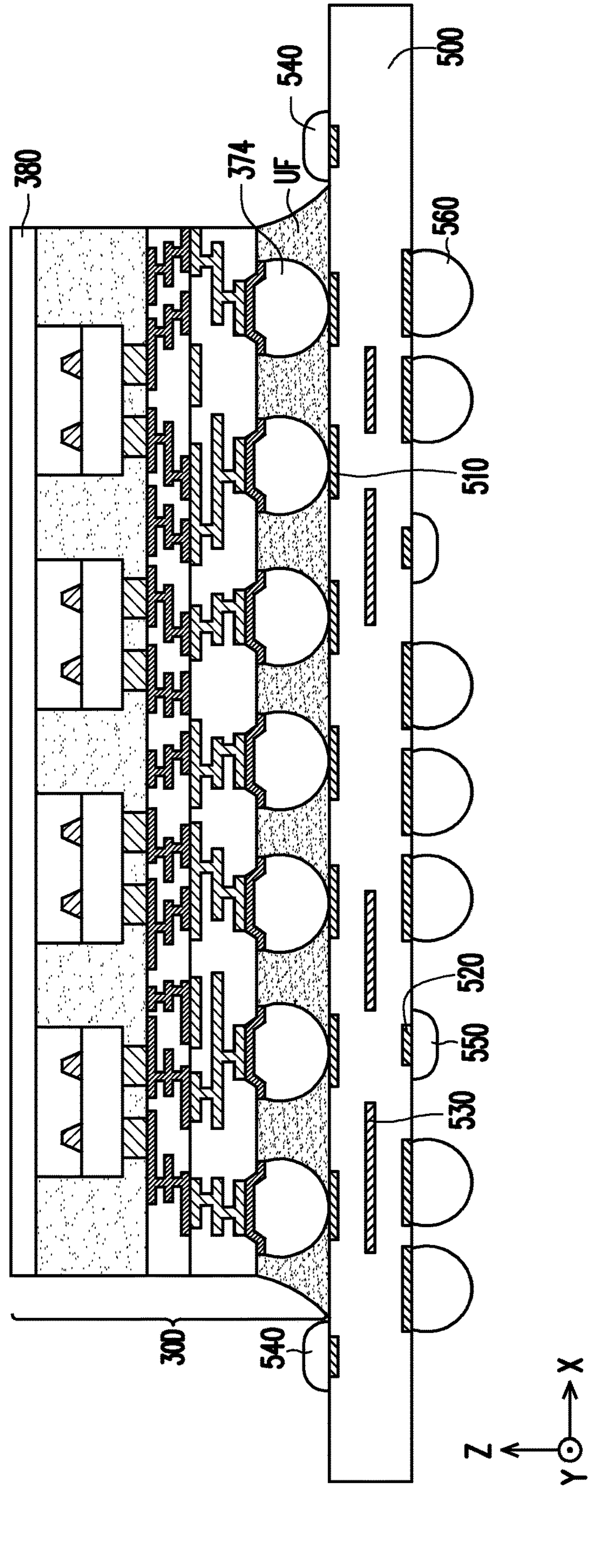
FIG. 51 is a schematic cross-sectional view showing a semiconductor structure in accordance with some embodiments of the disclosure.

The semiconductor structures of the disclosure may further be bonded to a circuit substrate for inputting/outputting electric and/or power signals, the disclosure is not limited thereto. A non-limiting example is provided in FIG. 51. FIG. 51 is a schematic cross-sectional view showing a semiconductor structure in accordance with some embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 51, in some embodiments, a circuit substrate 500 is provided, and a semiconductor structure (e.g., the semiconductor structure 30D depicted in FIG. 43) is then bonded to the circuit substrate 500 to form a (stacked) wafer-form (or wafer-scale or a wafer-size) package. The detail of the semiconductor structure 30D have been described in FIG. 43, and thus are not repeated herein for simplicity. In some embodiments, the circuit substrate 500 includes bonding pads 510, 520, metallization layers 530 and vias interconnected thereto. Alternatively, the circuit substrate 500 may further includes surface devices 540, 550 and/or conductive elements 560.

The circuit substrate 500 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In some embodiments, the circuit substrate 500 is a SOI substrate, where the SOI substrate includes a layer of a semiconductor material such as epitaxial silicon, germanium, silicon germanium, SOI, silicon germanium on insulator (SGOI), or combinations thereof. In an alternative embodiment, the circuit substrate 500 is based on an insulating core, such as a fiberglass reinforced resin core. One example core material is fiberglass resin such as flame-retardant class 4 (FR4). Alternatives for the core material include bismaleimide triazine (BT) resin, or alternatively, other printed circuit board (PCB) materials or films. In a further alternative embodiment, the circuit substrate 500 is a build-up films such as Ajinomoto build-up film (ABF) or other suitable laminates.

The circuit substrate 500 may include active and/or passive devices (not shown), such as transistors, capacitors, resistors, combinations thereof, or the like which may be used to generate the structural and functional requirements of the design for the semiconductor package. The active and/or passive devices may be formed using any suitable methods. However, the disclosure is not limited thereto; in an alternative embodiment, the circuit substrate 500 is substantially free of active and/or passive devices.

In some embodiments, the circuit substrate 500 includes metallization layers 530 and vias (not shown) interconnected therebetween and bonding pads 510, 520 connected to the metallization layers 530 and vias. The metallization layers 530 and vias together form a functional circuitry providing routing for the circuit substrate 500. The metallization layers 530 and vias embedded in the circuit substrate 500 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). The bonding pads 510, 520 are used to provide electrical connection with external component(s) for the circuit substrate 500. In some embodiments, the bonding pads 510, 520 are electrically connected to each other through the metallization layers 530 and vias. As shown in FIG. 51, for example, the conductive connectors 370 of the semiconductor structure 30D are connected to the bonding pads 510 of the circuit substrate 500, respectively. As shown in FIG. 51, in some embodiment, through bonding pads 510 and the conductive connectors 370, the semiconductor structure 30D is electrically connected to the circuit substrate 500.

In some embodiments, conductive elements 560 are optionally disposed on a bottom surface of substrate 500, as shown in FIG. 51. Conductive elements 560 may be used to physically and electrically connect the circuit substrate 500 to other devices, packages, connecting components, and the like, in some embodiments. The conductive elements 560 are referred to as conductive terminals of the circuit substrate 500 for providing physical and/or electrical connection to external components, in the disclosure. The conductive elements 560 may include BGA balls or solder balls. As shown in FIG. 51, the conductive elements 560 and the semiconductor structure 30D are respectively located on two opposite sides of the circuit substrate 500, where some of the conductive elements 560 are electrically connected to the semiconductor structure 30D through the bonding pads 510 and the conductive connectors 370. Alternatively, the conductive elements 560 may be omitted.

In some embodiments, one or more surface devices 540, 550 are optionally connected to the circuit substrate 500. The surface devices 540, 550 may be, for example, used to provide additional functionality or programming to the semiconductor structure 30D. In an embodiment, the surface devices 540, 550 include surface mount devices (SMDs) or an integrated passive devices (IPDs) that comprise passive devices such as resistors, inductors, capacitors, jumpers, combinations of these, or the like that are desired to be connected to and utilized in conjunction with the semiconductor structure 30D.

For example, as shown in FIG. 51, the surface devices 540 is placed on the surface of the circuit substrate 500 where the semiconductor structure 30D disposed, and the surface devices 550 is placed on the surface of the circuit substrate 500 where the conductive elements 560 disposed. The number of the surface devices 540 and the number of the surface devices 550 are not limited to the embodiment, and may be selected based on the demand and design layout. The disclosure is not limited thereto. In one embodiment, only the surface devices 540 are formed on the circuit substrate 500, where the number of the surface devices 540 may be one or more than one. In an alternative embodiment, only the surface devices 550 are formed on the circuit substrate 500, where the number of the surface devices 550 may be one or more than one. As shown in FIG. 51, the surface devices 540, 550 are electrically connected to the semiconductor structure 30D through the bonding pads 510, 520, the metallization layers 530 and vias, and the conductive connectors 370.

In some embodiments, an underfill UF is formed on the circuit substrate 500. As shown in FIG. 51, for example, the underfill UF fills the gap between the semiconductor structure 30D and the circuit substrate 500, and wraps sidewalls of the conductive connectors 370. The underfill UF may be any acceptable material, such as a polymer, epoxy resin, molding underfill, or the like, for example. In one embodiment, the underfill UF may be formed by underfill dispensing, a capillary flow process, or any other suitable method.

In addition, the circuit substrate 500 is considered as a circuit structure (e.g. an organic substrate with circuitry structure embedded therein, such as printed circuit board (PCB)). However, the disclosure is not limited thereto. In alternative embodiments, the semiconductor structure 30D can be replaced with the other semiconductor structure 10A-10D, 20A-20G, 30A-30C and 40A-40B as described above.

Figure 52:
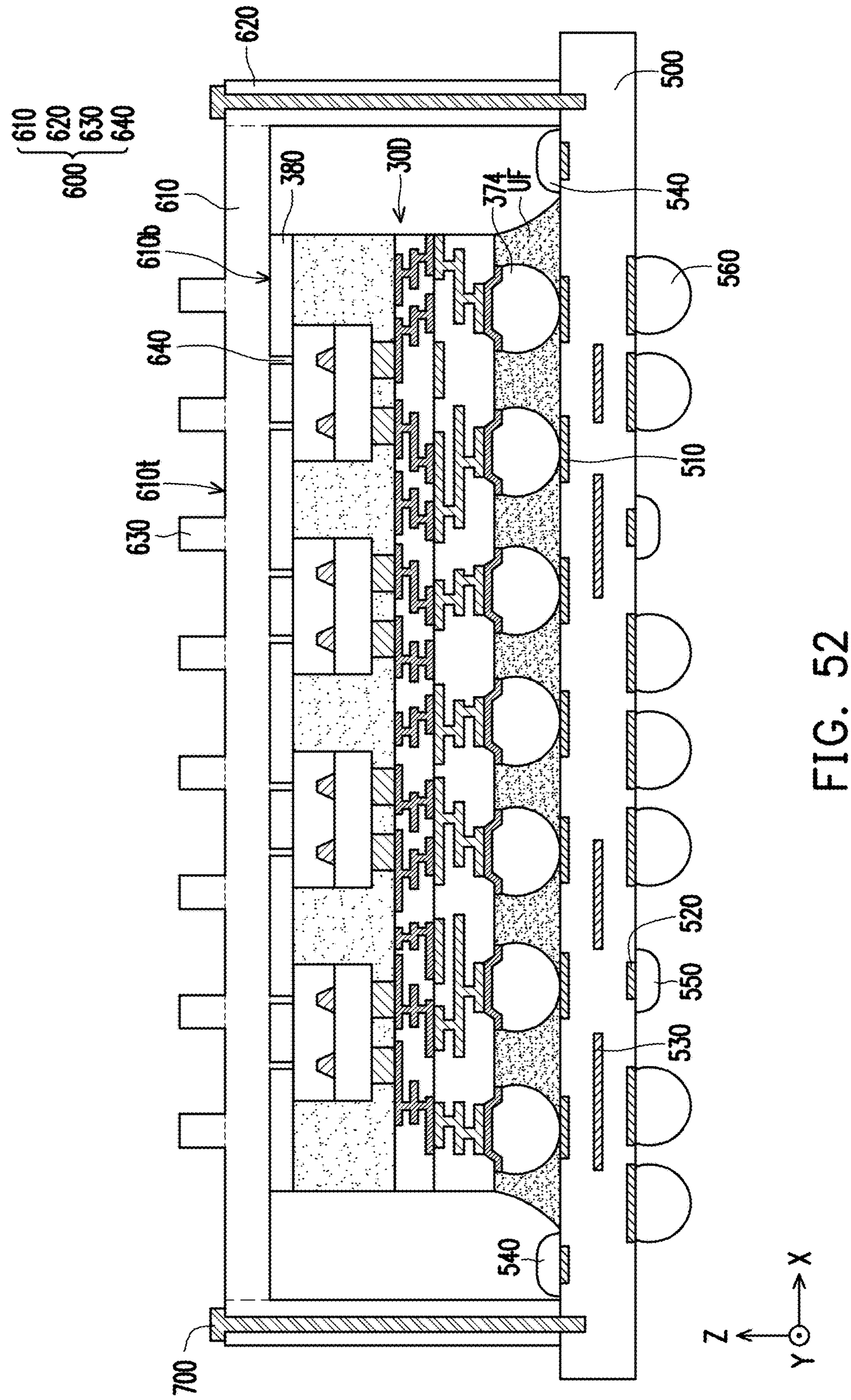
FIG. 52 is a schematic top view of a semiconductor structure in accordance with some embodiments of the disclosure.
Figure 53:
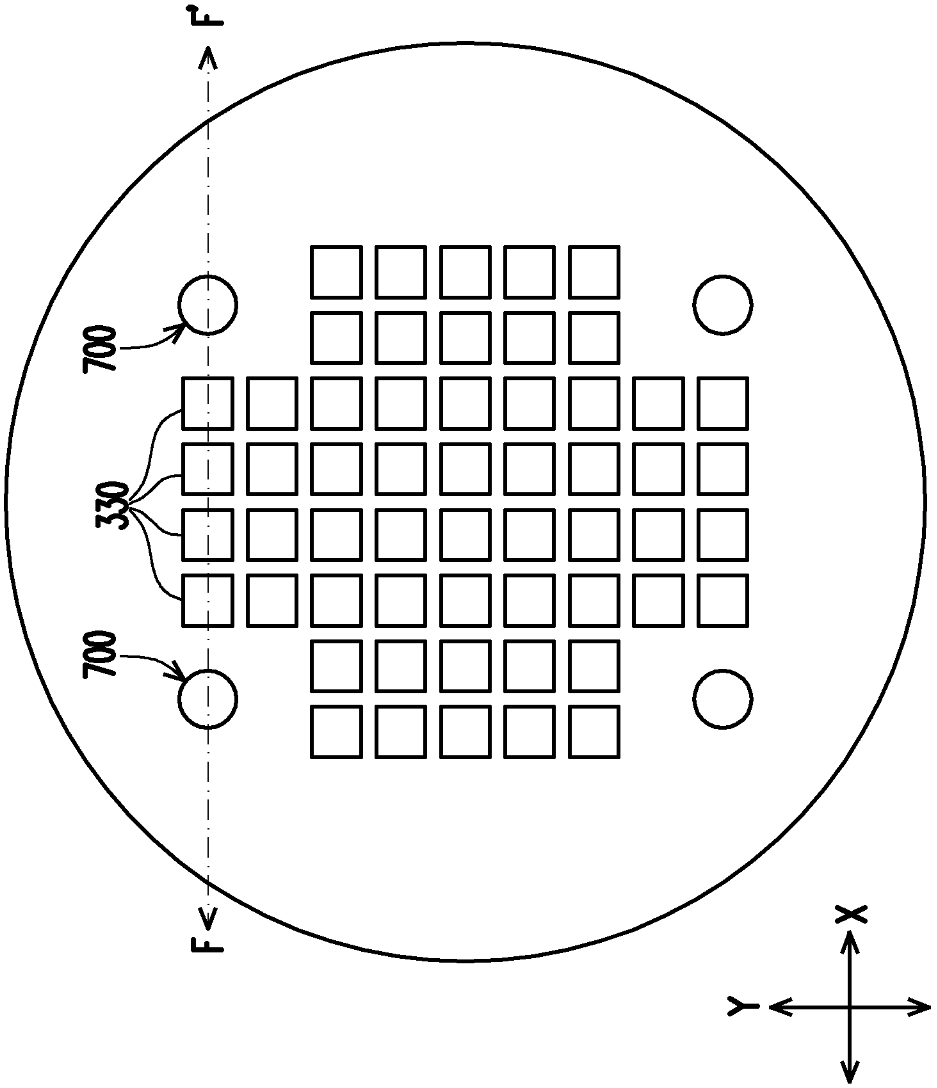
FIG. 53 is a schematic cross-sectional view showing a semiconductor structure in accordance with some embodiments of the disclosure.

A heat dissipating module may be adopted to the semiconductor structures or the (stacked) wafer-form (or wafer-scale or a wafer-size) package, in the disclosures. A non-limiting example is provided in FIG. 52 and FIG. 53. FIG. 52 is a schematic top view of a semiconductor structure in accordance with some embodiments of the disclosure. FIG. 53 is a schematic cross-sectional view showing a semiconductor structure in accordance with some embodiments of the disclosure, where FIG. 53 is the cross-sectional view taken along a line FF' depicted in FIG. 52. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein.

Referring to FIG. 52 and FIG. 53, in some embodiments, a heat dissipating module 600 is provided and mounted on the stacked wafer-form package depicted in FIG. 51. In some embodiments, the heat dissipating module 600 provides physical protection to the semiconductor structure 30D included in the stacked wafer-form package in addition to the functionality of dissipating heat. The heat dissipating module 600 is attached to the circuit substrate 500, in some embodiments, by using lock screws (such as fasteners 700), adhesives (such as a silver paste), a combination thereof, or the like, so that the semiconductor structure 30D is arranged within an inner cavity confined by the heat dissipating module 600 and the circuit substrate 500.

In some embodiments, the heat dissipating module 600 includes a lid 610, a flange 620 at the periphery of the lid 610, a plurality of microstructures 630 over a top surface 610*t* of the lid 610, and a plurality of microstructures 640 over a bottom surface 610*b* of the lid 610. For example, as shown in FIG. 52, along the stacking direction Z, the bottom surface 610*b* and the top surface 610*t* are two opposite sides of the lid 610. In some embodiments, the lid 610, the flange 620, the microstructure 630 and the microstructure 640 are produced as a single piece (integrally formed). Alternatively, at least two of the lid 610, the flange 620, the microstructure 630 and the microstructure 640 are fabricated separately, and then assembled together to produce the heat dissipating module 600. The materials of the lid 610, the flange 620, the microstructure 630 and the microstructure 640 may be the same or different from each other, which may be formed using a metal, a metal alloy, and the like; as long as the heat dissipating module 600 may have a high overall thermal conductivity, for example, between about 200 W/m·K to about 400 W/m·K or more.

In some embodiments, the lid 610 extends substantially parallel to the circuit substrate 500, while the flange 620 extends in a direction perpendicular to the plane defined by the lid 610 and towards to the circuit substrate 500. For example, along the stacking direction Z, the flange 620 is in contact with the edge of the lid 610 at one end and is connected to the circuit substrate 500 at other end. In some embodiments, the lid 610 and the flange 620 describe a right angle at their joint, but the disclosure is not limited thereto. In some embodiments, the flange 620 is joined to the lid 610 at different angles than 90 degrees. In some embodiments, as illustrated in FIG. 52, the microstructures 630 (e.g., micro-pillars or micro-pins) are located outside of the inner cavity, where the microstructures 630 each have a first size measured in a vertical direction (e.g. the stacking direction Z) greater than a first size measured in a horizontal direction (e.g. the direction X or Y). In some embodiments, the microstructures 640 (e.g., micro-pillars or micro-pins) are located inside the inner cavity and surrounded by the flange 620, where the microstructures 640 each have a second size measured in a vertical direction (e.g. the stacking direction Z) greater than a second size measured in a horizontal direction (e.g. the direction X or Y). In some embodiments, a feature size of one microstructure 630 is greater than a feature size of the one microstructure 640. However, alternatively, the feature size of one microstructure 630 may be less than or substantially equal to the feature size of the one microstructure 640.

In some embodiments, as shown in FIG. 52, during mounting the heat dissipating module 600 to the circuit substrate 500, the microstructures 640 are inserted into the thermal interface material 380, and thus the thermal interface material 380 at least fills up the gaps between the heat dissipating module 600 and wraps around sidewalls of the microstructure 640. That is, for example, the heat dissipating module 600 are thermally coupled to the semiconductor structure 30D through the thermal interface material 380 and the microstructures 640. In some embodiments, the microstructures 640 are further in contact with the SoICs 330 of the semiconductor structure 30D. Owing to such configuration, the semiconductor structure 30D and the heat dissipating module 600 are stably adhered to each other, and the mechanical strength of the stacked wafer-form package with the heat dissipating module is ensured. Owing to the heat dissipating module 600 (e.g., the lid 610 and the microstructure 630, 640), the thermal performances in the X and/or Y directions and the thermal performance in the Z direction are improved, and the reliability of the stacked wafer-form package depicted in FIG. 52 is further enhanced.

In some embodiments, as shown in FIG. 52 and FIG. 53, after mounting the heat dissipating module 600 to the circuit substrate 500, a plurality of the fasteners 700 are provided to secure the heat dissipating module 600 and the circuit substrate 500. In some embodiments, the fasteners 700 includes a plurality of bolts. For example, only four fasteners 700 are presented in FIG. 53 for illustrative propose, and the number of the fasteners 700 is not limited thereto. In some embodiments, the fasteners 700 penetrate through the flange 620 and further extend into the circuit substrate 500, where portions of the circuit substrate 500 are respectively threaded onto the fasteners 700 and tightened to clamp the heat dissipating module 600 and the circuit substrate 500. In some embodiments, the portions of the circuit substrate 500 each may include a nut structure for threading to the fasteners 700. Owing to the fasteners 700, an addition exerted force is applied to the heat dissipating module 600, the bonding strength between the heat dissipating module 600 and the stacked wafer-form package depicted in FIG. 52 is greatly ensured, thereby improving the reliability thereof.

In alternative embodiments, the semiconductor structure 30D can be replaced with the other semiconductor structure 10A-10D, 20A-20G, 30A-30C and 40A-40B as described above; the disclosure is not limited thereto.

In accordance with some embodiments, a semiconductor structure includes system-on-integrated chips, a first redistribution circuit structure and first conductive terminals. The system-on-integrated chips each include a die stack having two or more than two tiers, and each tier includes at least one semiconductor die. The first redistribution circuit structure is located on and electrically connected to the system-on-integrated chips. The first conductive terminals are connected on the first redistribution circuit structure, wherein the first redistribution circuit structure is located between the system-on-integrated chips and the first conductive terminals.

In accordance with some embodiments, a semiconductor structure includes system-on-integrated chips, an insulating encapsulation, a second redistribution circuit structure and conductive terminals. The system-on-integrated chips each includes a die stack including a base tier, inner tiers and a first redistribution circuit structure. The base tier includes at least one first semiconductor dies. The inner tiers are located over the base tier and sequentially stacked on one another, each of the inner tiers includes second semiconductor dies and conductive pillars. The first redistribution circuit structure is located on an outermost tier of the inner tiers opposing to the base tier along a stacking direction of the inner tiers and the base tire, wherein the first semiconductor dies of the base tier and the second semiconductor dies of the inner tiers are electrically connected to each other through the conductive pillars and the first redistribution circuit structure. The insulating encapsulation laterally encapsulates the system-on-integrated chips. The second redistribution circuit structure is located on the insulating encapsulation and electrically connected to the system-on-integrated chips. The conductive terminals are connected on the second redistribution circuit structure, wherein the second redistribution circuit structure is located between the system-on-integrated chips and the conductive terminals.

In accordance with some embodiments, a method of manufacturing semiconductor structure includes the following steps, providing system-on-integrated chips each comprising a die stack of two or more than two tiers, and each tier comprising at least one semiconductor die; laterally encapsulating the system-on-integrated chips in an insulating encapsulation; forming a first redistribution circuit structure on the system-on-integrated chips and the insulating encapsulation; and disposing the first conductive terminals on the first redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:

a plurality of semiconductor chips, each comprising:

a first tier, comprising a first integrated circuit component with first connecting vias disposed therein;

a second tier, disposed on and electrically coupled to the first tier and comprising:

a second integrated circuit component with second connecting vias disposed therein; and an insulating encapsulation, encapsulating the second integrated circuit component and over the first integrated circuit component, wherein a first active surface exposing the first connecting vias of the first integrated circuit component thereon are in physical contact with a second active surface exposing the second connecting vias of the second integrated circuit component thereon; and a plurality of conductive elements, disposed over the second tier, wherein the second tier is between the first tier and the plurality of conductive elements;

a redistribution circuit structure, disposed over and electrically coupled to the plurality of semiconductor chips;

a plurality of conductive terminals, disposed on the redistribution circuit structure, wherein the redistribution circuit structure is between the plurality of semiconductor chips and the plurality of conductive terminals; and a heat dissipating element, disposed over the plurality of semiconductor chips and comprising a plurality of microstructures, wherein the plurality of microstructures are in physical contact with the plurality of semiconductor chips, and the plurality of microstructures penetrate through a thermal interface material extending from the heat dissipating element to the plurality of semiconductor chips, and a material of the thermal interface material is different from a material of the heat dissipating element.

2. The semiconductor structure of claim 1, wherein the thermal interface material is continuously extending from one of the plurality of semiconductor chips to other ones of the plurality of semiconductor chips, wherein the plurality of semiconductor chips are between the thermal interface material and the redistribution circuit structure.

3. The semiconductor structure of claim 2, wherein the thermal interface material comprises a thermally conductive material, a indium sheet or a graphite sheet, and the heat dissipating element comprises a metal or a metal alloy.

4. The semiconductor structure of claim 1, further comprising:

a circuit substrate, wherein the circuit substrate is mounted to and electrically coupled to the redistribution circuit structure through the plurality of conductive terminals, wherein the heat dissipating element is connected to a first surface of the circuit substrate, and the plurality of conductive terminals are disposed on the first surface.

5. The semiconductor structure of claim 4, further comprising at least one of:

first surface devices, disposed on the first surface of the circuit substrate; or second surface devices, disposed on a second surface of the circuit substrate, the second surface is opposite to the first surface in a stacking direction of the plurality of conductive terminals and the circuit substrate.

6. The semiconductor structure of claim 1, wherein in a cross section of the semiconductor structure along the heat dissipating element and the plurality of semiconductor chips, the thermal interface material directly contacts a planar bottom surface of the heat dissipating element that extends beyond the thermal interface material.

7. A semiconductor structure, comprising:

a plurality of semiconductor chips, each comprising:

a first tier, comprising at least one first integrated circuit component with first through vias disposed therein;

a second tier, disposed on and electrically coupled to the first tier and comprising at least one second integrated circuit component with second through vias disposed therein; and a plurality of conductive elements, disposed over the second tier, wherein the second tier is between the first tier and the plurality of conductive elements;

an insulating encapsulation, laterally encapsulating the plurality of semiconductor chips;

a redistribution circuit structure, disposed over the insulating encapsulation and electrically coupled to the plurality of semiconductor chips;

a plurality of conductive terminals, disposed on and electrically coupled to the redistribution circuit structure, wherein the redistribution circuit structure is between the insulating encapsulation and the plurality of conductive terminals;

a circuit substrate, wherein the circuit substrate is mounted to and electrically coupled to the redistribution circuit structure through the plurality of conductive terminals; and a heat dissipating element, disposed over the plurality of semiconductor chips and comprising a plurality of microstructures, wherein the plurality of microstructures are in physical contact with the plurality of semiconductor chips, and the plurality of microstructures penetrate through a thermal interface material disposed on the insulating encapsulation and further extending onto the plurality of semiconductor chips, wherein in a cross section of the semiconductor structure along the heat dissipating element and the plurality of semiconductor chips, the thermal interface material directly contacts a planar bottom surface of the heat dissipating element that extends beyond the thermal interface material.

8. The semiconductor structure of claim 7, wherein in a vertical projection along a stacking direction of the first tier and the second tier, a perimeter of the at least one second integrated circuit component is surround by a perimeter of the at least one first integrated circuit component.

9. The semiconductor structure of claim 7, wherein the redistribution circuit structure comprises:

a fine-featured portion, over and electrically coupled to the plurality of semiconductor chips; and a coarse-featured portion, over and electrically coupled to the fine-featured portion, wherein the coarse-featured portion is disposed between the plurality of conductive terminals and the fine-featured portion, and the fine-featured portion is disposed between the coarse-featured portion and the plurality of semiconductor chips.

10. The semiconductor structure of claim 9, wherein along a stacking direction of the fine-featured portion and the coarse-featured portion, a thickness of a patterned conductive layer comprised in the coarse-featured portion is greater than a thickness of a patterned conductive layer comprised in the fine-featured portion.

11. The semiconductor structure of claim 7, wherein the insulating encapsulation is in physical contact with sidewalls of the plurality of conductive elements, the first tier and the second tier, wherein the semiconductor structure further comprises:

an underfill, disposed in a gap between the circuit substrate and the redistribution circuit structure and in contact with the plurality of conductive terminals.

12. A semiconductor structure, comprising:

a plurality of semiconductor chips, each comprising:

a first tier, comprising a first integrated circuit component; and a second tier, over and electrically coupled to the first tier and comprising a second integrated circuit component;

an insulating encapsulation, laterally encapsulating the plurality of semiconductor chips;

a redistribution circuit structure, disposed over the insulating encapsulation and electrically coupled to the plurality of semiconductor chips; and a heat dissipating element, disposed over the plurality of semiconductor chips, wherein the heat dissipating element comprises a lid vertically overlapped with the plurality of semiconductor chips, a ring structure connecting to the lid and vertically extending away from the lid, and a plurality of microstructures connected to the lid and further protruding from the lid towards the plurality of semiconductor chips, wherein the plurality of microstructures are in physical contact with the plurality of semiconductor chips, and the plurality of microstructures penetrate through a thermal interface material disposed between the lid and the plurality of semiconductor chips, wherein the ring structure is laterally next to the plurality of semiconductor chips and the redistribution circuit structure, wherein in a cross section of the semiconductor structure along the heat dissipating element and the plurality of semiconductor chips, the thermal interface material directly contacts a lower surface of the lid that is entirely planar within the ring structure.

13. The semiconductor structure of claim 12, further comprising:

a circuit substrate, wherein the circuit substrate is mounted to and electrically coupled to the redistribution circuit structure through a plurality of conductive joints, wherein the heat dissipating element is connected to a first surface of the circuit substrate, wherein the plurality of conductive joints are disposed on the first surface.

14. The semiconductor structure of claim 13, further comprising at least one of:

first surface devices, disposed on the first surface of the circuit substrate; or second surface devices, disposed on a second surface of the circuit substrate, the second surface is opposite to the first surface in a stacking direction of the plurality of conductive joints and the circuit substrate.

15. The semiconductor structure of claim 12, further comprising:

a thermal interface material, overlaid the plurality of semiconductor chips.

16. The semiconductor structure of claim 15, wherein the plurality of microstructures penetrate through the thermal interface material and thermally coupling the heat dissipating element and the plurality of semiconductor chips.

17. The semiconductor structure of claim 12, wherein:

the first integrated circuit component comprises:

a first semiconductor substrate, having a first active surface and a first rear surface opposite to the first active surface;

a first interconnect structure, disposed on the first active surface;

first conductive vias, over and electrically coupled to the first interconnect structure, the first interconnect structure being between the first semiconductor substrate and the first conductive vias; and first through vias, disposed in the first semiconductor substrate and electrically coupled to the first conductive vias through the first interconnect structure, and the second integrated circuit component comprises:

a second semiconductor substrate, having a second active surface and a second rear surface opposite to the second active surface;

a second interconnect structure, disposed on the second active surface;

second conductive vias, electrically coupled to the second interconnect structure, the second interconnect structure being between the second semiconductor substrate and the second conductive vias;

second through vias, disposed in the second semiconductor substrate and electrically coupled to the second conductive vias through the second interconnect structure; and a capacitor, disposed in the second semiconductor substrate and electrically coupled to the second interconnect structure.

18. The semiconductor structure of claim 12, wherein the second tier further comprises a plurality of conductive pillars laterally arranged next to the second integrated circuit component.

19. The semiconductor structure of claim 12, further comprising:

a plurality of protrusions, disposed on a surface of the heat dissipating element facing away from the ring structure.

20. The semiconductor structure of claim 12, wherein a material of the thermal interface material is different from a material of the heat dissipating element.

* * * * *